US012796231B2

(12) United States Patent
Yoo et al.

(10) Patent No.: US 12,796,231 B2
(45) Date of Patent: Nov. 10, 2026

(54) DISPLAY DEVICE

(71) Applicant: Samsung Display Co., LTD., Yongin-si (KR)

(72) Inventors: In Kyung Yoo, Yongin-si (KR); Tae Wook Kang, Yongin-si (KR); Ji Min Park, Yongin-si (KR); Young Seok Baek, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 440 days.

(21) Appl. No.: 18/498,232

(22) Filed: Oct. 31, 2023

(65) Prior Publication Data

US 2024/0284716 A1 Aug. 22, 2024

(30) Foreign Application Priority Data

Feb. 17, 2023 (KR) ........................ 10-2023-0021599

(51) Int. Cl.
*H10K 59/122* (2023.01)
*H10K 59/131* (2023.01)
*H10K 59/40* (2023.01)

(52) U.S. Cl.
CPC ......... *H10K 59/122* (2023.02); *H10K 59/131* (2023.02); *H10K 59/40* (2023.02)

(58) Field of Classification Search
CPC ........................... H10K 59/122; H10K 59/873
See application file for complete search history.

(56) References Cited

U.S. PATENT DOCUMENTS

2022/0344417 A1 10/2022 Choung et al.
2023/0209935 A1* 6/2023 Jang ..................... H10K 50/841 257/40
2023/0232694 A1* 7/2023 Tabatake .............. H10K 59/873 257/40
2024/0121992 A1* 4/2024 Yoo ........................ G06F 3/0412
2024/0276860 A1* 8/2024 Yanagisawa ......... H10K 59/131

FOREIGN PATENT DOCUMENTS

KR 102322700 11/2021
KR 1020240050989 4/2024

OTHER PUBLICATIONS

Extended European Search Report—European Application No. EP 24154124.2 dated Sep. 17, 2024, citing references listed within.

* cited by examiner

*Primary Examiner* — Mariceli Santiago
(74) *Attorney, Agent, or Firm* — CANTOR COLBURN LLP

(57) ABSTRACT

A display device includes anode electrodes in a display area, an inorganic insulating layer in the display area and partially on the anode electrode, a bank structure on the inorganic insulating layer, with openings overlapping the anode electrodes, light emitting layers on the anode electrodes and in the openings, cathode electrodes on the light emitting layers and in the openings, a first power line in a non-display area, and a conductive layer including an oxide semiconductor. A portion of the conductive layer in the non-display area is between the first power line and the display area. The bank structure is on the conductive layer in the non-display area with hole patterns defined further through the conductive layer, the bank structure includes first and second bank layers including different metal materials, respectively, and a portion of the first bank layer is directly on the conductive layer in the non-display area.

15 Claims, 40 Drawing Sheets

DISPLAY DEVICE

This application claims priority to Korean Patent Application No. 10-2023-0021599, filed on Feb. 17, 2023, and all the benefits accruing therefrom under 35 U.S.C. § 119, the content of which in its entirety is herein incorporated by reference.

BACKGROUND

1. Field

The disclosure relates to a display device.

2. Description of the Related Art

With the advance of information-oriented society, more and more demands are placed on display devices for displaying images in various ways. For example, display devices are employed in various electronic devices such as smartphones, digital cameras, laptop computers, navigation devices, and smart televisions. The display device may be a flat panel display device such as a liquid crystal display device, a field emission display device and an organic light emitting display device. Among the flat panel display devices, in the light emitting display device, since each of pixels of a display panel includes a light emitting element capable of emitting light by itself, an image can be displayed without a backlight unit providing light to the display panel.

SUMMARY

Embodiments of the disclosure provide a display device in which separate light emitting elements for each emission area are formed without a mask process and an outer structure made of the same material and layer as a structure disposed in a display area is included.

However, Embodiments of the disclosure are not restricted to the one set forth herein. The above and other embodiments of the disclosure will become more apparent to one of ordinary skill in the art to which the disclosure pertains by referencing the detailed description of the disclosure given below.

According to an embodiment of the disclosure, a display device, in which a display area and a non-display area surrounding the display area are defined, includes anode electrodes disposed in the display area and spaced apart from each other, an inorganic insulating layer disposed in the display area and including a portion disposed on the anode electrode, a bank structure disposed on the inorganic insulating layer, where a plurality of openings is defined through the bank structure to respectively overlap the anode electrodes, a plurality of light emitting layers disposed on the anode electrodes and disposed in the openings of the bank structure, a plurality of cathode electrodes disposed on the light emitting layers and disposed in the openings of the bank structure, a first power line disposed in the non-display area and surrounding the display area, and a conductive layer including an oxide semiconductor, where at least a portion of the conductive layer in the non-display area is disposed between the first power line and the display area. In such an embodiment, the bank structure is disposed on the conductive layer in the non-display area, where a plurality of hole patterns is defined through the bank structure and the conductive layer, the bank structure includes a first bank layer and a second bank layer disposed on the first bank layer and including a metal material different from a material of the first bank layer, and a portion of the first bank layer is disposed directly on the conductive layer in the non-display area, and the second bank layer includes a tip protruding further inwardly than a sidewall of the first bank layer.

In an embodiment, the inorganic insulating layer may further include a residual pattern disposed between the anode electrode and the inorganic insulating layer without being in contact with a top surface of the anode electrode, and the residual pattern contains the same material as the conductive layer.

In an embodiment, the display device may further include a plurality of insulating patterns disposed on the conductive layer, where a plurality of holes are defined by the insulating patterns to overlap the hole patterns, and the insulating pattern may include a same material as the inorganic insulating layer.

In an embodiment, the conductive layer may be disposed to partially overlap the first power line, and the first bank layer may be disposed directly on the conductive layer on the first power line and electrically connected to the first power line.

In an embodiment, the display device may further include a bridge electrode disposed in the non-display area and disposed between the first power line and the conductive layer.

In an embodiment, the display device may further include a power connection electrode disposed to overlap the conductive layer in the non-display area and including a same material as the anode electrode.

In an embodiment, the power connection electrode and the conductive layer may be disposed to partially overlap the first power line, and the first bank layer may be disposed directly on the conductive layer on the first power line and electrically connected to the first power line.

In an embodiment, the power connection electrode and the conductive layer may be disposed not to overlap the first power line, and the first bank layer may be disposed on the first power line and electrically connected to the first power line.

In an embodiment, a plurality of through portions may be defined through the power connection electrode to overlap the hole patterns, and the conductive layer may be disposed to cover an inner sidewall of the power connection electrode defining the through portion.

In an embodiment, the first bank layer may include aluminum (Al), and the second bank layer may include titanium (Ti).

In an embodiment, each of the cathode electrodes may be in direct contact with a side surface of the first bank layer.

In an embodiment, the hole patterns may not overlap the first power line.

In an embodiment, the display device may further include a plurality of organic patterns disposed on the second bank layer to surround the openings and including a same material as the light emitting layer, and a plurality of electrode patterns disposed on the organic patterns and including a same material as the cathode electrode.

In an embodiment, the display device may further include a thin film encapsulation layer comprising a first encapsulation layer disposed on the bank structure, a second encapsulation layer disposed on the first encapsulation layer, and a third encapsulation layer disposed on the second encapsulation layer, and a touch layer disposed on the thin film encapsulation layer and including a plurality of touch insulating layers and a touch electrode disposed between the touch insulating layers.

In an embodiment, the display device may further include a light blocking layer disposed on the touch layer to overlap the touch electrode, where a plurality of opening holes may be defined through the light blocking layer to respectively overlap the openings of the bank structure, and a plurality of color filters respectively disposed in the opening holes on the light blocking layer.

According to an embodiment of the disclosure, a display device includes a substrate on which a display area and a non-display area surrounding the display area are defined, a first power line disposed on the substrate in the non-display area, a passivation layer disposed on the first power line in the display area and the non-display area, an anode electrode disposed on the passivation layer in the display area, an inorganic insulating layer partially overlapping the anode electrode and a plurality of insulating patterns disposed in the non-display area, a bank structure disposed on the inorganic insulating layer and the insulating patterns, where a plurality of openings is defined through the bank structure to overlap the anode electrode in the display area, and a plurality of hole patterns is defined through the bank structure and the insulating patterns in the non-display area, an active layer disposed on the anode electrode in the opening of the bank structure, and a cathode electrode disposed on the active layer. In such an embodiment, the bank structure includes a first bank layer and a second bank layer disposed on the first bank layer and including a metal material different from a material of the first bank layer, and the first bank layer is disposed to partially overlap the first power line in the non-display area, and the second bank layer includes a tip protruding further inwardly than a sidewall of the first bank layer.

In an embodiment, the hole patterns may not overlap the first power line and be disposed between the first power line and the display area in the non-display area.

In an embodiment, the display device may further include a bridge electrode disposed in the non-display area and disposed between the first power line and the first bank layer.

According to an embodiment of the disclosure, a display device includes a substrate on which a display area and a non-display area surrounding the display area are defined, a first power line disposed on the substrate in the non-display area, a passivation layer disposed on the first power line in the display area and the non-display area, an anode electrode disposed on the passivation layer in the display area, and a power connection electrode disposed on the passivation layer in the non-display area and electrically connected to the first power line, where a plurality of through portions defined through the power connection electrode, a residual pattern partially disposed on the anode electrode and first insulating patterns partially overlapping the through portions in the non-display area, an inorganic insulating layer disposed on the residual pattern and partially overlapping the anode electrode, and second insulating patterns disposed on the first insulating patterns and the power connection electrode, a bank structure disposed on the inorganic insulating layer and the power connection, where a plurality of openings is defined through the bank structure to overlap the anode electrode, and a plurality of hole patterns is defined by the first insulating patterns and the second insulating patterns to overlap the through portions, an active layer disposed on the anode electrode in the opening of the bank structure, and a cathode electrode disposed on the active layer. In such an embodiment, the bank structure includes a first bank layer, a second bank layer disposed on the first bank layer and including a metal material different from a material of the first bank layer, and a third bank layer disposed under the first bank layer and including a same material as the second bank layer, the second bank layer and the third bank layer includes tips protruding further inwardly than a sidewall of the first bank layer, and the first bank layer and the third bank layer are disposed to overlap the first power line and the power connection electrode, respectively, in the non-display area.

In an embodiment, the third bank layer may be disposed directly on the power connection electrode on the first power line, and the first bank layer may be electrically connected to the first power line.

In the display device according to embodiments, a bank structure including a metal material is disposed across the display area and the non-display area, and the light emitting elements disposed in openings defined in the display area may be electrically connected to power lines disposed in the non-display area through the bank structure.

In such embodiments, the display device may secure product reliability by effectively preventing defects that may occur when the bank structure disposed in the non-display area is in contact with a layer disposed therebelow.

However, effects according to the embodiments of the disclosure are not limited to those exemplified above and various other effects are incorporated herein.

BRIEF DESCRIPTION OF THE DRAWINGS

The above and other features of the disclosure will become more apparent by describing in detail embodiments thereof with reference to the accompanying drawings, in which.

DETAILED DESCRIPTION

Figure 1:
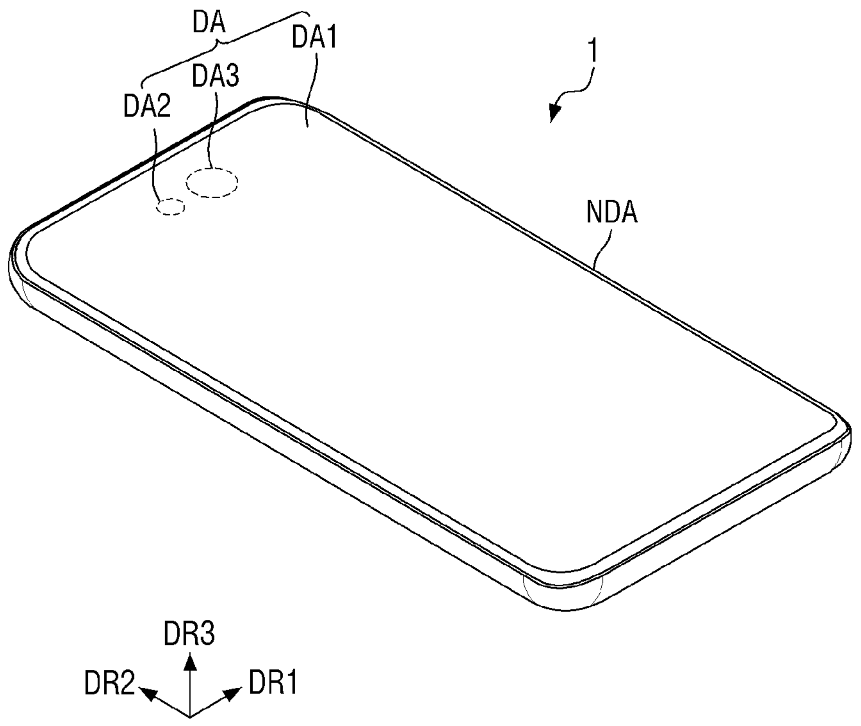
FIG. 1 is a schematic perspective view of an electronic device according to an embodiment.

The invention will now be described more fully hereinafter with reference to the accompanying drawings, in which various embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

It will be further understood that the terms "comprises" and/or "comprising." or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the accompanying drawings.

FIG. 1 is a schematic perspective view of an electronic device according to an embodiment.

Referring to FIG. 1, an embodiment of an electronic device 1 displays a moving image or a still image. The electronic device 1 may refer to any electronic device providing a display screen. Examples of the electronic device 1 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which provide a display screen.

Figure 2:
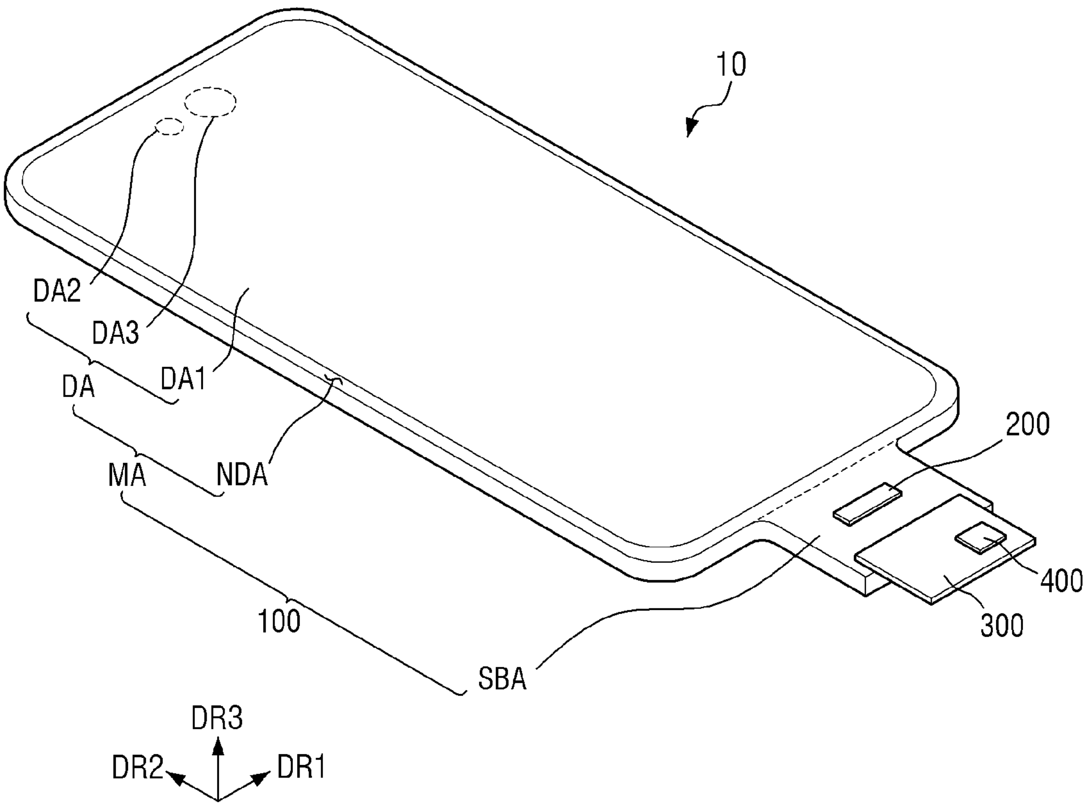
FIG. 2 is a perspective view illustrating a display device included in an electronic device according to an embodiment.

The electronic device 1 may include a display device 10 shown in FIG. 2 providing a display screen. Examples of the display device may include an inorganic light emitting diode display device, an organic light emitting display device, a quantum dot light emitting display device, a plasma display device and a field emission display device. In the following description, embodiments where a display device is an organic light emitting diode display device will be described as an example, but the disclosure is not limited thereto, and other types of display device may be applied within the same scope of technical spirit.

The shape of the electronic device 1 may be variously modified. In an embodiment, for example, the electronic device 1 may have a shape such as a rectangular shape elongated in a horizontal direction, a rectangular shape elongated in a vertical direction, a square shape, a quadrilateral shape with rounded corners (vertices), other polygonal shapes or a circular shape. The shape of a display area DA of the electronic device 1 may also be similar to the overall shape of the electronic device 1. FIG. 1 illustrates an embodiment where the electronic device 1 has a rectangular shape elongated in a second direction DR2.

The electronic device 1 may include the display area DA and a non-display area NDA. The display area DA is an area where a screen can be displayed, and the non-display area NDA is an area where a screen is not displayed. The display area DA may also be referred to as an active region, and the non-display area NDA may also be referred to as a non-active region. The display area DA may substantially occupy the center of the electronic device 1.

The display area DA may include a first display area DA1, a second display area DA2, and a third display area DA3. The second display area DA2 and the third display area DA3 are areas in which components for adding various functions to the electronic device 1 are disposed, and the second display area DA2 and the third display area DA3 may correspond to a component area.

FIG. 2 is a perspective view illustrating a display device included in an electronic device according to an embodiment.

Referring to FIG. 2, the electronic device 1 according to an embodiment may include a display device 10. The display device 10 may provide a screen of the electronic device 1. The display device 10 may have a planar shape similar to the shape of the electronic device 1. In an embodiment, for example, the display device 10 may have a shape similar to a rectangular shape having a short side in a first direction DR1 and a long side in a second direction DR2. The edge where the short side in the first direction DR1 and the long side in the second direction DR2 meet may be rounded to have a curvature, but is not limited thereto and may be formed at a right angle. The planar shape of the display device 10 is not limited to a quadrilateral shape, and may be formed in a shape similar to another polygonal shape, a circular shape, or elliptical shape.

In an embodiment, the display device 10 may include the display panel 100, the display driver 200, the circuit board 300, and the touch driver 400.

The display panel 100 may include a main region MA and a sub-region SBA.

The main region MA may include the display area DA including pixels for displaying an image and the non-display area NDA disposed around the display area DA. The display area DA may include the first display area DA1, the second display area DA2, and the third display area DA3. The display area DA may emit light from a plurality of emission areas or a plurality of opening areas. In an embodiment, for example, the display panel 100 may include a pixel circuit including switching elements, a pixel defining layer defining an emission area or an opening area, and a self-light emitting element.

In an embodiment, for example, the self-light emitting element may include at least one of an organic light emitting diode (LED) including an organic light emitting layer, a quantum dot LED including a quantum dot light emitting layer, an inorganic LED including an inorganic semiconductor, or a micro LED, but is not limited thereto.

The non-display area NDA may be an area outside the display area DA. The non-display area NDA may be defined as an edge area of the main region MA of the display panel 100. The non-display area NDA may include a gate driver (not illustrated) that supplies gate signals to the gate lines, and fan-out lines (not illustrated) that connect the display driver 200 to the display area DA.

The sub-region SBA may be a region extending from one side of the main region MA. The sub-region SBA may include a flexible material which can be bent, folded or rolled. In an embodiment, for example, in a state where the sub-region SBA is bent, the sub-region SBA may overlap the main region MA in a thickness direction of the display panel 100 (a third direction DR3). The sub-region SBA may include the display driver 200 and the pad portion connected to the circuit board 300. In an alternative embodiment, the sub-region SBA may be omitted, and the display driver 200 and the pad portion may be arranged in the non-display area NDA.

The display driver 200 may output signals and voltages for driving the display panel 100. The display driver 200 may supply data voltages to data lines. The display driver 200 may supply a power voltage to the power line and may supply a gate control signal to the gate driver. The display driver 200 may be formed as or defined by an integrated circuit (IC) and mounted on the display panel 100 by a chip on glass (COG) method, a chip on plastic (COP) method, or an ultrasonic bonding method. In an embodiment, for example, the display driver 200 may be disposed in the sub-region SBA, and may overlap the main region MA in the thickness direction by bending of the sub-region SBA. In an alternative embodiment, for another example, the display driver 200 may be mounted on the circuit board 300.

The circuit board 300 may be attached to the pad portion of the display panel 100 by using an anisotropic conductive film (ACF). Lead lines of the circuit board 300 may be electrically connected to a pad portion of the display panel 100. The circuit board 300 may be a flexible printed circuit board, a printed circuit board, or a flexible film such as a chip on film.

A touch driver 400 may be mounted on the circuit board 300. The touch driver 400 may be connected to a touch sensing unit of the display panel 100. The touch driver 400 may supply a touch driving signal to a plurality of touch electrodes of the touch sensing unit and may sense an amount of change in capacitance between the plurality of touch electrodes. In an embodiment, for example, the touch driving signal may be a pulse signal having a predetermined frequency. The touch driver 400 may calculate whether an input is made and input coordinates based on an amount of change in capacitance between the plurality of touch electrodes. The touch driver 400 may be formed as an integrated circuit (IC).

Figure 3:
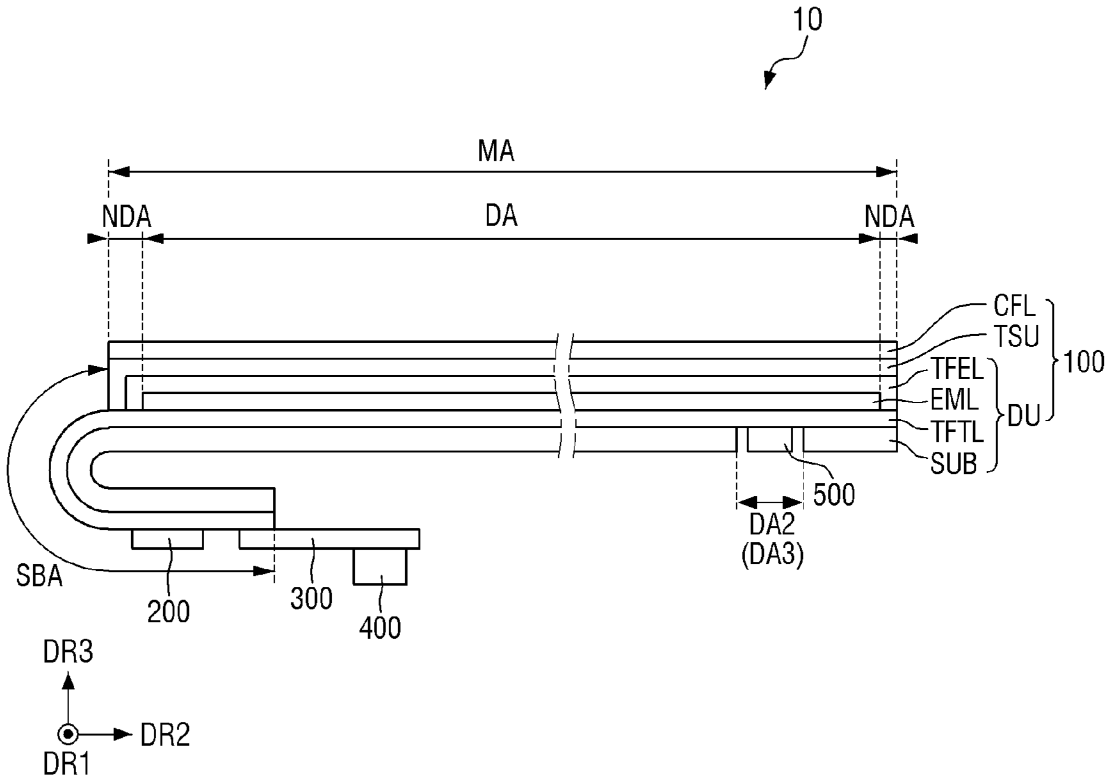
FIG. 3 is a cross-sectional view of the display device of FIG. 2 viewed from a side.

FIG. 3 is a cross-sectional view of the display device of FIG. 2 viewed from a side.

Referring to FIG. 3, an embodiment of the display panel 100 may include a display layer DU, a touch sensing layer TSU, and a color filter layer CFL. The display layer DU may include a substrate SUB, a thin film transistor layer TFTL, a light emitting element layer EML, and a thin film encapsulation layer TFEL.

The substrate SUB may be a base substrate or a base member. The substrate SUB may be a flexible substrate which can be bent, folded or rolled. In an embodiment, for example, the substrate SUB may include a polymer resin such as polyimide (PI), but is not limited thereto. In an alternative embodiment, the substrate SUB may include a glass material or a metal material.

The thin film transistor layer TFTL may be disposed on the substrate SUB. The thin film transistor layer TFTL may include a plurality of thin film transistors constituting a pixel circuit of pixels. The thin film transistor layer TFTL may further include gate lines, data lines, power lines, gate control lines, fan-out lines that connect the display driver 200 to the data lines, and lead lines that connect the display driver 200 to the pad portion. Each of the thin film transistors may include a semiconductor region, a source electrode, a drain electrode, and a gate electrode. In an embodiment, for example, where the gate driver is provided or formed on one side of the non-display area NDA of the display panel 100, the gate driver may include thin film transistors.

The thin film transistor layer TFTL may be disposed in the display area DA, the non-display area NDA, and the sub-region SBA. Thin film transistors, gate lines, data lines, and power lines of each of the pixels of the thin film transistor layer TFTL may be disposed in the display area DA. Gate control lines and fan-out lines of the thin film transistor layer TFTL may be disposed in the non-display area NDA. The lead lines of the thin film transistor layer TFTL may be disposed in the sub-region SBA.

The light emitting element layer EML may be disposed on the thin film transistor layer TFTL. The light emitting element layer EML may include a plurality of light emitting elements, each including a first electrode, a second electrode, and a light emitting layer to emit light, and a pixel defining layer defining pixels or light emitting areas. The plurality of light emitting elements of the light emitting element layer EML may be disposed in the display area DA.

In an embodiment, the light emitting layer may be an organic light emitting layer including an organic material. The light emitting layer may include a hole transporting layer, an organic light emitting layer, and an electron transporting layer. When the first electrode receives a voltage through the thin film transistor of the thin film transistor layer TFTL and the second electrode receives the cathode voltage, holes and electrons may be transferred to the organic light emitting layer through the hole transporting layer and the electron transporting layer, respectively and may be combined with each other to emit light in the organic light emitting layer.

In an alternative embodiment, the light emitting elements may include a quantum dot LED including a quantum dot light emitting layer, an inorganic LED including an inorganic semiconductor, or a micro LED.

The display device 10 according to an embodiment may include a plurality of color filters CF1, CF2, and CF3 (see FIGS. 5 and 6) disposed on the light emitting elements of the light emitting element layer EML. Each of the color filters may selectively transmit light of a specific wavelength and may block or absorb light of a different wavelength. The color filters may absorb a part of light coming from the outside of the display device 10 to reduce reflected light due to external light. Accordingly, the color filter may prevent color distortion caused by reflection of the external light. In an embodiment where the color filters are disposed on the light emitting elements, the display device 10 may not include a separate substrate for the color filter. Accordingly, the thickness of the display device 10 may come relatively thin.

The thin film encapsulation layer TFEL may cover the top surface and the side surface of the light emitting element layer EML, and may protect the light emitting element layer EML. The thin film encapsulation layer TFEL may include at least one inorganic layer and at least one organic layer for encapsulating the light emitting element layer EML.

The touch sensing layer TSU may be disposed on the encapsulation layer TFEL. The touch sensing layer TSU may include a plurality of touch electrodes for sensing a user's touch in a capacitive manner, and touch lines connecting the plurality of touch electrodes to the touch driver 400. In an embodiment, for example, the touch sensing layer TSU may sense the user's touch by using a mutual capacitance method or a self-capacitance method.

In an alternative embodiment, the touch sensing layer TSU may be disposed on a separate substrate disposed on the display layer DU. In such an embodiment, the substrate supporting the touch sensing layer TSU may be a base member that encapsulates the display layer DU.

The plurality of touch electrodes of the touch sensing layer TSU may be disposed in a touch sensor area overlapping the display area DA. The touch lines of the touch sensing layer TSU may be disposed in a touch peripheral area that overlaps the non-display area NDA.

In some embodiments, the display device 10 may further include an optical device 500. The optical device 500 may be disposed in the second display area DA2 or the third display area DA3. The optical device 500 may emit or receive light in infrared, ultraviolet, and visible light bands. In an embodiment, for example, the optical device 500 may be an optical sensor that detects light incident on the display device 10 such as a proximity sensor, an illuminance sensor, and a camera sensor or an image sensor.

The color filter layer CFL may be disposed on the thin film encapsulation layer TFEL. The color filter layer CFL may include a plurality of color filters respectively corresponding to the plurality of emission areas. Each of the color filters may selectively transmit light of a specific wavelength and may block or absorb light of a different wavelength. The color filter layer CFL may absorb a part of light coming from the outside of the display device 10 to reduce reflected light due to external light. Accordingly, the color filter layer CFL may prevent color distortion caused by reflection of the external light.

In an embodiment where the color filter layer CFL is directly disposed on the thin film encapsulation layer TFEL, the display device 10 may not include a separate substrate for the color filter layer CFL. Accordingly, the thickness of the display device 10 may become relatively thin.

Figure 4:
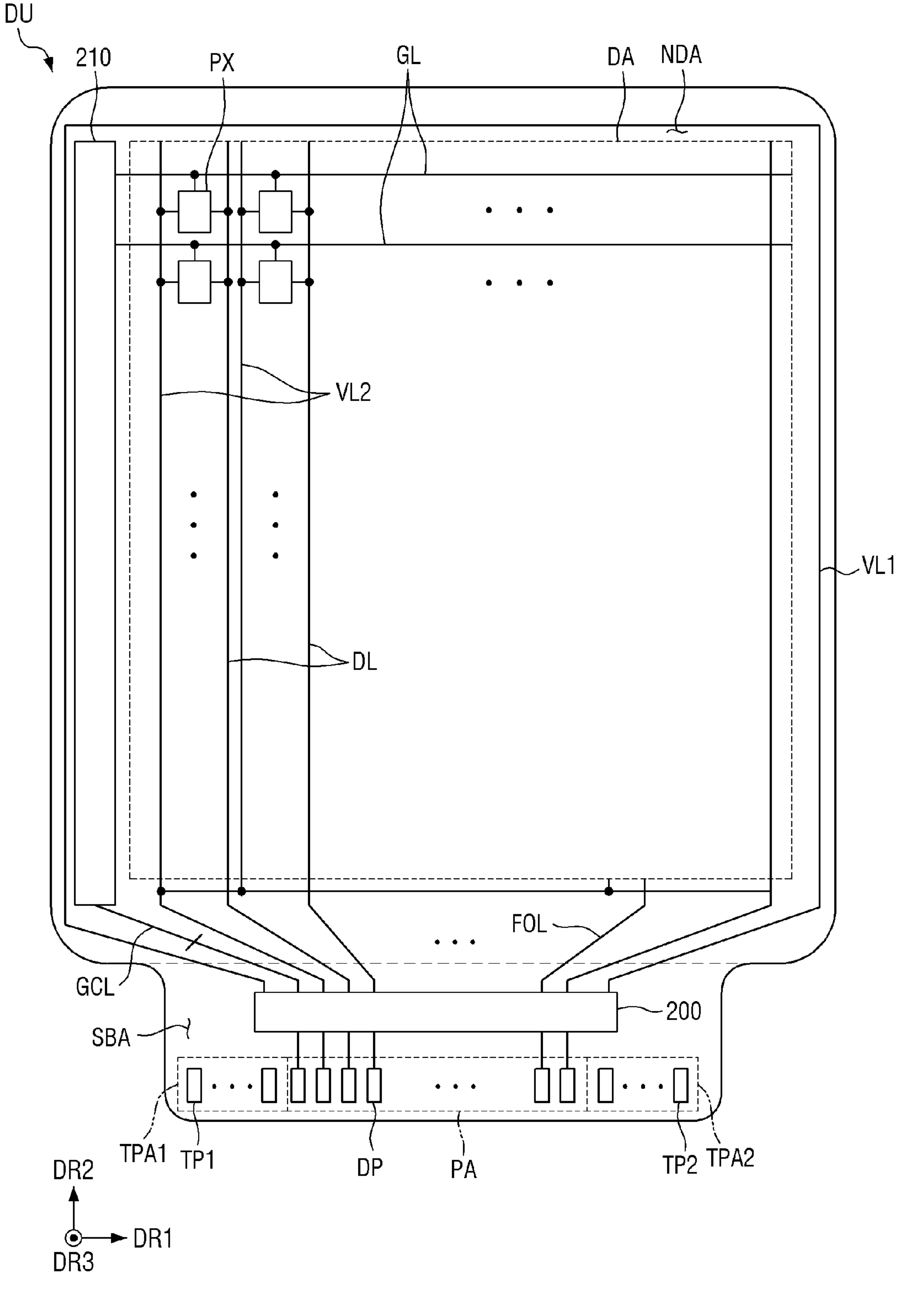
FIG. 4 is a plan view illustrating a display layer of a display device according to an embodiment.

FIG. 4 is a plan view illustrating a display layer of a display device according to an embodiment.

Referring to FIG. 4, an embodiment of the display layer DU may include the display area DA and the non-display area NDA.

The display area DA may be disposed at the center of the display panel 100. A plurality of pixels PX, a plurality of gate lines GL, a plurality of data lines DL, and some of a plurality of power lines (e.g., a second power line VL2) may be disposed in the display area DA. Each of the plurality of pixels PX may be defined as a minimum or basic unit that emits light.

The plurality of gate lines GL may supply the gate signals received from the gate driver 210 to the plurality of pixels PX. The plurality of gate lines GL may extend in the first direction DR1 and may be spaced apart from each other in the second direction DR2 intersecting the first direction DR1.

The plurality of data lines DL may supply the data voltages received from the display driver 200 to the plurality of pixels PX. The plurality of data lines DL may extend in the second direction DR2 and may be spaced apart from each other in the first direction DR1.

Among the plurality of power lines, the second power line VL2 may supply the power voltage received from the display driver 200 to the plurality of pixels PX. Here, the power voltage may be at least one of a driving voltage, an initialization voltage, or a reference voltage. The plurality of second power lines VL2 may extend in the second direction DR2 and may be spaced apart from each other in the first direction DR1.

The non-display area NDA may surround the display area DA. In the non-display area NDA, some of the plurality of power lines (e.g., a first power line VL1), the gate driver 210, fan-out lines FOL, and gate control lines GCL may be disposed. The gate driver 210 may generate a plurality of gate signals based on the gate control signal, and may sequentially supply the plurality of gate signals to the plurality of gate lines GL according to a set order.

The fan-out lines FOL may extend from the display driver 200 to the display area DA. The fan-out lines FOL may supply the data voltage received from the display driver 200 to the plurality of data lines DL.

The gate control line GCL may extend from the display driver 200 to the gate driver 210. The gate control line GCL may supply the gate control signal received from the display driver 200 to the gate driver 210. FIG. 4 illustrates an embodiment where the gate driver 210 is disposed only in the non-display area NDA disposed on the left side of the display area DA, but is not limited thereto. In some embodiments, the display device 10 may include a plurality of gate drivers 210 respectively disposed on the left side and the right side of the display area DA.

Among the plurality of power lines, the first power line VL1 may surround the display area DA and be disposed in the non-display area NDA. The first power line VL1 may supply the power voltage received from the display driver 200 to the plurality of pixels PX. Here, the power voltage may be a low potential power voltage.

The sub-region SBA may include the display driver 200, a pad area PA, and first and second touch pad areas TPA1 and TPA2.

The display driver 200 may output signals and voltages for driving the display panel 100 to the fan-out lines FOL. The display driver 200 may supply a data voltage to the data line DL through the fan-out lines FOL. The data voltage may be supplied to the plurality of pixels PX, and the luminance of the plurality of pixels PX may be controlled. The display driver 200 may supply the gate control signal to the gate driver 210 through the gate control line GCL.

The pad area PA, the first touch pad area TPA1, and the second touch pad area TPA2 may be disposed at the edge of the sub-region SBA. The pad area PA, the first touch pad area TPA1, and the second touch pad area TPA2 may be electrically connected to the circuit board 300 by using a material such as self assembly anisotropic conductive paste (SAP) or an anisotropic conductive film.

The pad area PA may include a plurality of display pad portions DP. The plurality of display pad portions DP may be connected to a graphic system through the circuit board 300. The plurality of display pad portions DP may be connected to the circuit board 300 to receive digital video data, and may supply the digital video data to the display driver 200.

Figure 5:
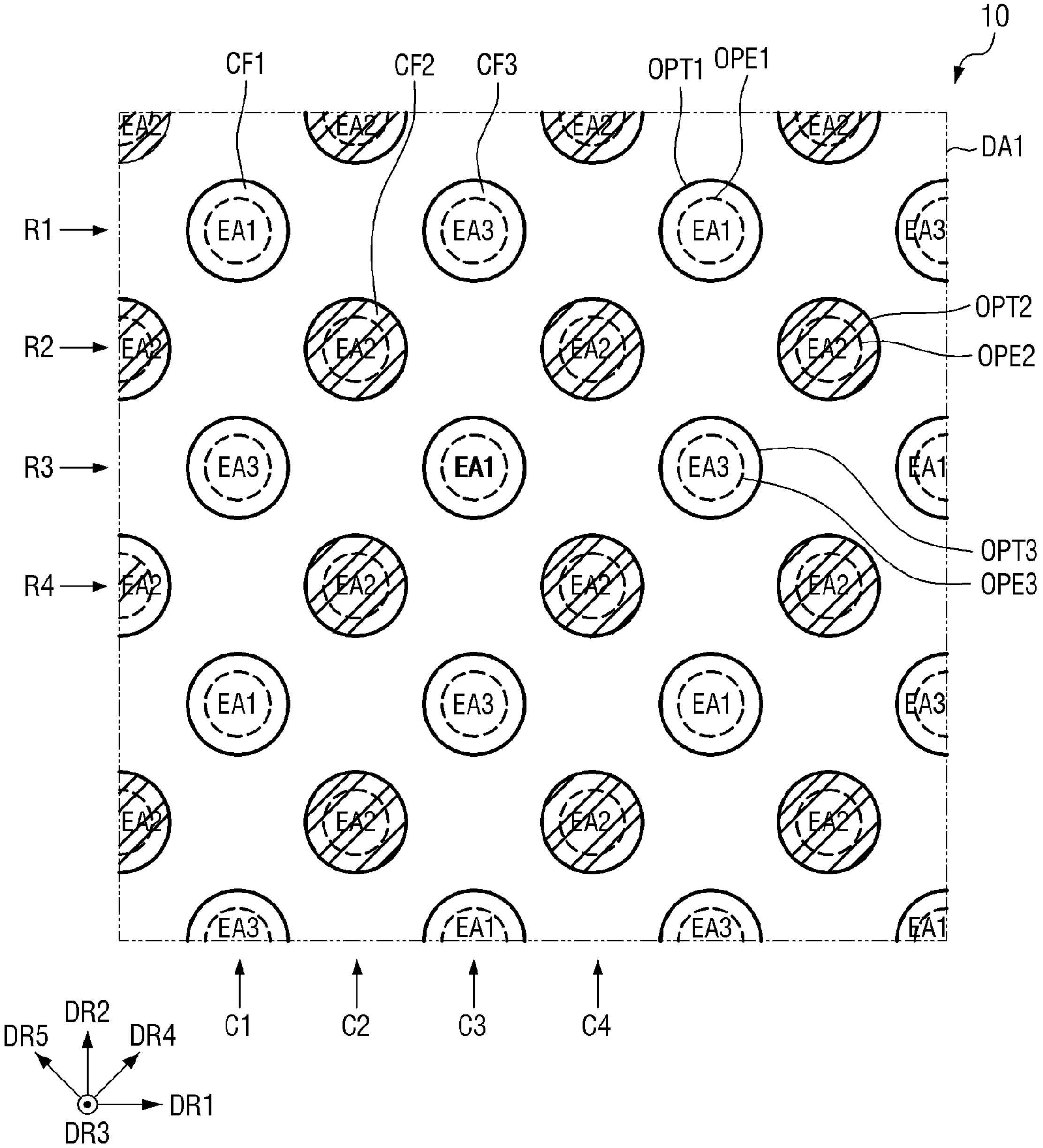
FIG. 5 is a plan view of the disposition of the color filters and the emission areas in the display area of the display device according to an embodiment.

FIG. 5 is a plan view of the disposition of the color filters and the emission areas in the display area of the display device according to an embodiment.

Referring to FIG. 5, an embodiment of the display device 10 may include a plurality of emission areas EA1, EA2, and EA3 disposed in the display area DA. The display area DA shown in FIG. 5 is the first display area DA1, and the plurality of emission areas EA1, EA2, and EA3 may be disposed in the first display area DA1. However, the plurality of emission areas EA1, EA2, and EA3 may be disposed also in the second display area DA2 and the third display area DA3 of the display area DA.

The emission areas EA1, EA2, and EA3 may include a first emission area EA1, a second emission area EA2, and a third emission area EA3 emitting light of different colors. The first to third emission areas EA1, EA2, and EA3 may emit red, green, or blue light, respectively, and the color of the light emitted from each of the emission areas EA1, EA2 and EA3 may be different or variously modified depending on the type of light emitting elements ED1, ED2, and ED3 (see FIG. 6) disposed on a light emitting element layer EML to be described later. In an embodiment, the first emission area EA1 may emit first light of a red color, the second emission area EA2 may emit second light of a green color, and the third emission area EA3 may emit third light of a blue color. However, the disclosure is not limited thereto.

The plurality of emission areas EA1, EA2, and EA3 may be arranged in a Pentile™ type, e.g., a diamond Pentile™ type. In an embodiment, for example, the first emission area EA1 and the third emission area EA3 may be spaced apart from each other in the first direction DR1, and they may be alternately arranged in the first direction DR1 and the second direction DR2. In the arrangement of the emission areas EA1, EA2, and EA3, the first emission area EA1 and the third emission area EA3 may be alternately arranged in the first direction DR1 in a first row R1 and a third row R3. In a first column C1 and a third column C3, the first emission area EA1 and the third emission area EA3 may be alternately arranged in the second direction DR2.

The second emission area EA2 may be spaced apart from another adjacent second emission area EA2 in the first direction DR1 and the second direction DR2, and may be spaced apart from an adjacent first emission area EA1 and an adjacent third emission area EA3 in a fourth direction DR4 or a fifth direction DR5. The plurality of second emission areas EA2 may be repeatedly arranged along the first direction DR1 and the second direction DR2, and the second emission area EA2 and the first emission area EA1, or the second emission area EA2 and the third emission area EA3 may be alternately arranged along the fourth direction DR4 or the fifth direction DR5. In the arrangement of the emission areas EA1, EA2, and EA3, the second emission area EA2 may be repeatedly disposed in the first direction DR1 in a second row R2 and a fourth row R4, and the second emission area EA2 may be repeatedly disposed in the second direction DR2 in a second column C2 and a fourth column C4.

The first to third emission areas EA1, EA2, and EA3 may be respectively defined by a plurality of openings OPE1, OPE2, and OPE3 defined or formed in a bank structure BNS (see FIG. 6) of the light emitting element layer EML which will be described later. In an embodiment, for example, the first emission area EA1 may be defined by the first opening OPE1 of the pixel defining layer, the second emission area EA2 may be defined by the second opening OPE2 of the pixel defining layer, and the third emission area EA3 may be defined by the third opening OPE3 of the pixel defining layer.

Figure 6:
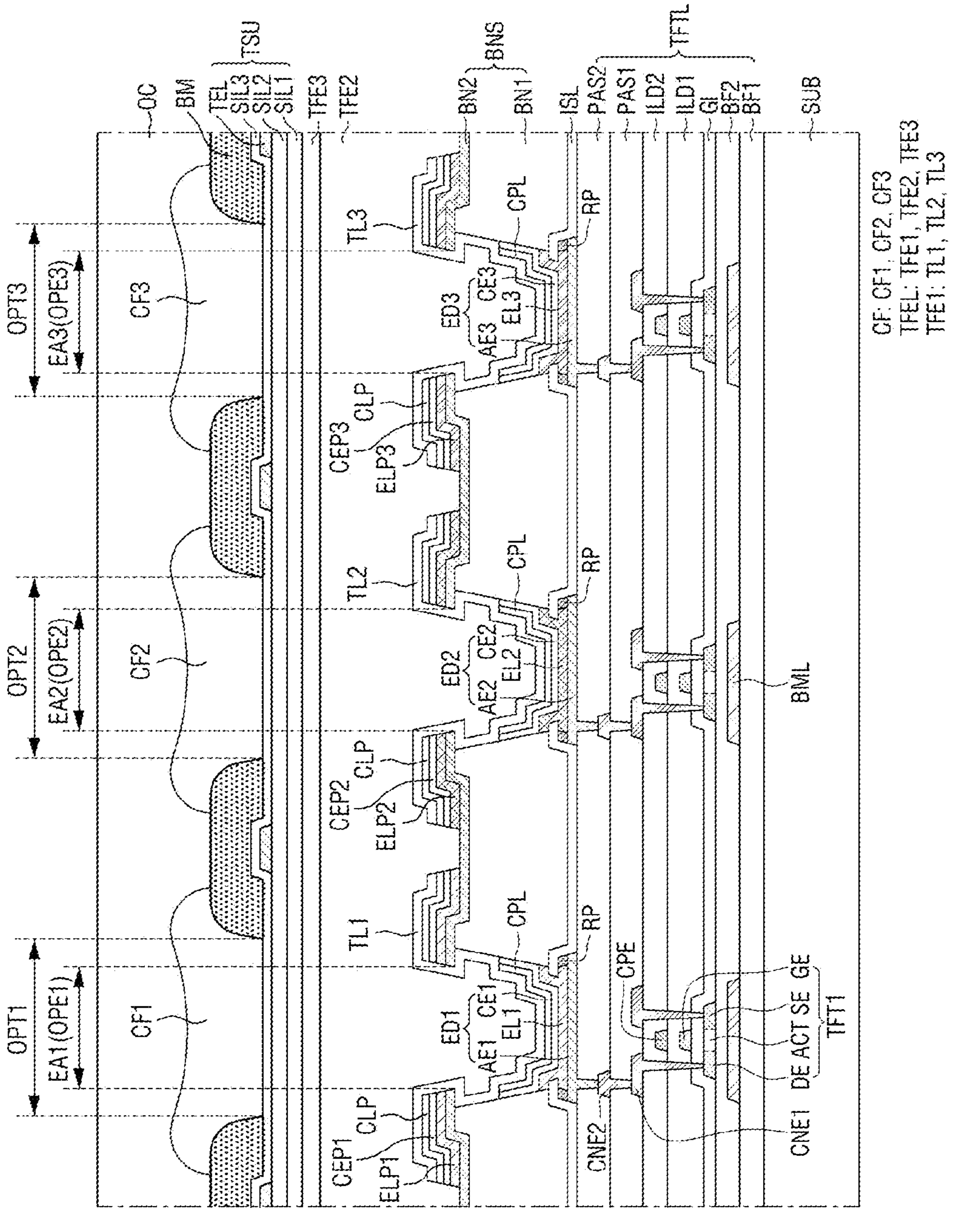
FIG. 6 is a cross-sectional view illustrating a part of a display device according to an embodiment.

The areas of the emission areas EA1, EA2, and EA3 may correspond to the sizes of the openings OPE1, OPE2, and OPE3 of the bank structure. The intensity of light emitted from the corresponding emission areas EA1, EA2, and EA3 may correspond to the areas of the emission areas EA1, EA2, and EA3, and the areas of the emission areas EA1, EA2, and EA3 may be adjusted to control the color of the screen displayed on the display device 10 or the electronic device 1. In an embodiment, the areas or sizes of the first to third emission areas EA1, EA2, and EA3 may be the same as each other. In the embodiment of FIG. 6, the first emission area EA1, the second emission area EA2, and the third emission area EA3 may have a same planar area as each other or a same diameter as each other. Here, the planar area may mean an area in a plan view or when viewed in the third direction DR3.

However, the disclosure is not limited thereto. The areas of the emission areas EA1, EA2, and EA3 may be freely adjusted or variously modified according to the color of the screen desired by the display device 10 and the electronic device 1. In addition, the areas of the emission areas EA1, EA2, and EA3 may be related to light efficiency and the lifespan of the light emitting element ED, and may have a trade-off relation with the reflection by external light. The areas of the emission areas EA1, EA2, and EA3 may be adjusted in consideration of the above factors. In an embodiment, for example, in the display device 10, the area of the third emission area EA3 may be greater than the areas of the first emission area EA1 and the second emission area EA2, and the area of the first emission area EA1 may be greater than the area of the second emission area EA2.

In the display device 10 having the arrangement of the emission areas EA1, EA2, and EA3 shown in FIG. 5, one first emission area EA1, two second emission areas EA2, and one third emission area EA3 adjacent to each other may form one pixel group. One pixel group may include the emission areas EA1, EA2, and EA3 emitting light of different colors to express a white gray scale. However, the disclosure is not limited thereto, and the combination of the emission areas EA1, EA2, and EA3 constituting one pixel group may be variously modified depending on the arrangement of the emission areas EA1, EA2, and EA3, the color of the light emitted from the emission areas EA1, EA2, and EA3, and the like.

The display device 10 may include the plurality of color filters CF1, CF2, and CF3 disposed on the emission areas EA1, EA2, and EA3. The plurality of color filters CF1, CF2, and CF3 may be disposed to correspond to the emission areas EA1, EA2, and EA3, respectively. In an embodiment, for example, the color filters CF1, CF2, and CF3 may be disposed in the emission areas EA1, EA2, and EA3, or a plurality of opening holes OPT1, OPT2, and OPT3 defined or formed in a light blocking layer BM disposed to correspond to the openings OPE1, OPE2, and OPE3, respectively. The opening holes OPT1, OPT2, and OPT3 of the light blocking layer may be defined or formed to overlap the openings OPE1, OPE2, and OPE3, and a light exit area, from which the light emitted from the emission areas EA1, EA2, and EA3 is emitted, may be defined. The color filters CF1, CF2, and CF3 may have planar areas greater than those of the openings OPE1, OPE2, and OPE3, respectively, and the color filters CF1, CF2, and CF3 may completely cover the light exit area formed by the opening holes OPT1, OPT2, and OPT3 of the light blocking layer BM, respectively.

The color filters CF1, CF2, and CF3 may include a first color filter CF1, a second color filter CF2, and a third color filter CF3 disposed to correspond to the different emission areas EA1, EA2, and EA3, respectively. The color filters CF1, CF2, and CF3 may include a colorant such as a dye or a pigment that absorbs light in a wavelength band other than light in a specific wavelength band, and may be disposed to correspond to the color of the light emitted from the emission areas EA1, EA2, and EA3. In an embodiment, for example, the first color filter CF1 may be a red color filter that is disposed to overlap the first emission area EA1 and transmits only the first light of the red color. The second color filter CF2 may be a green color filter that is disposed to overlap the second emission area EA2 and transmits only the second light of the green color, and the third color filter CF3 may be a blue color filter that is disposed to overlap the third emission area EA3 and transmits only the third light of the blue color.

Similarly to the arrangement of the emission areas EA1, EA2, and EA3, the color filters CF1, CF2, and CF3 may be arranged in a Pentile™ type, e.g., a diamond Pentile™ type. In an embodiment, for example, the first color filter CF1 and the third color filter CF3 may be alternately arranged in the first direction DR1 and the second direction DR2. In the arrangement of the color filters CF1, CF2, and CF3, the first color filter CF1 and the third color filter CF3 may be alternately arranged in the first direction DR1 in the first row R1 and the third row R3. In the first column C1 and the third column C3, the first color filter CF1 and the third color filter CF3 may be alternately arranged in the second direction DR2.

The second color filter CF2 and another adjacent second color filter CF2 may be arranged in the first direction DR1 and the second direction DR2, and the second color filter CF2 and an adjacent first color filter CF1 and an adjacent third color filter CF3 may be arranged in the fourth direction DR4 or the fifth direction DR5. The plurality of second color filters CF2 may be repeatedly arranged along the first direction DR1 and the second direction DR2, and the second color filter CF2 and the first color filter CF1, or the second color filter CF2 and the third color filter CF3 may be alternately arranged along the fourth direction DR4 or the fifth direction DR5. In the arrangement of the color filters CF1, CF2, and CF3, the second color filter CF2 may be repeatedly disposed in the first direction DR1 in the second row R2 and the fourth row R4, and the second color filter CF2 may be repeatedly disposed in the second direction DR2 in the column C2 and the fourth column C4.

Figure 7:
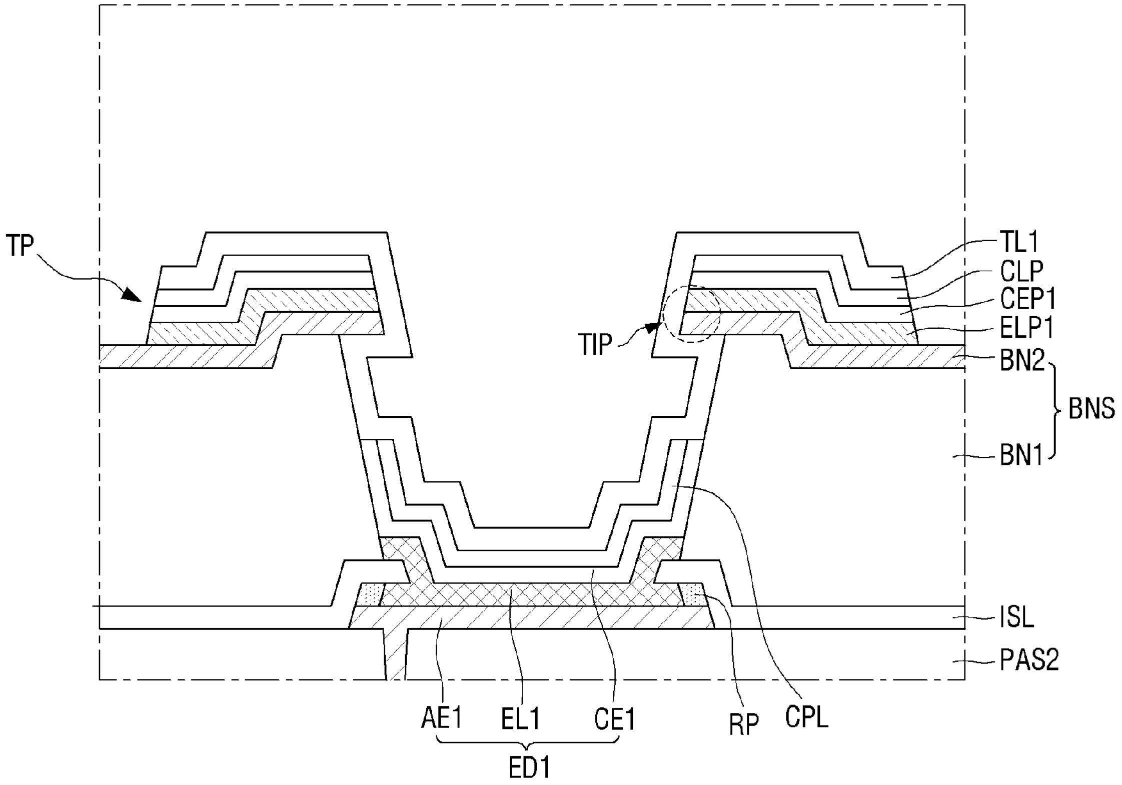
FIG. 7 is an enlarged view illustrating the first emission area of FIG. 6.

FIG. 6 is a cross-sectional view illustrating a part of a display device according to an embodiment. FIG. 7 is an enlarged view illustrating the first emission area of FIG. 6. FIG. 6, which is a partial cross-sectional view of the display device 10, illustrates the cross section of the substrate SUB, the thin film transistor layer TFTL, the light emitting element layer EML, and the thin film encapsulation layer TFEL of the display layer DU, the touch sensing layer TSU, and the color filter layer CFL. FIG. 7 illustrates a first light emitting element ED1 disposed in the first emission area EA1 in FIG. 6 and a part of the bank structure BNS adjacent thereto.

Referring to FIGS. 6 and 7 in addition to FIG. 5, in an embodiment, the display panel 100 of the display device 10 may include the display layer DU. The display layer DU may include a substrate SUB, a thin film transistor layer TFTL, a light emitting element layer EML, and a thin film encapsulation layer TFEL. The display panel 100 may include the light blocking layer BM disposed on the thin film encapsulation layer TFEL, and the color filters CF1, CF2, and CF3 of the color filter layer CFL may be disposed on the light blocking layer BM.

The substrate SUB may be a base substrate or a base member. The substrate SUB may be a flexible substrate which can be bent, folded or rolled. In an embodiment, for example, the substrate SUB may include a polymer resin such as polyimide (PI), but is not limited thereto. In an alternative embodiment, for example, the substrate SUB may include a glass material or a metal material.

The thin film transistor layer TFTL may include a first buffer layer BF1, a lower metal layer BML, a second buffer layer BF2, a first thin film transistor TFT1, a gate insulating layer GI, a first interlayer insulating layer ILD1, a capacitor electrode CPE, a second interlayer insulating layer ILD2, a first connection electrode CNE1, a first passivation layer PAS1, a second connection electrode CNE2, and a second passivation layer PAS2.

The first buffer layer BF1 may be disposed on the substrate SUB. The first buffer layer BF1 may include an inorganic layer capable of preventing penetration of air or moisture. In an embodiment, for example, the first buffer layer BF1 may include a plurality of inorganic layers alternately stacked.

The lower metal layer BML may be disposed on the first buffer layer BF1. In an embodiment, for example, the lower metal layer BML may be formed as (or defined by) a single layer or multiple layers, each layer including at least one selected from molybdenum (Mo), aluminum (Al), chromium (Cr), gold (Au), titanium (Ti), nickel (Ni), neodymium (Nd) and copper (Cu) or an alloy thereof.

The second buffer layer BF2 may cover the first buffer layer BF1 and the lower metal layer BML. The second buffer layer BF2 may include an inorganic layer capable of preventing penetration of air or moisture. In an embodiment, for example, the second buffer layer BF2 may include a plurality of inorganic layers alternately stacked.

The first thin film transistor TFT1 may be disposed on the second buffer layer BF2, and may constitute a pixel circuit of each of a plurality of pixels. In an embodiment, for example, the first thin film transistor TFT1 may be a driving transistor or a switching transistor of a pixel circuit disposed in the display area DA. The first thin film transistor TFT1 may include a semiconductor layer ACT, a source electrode SE, a drain electrode DE, and a gate electrode GE.

The semiconductor layer ACT may be disposed on the second buffer layer BF2. The semiconductor layer ACT may overlap the lower metal layer BML and the gate electrode GE in the thickness direction (or the third direction DR3), and may be insulated from the gate electrode GE by the gate insulating layer GI. In a part of the semiconductor layer ACT, a material of the semiconductor layer ACT may be made into a conductor to form the source electrode SE and the drain electrode DE.

The gate electrode GE may be disposed on the gate insulating layer GI. The gate electrode GE may overlap the semiconductor layer ACT with the gate insulating layer GI interposed therebetween.

The gate insulating layer GI may be disposed on the semiconductor layer ACT. In an embodiment, for example, the gate insulating layer GI may cover the semiconductor layer ACT and the second buffer layer BF to insulate the gate electrode GE from the semiconductor layer ACT. The gate insulating layer GI may be provided with a contact hole through which the first connection electrode CNE1 is disposed.

The first interlayer insulating layer ILD1 may cover the gate electrode GE and the gate insulating layer GI. The first interlayer insulating layer ILD1 may be provided with a contact hole through which the first connection electrode CNE1 is disposed. The contact hole of the first interlayer insulating layer ILD1 may be connected to the contact hole of the gate insulating layer GI and the contact hole of the second interlayer insulating layer ILD2.

The capacitor electrode CPE may be disposed on the first interlayer insulating layer ILD1. The capacitor electrode CPE may overlap the gate electrode GE in the thickness direction. The capacitor electrode CPE and the gate electrode GE may form a capacitance.

The second interlayer insulating layer ILD2 may cover the capacitor electrode CPE and the first interlayer insulating layer ILD1. The second interlayer insulating layer ILD2 may be provided with a contact hole through which the first connection electrode CNE1 is disposed. The contact hole of the second interlayer insulating layer ILD2 may be connected to the contact hole of the first interlayer insulating layer ILD1 and the contact hole of the gate insulating layer GI.

The first connection electrode CNE1 may be disposed on the second interlayer insulating layer ILD2. The first connection electrode CNE1 may electrically connect the drain electrode DE of the first thin film transistor TFT1 to the second connection electrode CNE2. The first connection electrode CNE1 may be inserted into a contact hole provided in the second interlayer insulating layer ILD2, the first interlayer insulating layer ILD1, and the gate insulating layer GI to be in contact with the drain electrode DE of the first thin film transistor TFT1.

The first passivation layer PAS1 may cover the first connection electrode CNE1 and the second interlayer insulating layer ILD2. The first passivation layer PAS1 may protect the first thin film transistor TFT1. The first passivation layer PAS1 may be provided with a contact hole through which the second connection electrode CNE2 is disposed.

The second connection electrode CNE2 may be disposed on the first passivation layer PAS1. The second connection electrode CNE2 may electrically connect the first connection electrode CNE1 to anode electrodes AE1, AE2, and AE3 of the light emitting element ED. The second connection electrode CNE2 may be inserted into a contact hole formed in the first passivation layer PAS1 to be in contact with the first connection electrode CNE1.

The second passivation layer PAS2 may cover the second connection electrode CNE2 and the first passivation layer PAS1. The second passivation layer PAS2 may be provided with a contact hole through which the anode electrodes AE1, AE2, and AE3 of the light emitting element ED are disposed.

The light emitting element layer EML may be disposed on the thin film transistor layer TFTL. The light emitting element layer EML may include the light emitting element ED and the plurality of bank structures BNS. The light emitting element ED may include the anode electrodes AE1, AE2, and AE3, light emitting layers EL1, EL2, and EL3, and cathode electrodes CE1, CE2, and CE3.

The display device 10 may include the plurality of emission areas EA1, EA2, and EA3 disposed in the display area DA. The emission areas EA1, EA2, and EA3 may include a first emission area EA1, a second emission area EA2, and a third emission area EA3 that emit light of different colors, respectively. The first to third emission areas EA1, EA2, and EA3 may emit red, green, or blue light, respectively, and the color of the light emitted from each of the emission areas EA1, EA2 and EA3 may be different depending on the type of the light emitting element ED disposed on the light emitting element layer EML. In an embodiment, the first emission area EA1 may emit first light of a red color, the second emission area EA2 may emit second light of a green color, and the third emission area EA3 may emit third light of a blue color. However, the disclosure is not limited thereto.

The first to third emission areas EA1, EA2, and EA3 may be defined by a plurality of openings OPE1, OPE2, and OPE3 formed in the bank structure BNS of the light emitting element layer EML, respectively. In an embodiment, for example, the first emission area EA1 may be defined by the first opening OPEL of the bank structure BNS, the second emission area EA2 may be defined by the second opening OPE2 of the bank structure BNS, and the third emission area EA3 may be defined by the third opening OPE3 of the bank structure BNS.

In an embodiment, the areas or sizes of the first to third emission areas EA1, EA2, and EA3 may be the same as each other. In an embodiment, for example, in the display device 10, the openings OPE1, OPE2, and OPE3 of the bank structures BNS may have the same diameter, and the first emission area EA1, the second emission area EA2, and the third emission area EA3 may have the same area as each other. However, the disclosure is not limited thereto. In the display device 10, the areas or sizes of the first to third emission areas EA1, EA2, and EA3 may be different from each other. In an embodiment, for example, the areas of the second emission area EA2 may be greater than the areas of the first emission area EA1 and the third emission area EA3, and the area of the third emission area EA3 may be greater than the area of the first emission area EA1. The intensity of light emitted from the corresponding emission areas EA1, EA2, and EA3 may vary according to the areas of the emission areas EA1, EA2, and EA3, and the areas of the emission areas EA1, EA2, and EA3 may be adjusted to control the color of the screen displayed on the display device 10 or the electronic device 1. Although FIG. 5 illustrates an embodiment where the emission areas EA1, EA2, and EA3 have the same area as each other, the disclosure is not limited thereto. The areas of the emission areas EA1, EA2, and EA3 may be freely adjusted according to the color of the screen desired by the display device 10 and the electronic device 1. In addition, the areas of the emission areas EA1, EA2, and EA3 may be related to light efficiency and the lifespan of the light emitting element ED, and may have a trade-off relation with the reflection by external light. The areas of the emission areas EA1, EA2, and EA3 may be adjusted in consideration of the above factors.

In the display device 10, one first emission area EA1, one second emission area EA2, and one third emission area EA3 disposed adjacent to each other may form one pixel group. One pixel group may include the emission areas EA1, EA2, and EA3 emitting light of different colors to express a white gray scale. However, the disclosure is not limited thereto, and the combination of the emission areas EA1, EA2, and EA3 constituting one pixel group may be variously modified depending on the arrangement of the emission areas EA1, EA2, and EA3, the color of the light emitted from the emission areas EA1, EA2, and EA3, and the like.

The display device 10 may include the plurality of light emitting elements ED1, ED2, and ED3 disposed in the different emission areas EA1, EA2, and EA3, respectively. The light emitting elements ED1, ED2, and ED3 may include a first light emitting element ED1 disposed in the first emission area EA1, a second light emitting element ED2 disposed in the second emission area EA2, and a third light emitting element ED3 disposed in the third emission area EA3. The light emitting elements ED1, ED2, and ED3 may include the anode electrodes AE1, AE2, and AE3, the light emitting layers EL1, EL2, and EL3, and the cathode electrodes CE1, CE2, and CE3, respectively, and the light emitting layers EL1, EL2, and EL3 disposed in the different emission areas EA1, EA2, and EA3 may emit lights of different colors depending on the materials of the light emitting layers EL1, EL2, and EL3. In an embodiment, for example, the first light emitting element ED1 disposed in the first emission area EA1 may emit red light of a first color, the second light emitting element ED2 disposed in the second emission area EA2 may emit green light of a second color, and the third light emitting element ED3 disposed in the third emission area EA3 may emit blue light of a third color. The first to third emission areas EA1, EA2, and EA3 constituting one pixel may respectively include the light emitting elements ED1, ED2, and ED3 emitting lights of different colors to express a white gray scale.

The anode electrodes AE1, AE2, and AE3 may be disposed on the second passivation layer PAS2. Each of the anode electrodes AE1, AE2, and AE3 may be disposed to overlap a corresponding one of the openings OPE1, OPE2, and OPE3 of the bank structure BNS. The anode electrodes AE1, AE2, and AE3 may be electrically connected to the drain electrode DE of the first thin film transistor TFT1 through the first and second connection electrodes CNE1 and CNE2.

The anode electrodes AE1, AE2, and AE3 may be disposed in the plurality of emission areas EA1, EA2, and EA3, respectively. The anode electrodes AE1, AE2, and AE3 may include a first anode electrode AE1 disposed in the first emission area EA1, a second anode electrode AE2 disposed in the second emission area EA2, and a third anode electrode AE3 disposed in the third emission area EA3. The first anode electrode AE1, the second anode electrode AE2, and the third anode electrode AE3 may be disposed to be spaced apart from each other on the second passivation layer PAS2. The anode electrodes AE1, AE2, and AE3 may be disposed in the different emission areas EA1, EA2, and EA3 to constitute the light emitting elements ED1, ED2, and ED3 that emit lights of different colors, respectively.

An inorganic insulating layer ISL may be disposed on the second passivation layer PAS2 and the anode electrodes AE1, AE2, and AE3. The inorganic insulating layer ISL may be disposed on the entire second passivation layer PAS2, and may partially overlap the anode electrodes AE1, AE2, and AE3 to expose a part of the top surface of each of the anode electrodes AE1, AE2, and AE3. The inorganic insulating layer ISL may expose the anode electrodes AE1, AE2, and AE3 at the portions overlapping the openings OPE1, OPE2, and OPE3 of the bank structure BNS, and the light emitting layers EL1, EL2, and EL3 disposed on the anode electrodes AE1, AE2, and AE3 may be directly disposed on the anode electrodes AE1, AE2, and AE3, respectively. The inorganic insulating layer ISL may include an inorganic insulating material. In an embodiment, for example, the inorganic insulating layer ISL may include aluminum oxide, titanium oxide, tantalum oxide, hafnium oxide, zinc oxide, silicon oxide, silicon nitride, and/or silicon oxynitride.

In accordance with an embodiment, the inorganic insulating layer ISL may be disposed on the anode electrodes AE1, AE2, and AE3, and may be spaced apart from the top surfaces of the anode electrodes AE1, AE2, and AE3. The inorganic insulating layer ISL may partially overlap the anode electrodes AE1, AE2, and AE3 without direct contact, and the light emitting layers EL1, EL2, and EL3 of the light emitting elements ED1, ED2, and ED3 may be partially disposed between the inorganic insulating layer ISL and the anode electrodes AE1, AE2, and AE3. In the manufacturing process of the display device 10, a sacrificial layer SFL (see FIG. 14) may be disposed on the anode electrodes AE1, AE2, and AE3 before the inorganic insulating layer ISL is formed. The inorganic insulating layer ISL may be disposed to cover a part of the sacrificial layer, and may be spaced apart from the top surfaces of the anode electrodes AE1, AE2, and AE3 by the removal of the sacrificial layer. The inorganic insulating layer ISL may have a shape protruding from a residual pattern RP toward the inside (or a center) of the openings OPE1, OPE2, and OPE3. Then, in the deposition process of the light emitting layers EL1, EL2, and EL3, the materials forming the light emitting layers EL1, EL2, and EL3 may fill the space between the inorganic insulating layer ISL and the anode electrodes AE1, AE2, and AE3, and the inorganic insulating layer ISL may be partially disposed on the light emitting layers EL1, EL2, and EL3. However, the inorganic insulating layer ISL may be in direct contact with the side surfaces of the anode electrodes AE1, AE2, and AE3.

The display device 10 may include the plurality of bank structures BNS disposed on the thin film transistor layer TFTL or the substrate SUB and including the plurality of openings OPE1, OPE2, and OPE3. The bank structure BNS may have a structure in which bank layers BN1 and BN2 including different materials are sequentially stacked, and may be provided with the plurality of openings OPE1, OPE2, and OPE3 respectively defining or forming the emission areas EA1, EA2, and EA3. The light emitting elements ED1, ED2, and ED3 of the display device 10 may be disposed to overlap the openings OPE1, OPE2, and OPE3 of the bank structure BNS.

The bank structure BNS may include the first bank layer BN1 disposed on the inorganic insulating layer ISL, and the second bank layer BN2 disposed on the first bank layer BN1.

In accordance with an embodiment, as shown in FIG. 7, the first bank layer BN1 and the second bank layer BN2 may include different metal materials from each other, and the bank structure BNS may include a tip TIP in which the second bank layer BN2 protrudes from the first bank layer BN1 toward a center of the openings OPE1, OPE2, and OPE3. In the bank structure BNS, the lateral side of the first bank layer BN1 may have a shape recessed inward from the lateral side of the second bank layer BN2. In the bank structure BNS, the first bank layer BN1 may be thicker than the second bank layer BN2, and the second bank layer BN2 may be relatively thinner so that the tip TIP may be formed in the manufacturing process. Since the second bank layer BN2 has a shape protruding toward the openings OPE1, OPE2, and OPE3 more than the first bank layer BN1, an undercut may be formed under the tip TIP of the second bank layer BN2 on the inner sidewalls defining the openings OPE1, OPE2, and OPE3 of the bank structure BNS.

The sidewall shape of the bank structure BNS may be a structure formed by a difference in etching rates in an etching process due to different materials of the first bank layer BN1 and the second bank layer BN2. In accordance with an embodiment, the second bank layer BN2 may include a material having an etching rate lower than that of the first bank layer BN1, and the first bank layer BN1 may be further etched in the process of forming the openings OPE1, OPE2, and OPE3 of the bank structure BNS to form the undercut under the tip TIP of the second bank layer BN2. In an embodiment, the first bank layer BN1 may include a metal material having high electrical conductivity, and the second bank layer BN2 may include a metal material having low reflectivity. In an embodiment, for example, the first bank layer BN1 may include aluminum (Al), and the second bank layer BN2 may include titanium (Ti). The bank structure BNS may have a structure in which Al/Ti layers are stacked on the inorganic insulating layer ISL, and the tip TIP may be formed in the Ti layer of the second bank layer BN2.

The bank structure BNS may include the openings OPE1, OPE2, and OPE3 respectively forming the emission areas EA1, EA2, and EA3, and the light blocking layer BM may be disposed thereon. The uppermost layer of the bank structure BNS may include a material having low reflectivity to reduce reflection of external light. Further, in the bank structure BNS, the first bank layer BN1 may be electrically connected to the cathode electrodes CE1, CE2, and CE3 of the different light emitting elements ED1, ED2, and ED3. In the light emitting elements ED1, ED2, and ED3 disposed in the different emission areas EA1, EA2, and EA3, the cathode electrodes CE1, CE2, and CE3 are not directly connected, but may be electrically connected through the first bank layer BN1.

In the manufacturing process of the display device 10, a mask process is typically used to form the pixel defining layer forming the emission areas EA1, EA2, and EA3 using an organic material, or to form the light emitting layers EL1, EL2, and EL3 of the light emitting elements ED1, ED2 and ED3 in the respective emission areas EA1, EA2, and EA3. In order to perform the mask process, the display device 10 may desired to have a structure for mounting a mask, or an unnecessarily large area of the non-display area NDA may be used to control variation according to the mask process. If such a mask process is minimized, an unnecessary component, e.g., the structure for mounting a mask, may be omitted in the display device 10, and the area of the non-display area NDA for controlling variation may be minimized.

The display device 10 according to an embodiment includes the bank structure BNS forming the emission areas EA1, EA2, and EA3, and this may be formed by a deposition and etching process instead of the mask process. Further, the bank structure BNS includes the first bank layer BN1 and the second bank layer BN2 including different metal materials and have a structure including the tip TIP on the inner sidewalls defining the openings OPE1, OPE2, and OPE3, so that it is possible to separately form different layers in the different emission areas EA1, EA2, and EA3 even by a deposition process. In an embodiment, for example, even when the light emitting layers EL1, EL2, and EL3 of the light emitting elements ED1, ED2, and ED3 and the cathode electrodes CE1, CE2, and CE3 are formed by a deposition process using no mask, the deposited materials may be disconnected without being connected between the openings OPE1, OPE2, and OPE3 by the tip TIP of the second bank layer BN2 formed on the inner sidewalls defining the openings OPE1, OPE2, and OPE3. By a process of forming a material for forming a specific layer on the entire surface of the display device 10 and then removing the layer formed in an undesired region by etching, it is possible to individually form different layers in the different emission areas EA1, EA2, and EA3. In the display device 10, the different light emitting elements ED1, ED2, and ED3 may be formed in the different emission areas EA1, EA2, and EA3 by the deposition and etching process without using the mask process, and an unnecessary component in the display device 10 may be omitted to minimize the area of the non-display area NDA.

The first encapsulation layer TFE1 of the thin film encapsulation layer TFEL may be disposed on the cathode electrodes CE1, CE2, and CE3 of the light emitting elements ED1, ED2, and ED3. The first encapsulation layer TFE1 may include a first inorganic layer TL1 disposed on the first light emitting element ED1, a second inorganic layer TL2 disposed on the second light emitting element ED2, and a third inorganic layer TL3 disposed on the third light emitting element ED3. The first to third inorganic layers TL1, TL2, and TL3 may be formed on the entire bank structure BNS, and may be disposed to cover only the light emitting elements ED1, ED2, and ED3, organic patterns ELP1, ELP2, and ELP3 to be described later, and the electrode patterns CEP1, CEP2, and CEP3 in the respective emission areas EA1, EA2, and EA3 without being disposed between the emission areas EA1, EA2, and EA3. The shape of the inorganic layers TL1, TL2, and TL3 may be formed by forming the inorganic layers TL1, TL2, and TL3 to completely cover the bank structure BNS and then partially patterning the inorganic layers TL1, TL2, and TL3.

The display device 10 may include patterns that are traces of the deposition process and the shape of the bank structure BNS. The patterns may be formed simultaneously with the light emitting layers EL1, EL2, and EL3 of the light emitting elements ED1, ED2, and ED3 and the cathode electrodes CE1, CE2, and CE3, and may remain on the bank structure BNS. Hereinafter, the structures of the light emitting layers EL1, EL2, and EL3 and the cathode electrodes CE1, CE2, and CE3, and the patterns will be described.

The light emitting layers EL1, EL2, and EL3 may be disposed on the anode electrodes AE1, AE2, and AE3, respectively. The light emitting layers EL1, EL2, and EL3 may be organic light emitting layers including or made of an organic material, and may be formed on the anode electrodes AE1, AE2, and AE3, respectively, by the deposition process. In the light emitting layers EL1, EL2, and EL3, when the first thin film transistor TFT1 applies a predetermined voltage to the anode electrodes AE1, AE2, and AE3 of the light emitting elements ED1, ED2, and ED3, and the cathode electrodes CE1, CE2, and CE3 of the light emitting elements ED1, ED2, and ED3 receive a common voltage or a cathode voltage, holes and electrons may move to the light emitting layers EL1, EL2, and EL3 through a hole transporting layer and an electron transporting layer, respectively, and the holes and the electrons may be combined with each other in the light emitting layers EL1, EL2, and EL3 to emit light.

The light emitting layers EL1, EL2, and EL3 may include the first light emitting layer EL1, the second light emitting layer EL2, and the third light emitting layer EL3 disposed in the different emission areas EA1, EA2, and EA3, respectively. The first light emitting layer EL1 may be disposed on the first anode electrode AE1 in the first emission area EA1, the second light emitting layer EL2 may be disposed on the second anode electrode AE2 in the second emission area EA2, and the third light emitting layer EL3 may be disposed on the third anode electrode AE3 in the third emission area EA3. The first to third light emitting layers EL1, EL2, and EL3 may be the light emitting layers of the first to third light emitting elements ED1, ED2 and ED3, respectively. The first light emitting layer EL1 may be the light emitting layer that emits red light of the first color, the second light emitting layer EL2 may be the light emitting layer that emits green light of the second color, and the third light emitting layer EL3 may be the light emitting layer that emits blue light of the third color.

In accordance with an embodiment, the light emitting layers EL1, EL2, and EL3 of the light emitting elements ED1, ED2, and ED3 may be partially disposed between the anode electrodes AE1, AE2, and AE3 and the inorganic insulating layer ISL. The inorganic insulating layer ISL may be disposed on the anode electrodes AE1, AE2, and AE3, but may be spaced apart from the top surfaces of the anode electrodes AE1, AE2, and AE3. The deposition process of the light emitting layers EL1, EL2, and EL3 may be performed such that the material of the light emitting layer is deposited in an inclined direction rather than in a direction perpendicular to the top surface of the substrate SUB. Accordingly, the light emitting layers EL1, EL2, and EL3 may be respectively disposed on the top surfaces of the anode electrodes AE1, AE2, and AE3 exposed through the openings OPE1, OPE2, and OPE3 of the bank structure BNS to fill the space between the anode electrodes AE1, AE2, and AE3 and the inorganic insulating layer ISL.

As described above, in an embodiment of the manufacturing process of the display device 10, the sacrificial layer SFL (see FIG. 14) may be disposed between the inorganic insulating layer ISL and the anode electrodes AE1, AE2, and AE3, and the light emitting layers EL1, EL2, and EL3 may be disposed in the region where the sacrificial layer SFL is partially removed. Accordingly, the bottom surface of the inorganic insulating layer ISL may be spaced apart from the anode electrodes AE1, AE2, and AE3. However, the sacrificial layer SFL may remain as a partial residual pattern RP in the region between the inorganic insulating layer ISL and the anode electrodes AE1, AE2, and AE3. The region between the inorganic insulating layer ISL and the anode electrodes AE1, AE2, and AE3 may be filled with the partial residual pattern RP and the light emitting layers EL1, EL2, and EL3.

The display device 10 according to an embodiment may include the plurality of organic patterns ELP1, ELP2, and ELP3 including a same material as those of the light emitting layers EL1, EL2, and EL3 and disposed on the bank structure BNS. Since the light emitting layers EL1, EL2, and EL3 are formed by a process of depositing a material on the entire surface of the display device 10, the materials forming the light emitting layers EL1, EL2, and EL3 may also be deposited on the bank structure BNS in addition to the openings OPE1, OPE2, and OPE3 of the bank structure BNS.

In an embodiment, for example, the display device 10 may include the organic patterns ELP1, ELP2, and ELP3 disposed on the bank structure BNS. The organic patterns ELP1, ELP2, and ELP3 may include the first organic pattern ELP1, the second organic pattern ELP2, and the third organic pattern ELP3 disposed on the second bank layer BN2 of the bank structure BNS.

The first organic pattern ELP1 may include a same material as that of the first light emitting layer EL1 of the first light emitting element ED1. The second organic pattern ELP2 may include the same material as that of the second light emitting layer EL2 of the second light emitting element ED2, and the third organic pattern ELP3 may include the same material as that of the third light emitting layer EL3 of the third light emitting element ED3. The organic patterns ELP1, ELP2, and ELP3 may be formed in a same process as the process of forming the light emitting layers EL1, EL2, and EL3 including the same material as those of the organic patterns ELP1, ELP2, and ELP3.

The first organic pattern ELP1, the second organic pattern ELP2, and the third organic pattern ELP3 may be directly disposed on the second bank layer BN2 of the bank structure BNS. The organic patterns ELP1, ELP2, and ELP3 may be formed in a same process as the process of forming the light emitting layers EL1, EL2, and EL3 including a same material as those of the organic patterns ELP1, ELP2, and ELP3, and may be disposed near the emission areas EA1, EA2, and EA3 in which the light emitting layers EL1, EL2 and EL3 are disposed, respectively. In an embodiment, for example, the first organic pattern ELP1 may be disposed on the second bank layer BN2 while surrounding the first opening OPEL near the first opening OPE1 or the first emission area EA1. The second organic pattern ELP2 may be disposed on the second bank layer BN2 while surrounding the second opening OPE2 near the second opening OPE2 or the second emission area EA2, and the third organic pattern ELP3 may be disposed on the second bank layer BN2 while surrounding the third opening OPE3 near the third opening OPE3 or the third emission area EA3.

The organic patterns ELP1, ELP2, and ELP3 may be traces formed because they are disconnected without being connected with the light emitting layers EL1, EL2, and EL3 due to the tip TIP of the bank structure BNS. The light emitting layers EL1, EL2, and EL3 may be formed in the openings OPE1, OPE2, and OPE3, respectively, and the organic patterns ELP1, ELP2, and ELP3 and the light emitting layers EL1, EL2, and EL3 may be disconnected by the tip TIP formed on the sidewalls defining the openings OPE1, OPE2, and OPE3. Since the light emitting layers EL1, EL2, and EL3 are formed by the deposition process using no mask, the materials of the light emitting layers EL1, EL2, and EL3 may be formed on the entire bank structure BNS. The organic patterns ELP1, ELP2, and ELP3 may be formed by patterning them near the emission areas EA1, EA2, and EA3 or the openings OPE1, OPE2, and OPE3.

The cathode electrodes CE1, CE2, and CE3 may be disposed on the light emitting layers EL1, EL2, and EL3, respectively. The cathode electrodes CE1, CE2, and CE3 may include a transparent conductive material, so that the light generated in the light emitting layers EL1, EL2, and EL3 may be emitted. The cathode electrodes CE1, CE2, and CE3 may receive a common voltage or a low potential voltage. When the anode electrodes AE1. AE2, and AE3 receive the voltage corresponding to a data voltage and the cathode electrodes CE1, CE2, and CE3 receive the low potential voltage, a potential difference is formed between the anode electrodes AE1, AE2, and AE3 and the cathode electrodes CE1, CE2, and CE3, so that the light emitting layers EL1, ED2, and ED3 may emit light.

The cathode electrodes CE1, CE2, and CE3 may include the first cathode electrode CE1, the second cathode electrode CE2, and the third cathode electrode CE3 disposed in the different emission areas EA1, EA2, and EA3. The first cathode electrode CE1 may be disposed on the first light emitting layer EL1 in the first emission area EA1, the second cathode electrode CE2 may be disposed on the second light emitting layer EL2 in the second emission area EA2, and the third cathode electrode CE3 may be disposed on the third light emitting layer EL3 in the third emission area EA3.

In accordance with an embodiment, the cathode electrodes CE1, CE2, and CE3 of the light emitting elements ED1, ED2, and ED3 may be partially disposed on the side surface of the first bank layer BN1 of the bank structure BNS. Similarly to the light emitting layers EL1, EL2, and EL3, the cathode electrodes CE1, CE2, and CE3 may also be formed by a deposition process. The deposition process of the cathode electrodes CE1, CE2, and CE3 may be performed such that the electrode material is deposited in an inclined direction rather than a direction perpendicular to the top surface of the substrate SUB. Accordingly, the cathode electrodes CE1, CE2, and CE3 may be disposed on the side surface of the first bank layer BN1 under the tip TIP of the second bank layer BN2 of the bank structure BNS. The cathode electrodes CE1, CE2, and CE3 may be in direct contact with the side surface of the first bank layer BN1. The cathode electrodes CE1, CE2, and CE3 of the different light emitting elements ED1, ED2, and ED3 may be in direct contact with the first bank layer BN1 of the bank structure BNS, and the cathode electrodes CE1, CE2, and CE3 may be electrically connected to each other. Unlike the anode electrodes AE1, AE2, and AE3, the cathode electrodes CE1, CE2, and CE3 may be implemented in the form of an electrode that is electrically common to all pixels without being divided for a plurality of pixels.

In accordance with an embodiment, the contact area between the cathode electrodes CE1, CE2, and CE3 and the side surface of the first bank layer BN1 may be greater than the contact area between the light emitting layers EL1, EL2, and EL3 and the side surface of the first bank layer BN1. The cathode electrodes CE1, CE2, and CE3 and the light emitting layers EL1, EL2, and EL3 are formed or provided in a way such that the materials thereof are deposited in an inclined direction rather than in a direction perpendicular to the top surface of the substrate SUB, and the area disposed on the side surface of the first bank layer BN1 may vary depending on the inclined angle. In an embodiment, the deposition process of the cathode electrodes CE1, CE2, and CE3 may be performed in a more inclined direction than that in the deposition process of the light emitting layers EL1, EL2, and EL3. The cathode electrodes CE1, CE2, and CE3 may be disposed in larger areas on the sidewalls defining the openings OPE1, OPE2, and OPE3 compared to the light emitting layers EL1, EL2, and EL3, or may be located at higher positions on the sidewalls defining the openings OPEL, OPE2, and OPE3 compared to the light emitting layers EL1, EL2, and EL3. Since the cathode electrodes CE1, CE2, and CE3 of the different light emitting elements ED1, ED2, and ED3 are electrically connected through the first bank layer BN1, the cathode electrodes CE1, CE2, and CE3 may be allowed to contact with the first bank layer BN1 in larger areas.

The display device 10 according to an embodiment may include the plurality of electrode patterns CEP1, CPE2, and CEP3 including a same material as those of the cathode electrodes CE1, CE2, and CE3 and disposed on the bank structure BNS. Since the cathode electrodes CE1, CE2, and CE3 are formed by a process of depositing a material on the entire surface of the display device 10, the materials forming the cathode electrodes CE1, CE2, and CE3 may also be deposited on the bank structure BNS in addition to the openings OPE1, OPE2, and OPE3 of the bank structure BNS.

The display device 10 may include the electrode patterns CEP1, CPE2, and CEP3 disposed above the bank structure BNS. The electrode patterns CEP1, CPE2, and CEP3 may include the first electrode pattern CEP1, the second electrode pattern CEP2, and the third electrode pattern CEP3 disposed on the second bank layer BN2 of the bank structure BNS.

In an embodiment, for example, the first electrode pattern CEP1, the second electrode pattern CEP2, and the third electrode pattern CEP3 may be directly disposed on the first organic pattern ELP1, the second organic pattern ELP2, and the third organic pattern ELP3, respectively. The arrangement relationship of the electrode patterns CEP1, CPE2, and CEP3 and the organic patterns ELP1, ELP2, and ELP3 may be the same as the arrangement relationship of the light emitting layers EL1, EL2, and EL3 of the light emitting elements ED1, ED2, and ED3 and the cathode electrodes CE1, CE2, and CE3. The electrode patterns CEP1, CPE2, and CEP3 may be traces formed because the deposited material is disconnected without being connected with the cathode electrodes CE1, CE2, and CE3 due to the tip TIP of the bank structure BNS. In the display device 10, the cathode electrodes CE1, CE2, and CE3 may be individually formed in different areas even in a deposition process using no mask due to the tip TIP of the bank structure BNS.

A capping layer CPL may be disposed on the cathode electrodes CE1, CE2, and CE3. The capping layer CPL may include an inorganic insulating material to cover the patterns disposed on the bank structure BNS and the light emitting elements ED1, ED2, and ED3. The capping layer CPL may prevent the light emitting elements ED1, ED2, and ED3 from being damaged by external air and prevent the patterns disposed on the bank structure BNS from being peeled off during the manufacturing process of the display device 10. In an embodiment, the capping layer CPL may include aluminum oxide, titanium oxide, tantalum oxide, hafnium oxide, zinc oxide, silicon oxide, silicon nitride, and/or silicon oxynitride.

The display device 10 may include a capping pattern CLP disposed on the bank structure BNS. The capping pattern CLP may be directly disposed on the first electrode pattern CEP1, the second electrode pattern CEP2, and the third electrode pattern CEP3 disposed on the second bank layer BN2 of the bank structure BNS. The arrangement relationship of the capping pattern CLP and the electrode patterns CEP1, CEP2, and CEP3 may be the same as the arrangement relationship of the cathode electrodes CE1, CE2, and CE3 of the light emitting elements ED1, ED2, and ED3 and the capping layer CPL. The capping pattern CLP may be a trace formed because the deposited material is disconnected without being connected with the capping layer CPL due to the tip TIP of the bank structure BNS.

The plurality of organic patterns ELP1, ELP2, and ELP3, the electrode patterns CEP1, CPE2, and CEP3, and the capping pattern CLP may be disposed on the bank structure BNS, and may be disposed to surround the peripheries of the emission areas EA1, EA2, and EA3 or the openings OPE1, OPE2, and OPE3, respectively. The stacked structure of the organic patterns ELP1, ELP2, and ELP3, the electrode patterns CEP1, CPE2, and CEP3, and the capping pattern CLP disposed around the emission areas EA1, EA2, and EA3 may be partially etched in the manufacturing process of the display device 10, so that the pattern shape may be changed. Accordingly, a part of the top surface of the second bank layer BN2 of the bank structure BNS may not be covered by the organic patterns ELP1, ELP2, and ELP3, the electrode patterns CEP1, CPE2, and CEP3, and the capping pattern CLP.

The thin film encapsulation layer TFEL may be disposed on the light emitting elements ED1, ED2, and ED3 and the bank structure BNS, and may cover the plurality of light emitting elements ED1, ED2, and ED3 and the bank structure BNS. The thin film encapsulation layer TFEL may include at least one inorganic layer to prevent oxygen or moisture from permeating into the light emitting element layer EML. The thin film encapsulation layer TFEL may include at least one organic layer to protect the light emitting element layer EML from foreign substances such as dust.

In an embodiment, the thin film encapsulation layer TFEL may include a first encapsulation layer TFE1, a second encapsulation layer TFE2, and a third encapsulation layer TFE3 that are sequentially stacked. The first encapsulation layer TFEL and the third encapsulation layer TFE3 may be inorganic encapsulation layers, and the second encapsulation layer TFE2 disposed between the first encapsulation layer TFE1 and the third encapsulation layer TFE3 may be an organic encapsulation layer.

Each of the first encapsulation layer TFE1 and the third encapsulation layer TFE3 may include at least one selected from inorganic insulating materials. The inorganic insulating materials may include aluminum oxide, titanium oxide, tantalum oxide, hafnium oxide, zinc oxide, silicon oxide, silicon nitride, and/or silicon oxynitride.

The second encapsulation layer TFE2 may include a polymer-based material. Examples of the polymer-based material may include acrylic resin, epoxy resin, polyimide, polyethylene and the like. In an embodiment, for example, the second encapsulation layer TFE2 may include an acrylic resin, for example, polymethyl methacry late, polyacrylic acid, or the like. The second encapsulation layer TFE2 may be formed by curing a monomer or applying a polymer.

The first encapsulation layer TFE1 may be disposed on the light emitting elements ED1, ED2, and ED3, the plurality of patterns, and the bank structure BNS. The first encapsulation layer TFE1 may include the first inorganic layer TL1, the second inorganic layer TL2, and the third inorganic layer TL3 disposed to correspond to the different emission areas EA1, EA2, and EA3, respectively.

The first inorganic layer TL1, the second inorganic layer TL2, and the third inorganic layer TL3 may include an inorganic insulating material to cover the light emitting elements ED1, ED2, and ED3, respectively. The first inorganic layer TL1, the second inorganic layer TL2, and the third inorganic layer TL3 may prevent the light emitting elements ED1, ED2, and ED3 from being damaged by external air, and may prevent the patterns disposed on the bank structure BNS from being peeled off during the manufacturing process of the display device 10. In an embodiment, the first inorganic layer TL1, the second inorganic layer TL2, and the third inorganic layer TL3 may include aluminum oxide, titanium oxide, tantalum oxide, hafnium oxide, zinc oxide, silicon oxide, silicon nitride, and/or silicon oxynitride.

The first inorganic layer TL1, the second inorganic layer TL2, and the third inorganic layer TL3 may be disposed to cover the organic patterns ELP1, ELP2, and ELP3, the electrode patterns CEP1, CPE2, and CEP3, and the capping pattern CLP. In an embodiment where the first inorganic layer TL1, the second inorganic layer TL2, and the third inorganic layer TL3 are formed by a chemical vapor deposition (CVD) method, the first inorganic layer TL1, the second inorganic layer TL2, and the third inorganic layer TL3 may be formed to have a uniform thickness along the stepped portion of the deposited layers. In an embodiment, for example, the first inorganic layer TL1, the second inorganic layer TL2, and the third inorganic layer TL3 may form thin films even under the undercut by the tip TIP of the bank structure BNS.

The first inorganic layer TL1 may be disposed on the first light emitting element ED1 and the first electrode pattern CEP1. The first inorganic layer TL1 may be disposed to cover the first light emitting element ED1 and the first opening OPEL along the inner sidewalls thereof, and may also be disposed to cover the first organic pattern ELP1, the first electrode pattern CEP1, and the capping pattern CLP.

However, the first inorganic layer TL1 may not overlap the second opening OPE2 and the third opening OPE3, and may be disposed only on the first opening OPEL and the bank structure BNS adjacent thereto.

The second inorganic layer TL2 may be disposed on the second light emitting element ED2 and the second electrode pattern CEP2. The second inorganic layer TL2 may be disposed to cover the second light emitting element ED2 and the second opening OPE2 along the inner sidewalls thereof, and may also be disposed to cover the second organic pattern ELP2, the second electrode pattern CEP2, and the capping pattern CLP. However, the second inorganic layer TL2 may not overlap the first opening OPEL and the third opening OPE3, and may be disposed only on the second opening OPE2 and the bank structure BNS adjacent thereto.

The third inorganic layer TL3 may be disposed on the third light emitting element ED3 and the third electrode pattern CEP3. The third inorganic layer TL3 may be disposed along the inner sidewalls defining the third light emitting element ED3 and the third opening OPE3 to cover them, and may also be disposed to cover the third organic pattern ELP3, the third electrode pattern CEP3, and the capping pattern CLP. However, the third inorganic layer TL3 may not overlap the first opening OPEL and the second opening OPE2, and may be disposed only on the third opening OPE3 and the bank structure BNS adjacent thereto.

The first inorganic layer TL1 may be formed after the first cathode electrode CE1 is formed, the second inorganic layer TL2 may be formed after the second cathode electrode CE2 is formed, and the third inorganic layer TL3 may be formed after the third cathode electrode CE3 is formed. Accordingly, the first to third inorganic layers TL1, TL2, and TL3 may be disposed to cover the different electrode patterns CEP1, CPE2, and CEP3 and the organic patterns ELP1, ELP2, and ELP3, respectively. In a plan view (or when viewed in the third direction DR3), the first inorganic layer TL1, the second inorganic layer TL2, and the third inorganic layer TL3 may have larger areas than those of the openings OPE1, OPE2, and OPE3 of the bank structure BNS, respectively. The first inorganic layer TL1, the second inorganic layer TL2, and the third inorganic layer TL3 may be spaced apart from each other on the bank structure BNS. Accordingly, a part of the second bank layer BN2 of the bank structure BNS may not overlap the inorganic layers TL1, TL2, and TL3, and a part of the top surface thereof may be exposed without being covered by the inorganic layers TL1, TL2, and TL3. A part of the second bank layer BN2 may be in direct contact with the second encapsulation layer TFE2 of the thin film encapsulation layer TFEL which will be described later.

The touch sensing layer TSU may be disposed on the encapsulation layer TFEL. The touch sensing layer TSU may include a first touch insulating layer SIL1, a second touch insulating layer SIL2, a touch electrode TEL, and a third touch insulating layer SIL3.

The first touch insulating layer SIL1 may be disposed on the encapsulation layer TFEL. The first touch insulating layer SIL1 may have an insulating and optical function. The first touch insulating layer SIL1 may include at least one inorganic layer. Alternatively, the first touch insulating layer SIL1 may be omitted.

The second touch insulating layer SIL2 may cover the first touch insulating layer SIL1. Although not shown in the drawing, a touch electrode of another layer may be further disposed on the first touch insulating layer SIL1, and the second touch insulating layer SIL2 may cover the touch electrode TEL. The second touch insulating layer SIL2 may have an insulating and optical function. In an embodiment, for example, the second touch insulating layer SIL2 may be an inorganic layer including at least one of a silicon nitride layer, a silicon oxynitride layer, a silicon oxide layer, a titanium oxide layer, or an aluminum oxide layer.

A part of the touch electrode TEL may be disposed on the second touch insulating layer SIL2. The touch electrode TEL may not overlap the first to third emission areas EA1, EA2, and EA3. The touch electrode TEL may be formed of (or defined by) a single layer including molybdenum (Mo), titanium (Ti), copper (Cu), aluminum (Al), or indium tin oxide (ITO), or may be formed to have a stacked structure (Ti/Al/Ti) of aluminum and titanium, a stacked structure (ITO/Al/ITO) of aluminum and ITO, an Ag—Pd—Cu (APC) alloy, or a stacked structure (ITO/APC/ITO) of APC alloy and ITO.

The third touch insulating layer SIL3 may cover the touch electrode TEL and the second touch insulating layer SIL2. The third touch insulating layer SIL3 may have an insulating and optical function. The third touch insulating layer SIL3 may include or be made of the material exemplified in association with the second touch insulating layer SIL2.

The light blocking layer BM may be disposed on the touch sensing layer TSU. The light blocking layer BM may include the plurality of opening holes OPT1, OPT2, and OPT3 disposed to overlap the emission areas EA1, EA2, and EA3. In an embodiment, for example, the first opening hole OPT1 may be disposed to overlap the first emission area EA1. The second opening hole OPT2 may be disposed to overlap the second emission area EA2, and the third opening hole OPT3 may be disposed to overlap the third emission area EA3. The areas or sizes of the opening holes OPT1, OPT2, and OPT3 may be larger than the areas or sizes of the emission areas EA1, EA2, and EA3 defined by the bank structure BNS, respectively. The opening holes OPT1, OPT2, and OPT3 of the light blocking layer BM are formed to be larger than the emission areas EA1, EA2, and EA3, so that the light emitted from the emission areas EA1, EA2, and EA3 may be visually recognized by the user not only from the front surface but also from the side surface of the display device 10.

The light blocking layer BM may include a light absorbing material. In an embodiment, for example, the light blocking layer BM may include an inorganic black pigment or an organic black pigment. The inorganic black pigment may be carbon black, and the organic black pigment may include at least one of lactam black, perylene black, or aniline black, but they are not limited thereto. The light blocking layer BM may prevent visible light infiltration and color mixture between the first to third emission areas EA1, EA2, and EA3, which leads to the improvement of color reproducibility of the display device 10.

The display device 10 may include the plurality of color filters CF1, CF2, and CF3 disposed on the emission areas EA1, EA2, and EA3. The plurality of color filters CF1, CF2, and CF3 may be disposed to correspond to the emission areas EA1, EA2, and EA3, respectively. In an embodiment, for example, the color filters CF1, CF2, and CF3 may be disposed on the light blocking layer BM including the plurality of opening holes OPT1, OPT2, and OPT3 disposed to correspond to the emission areas EA1, EA2, and EA3, respectively. The holes of the light blocking layer may be formed to overlap the emission areas EA1, EA2, and EA3, or the openings of the bank structures BNS, and may define a light exit area from which the light emitted from the emission areas EA1, EA2, and EA3 is emitted. The color filters CF1, CF2, and CF3 may have areas larger than those of the holes of the light blocking layer BM, and the color filters CF1, CF2, and CF3 may completely cover the light exit area formed by the holes.

The color filters CF1, CF2, and CF3 may include a first color filter CF1, a second color filter CF2, and a third color filter CF3 disposed to correspond to the different emission areas EA1, EA2, and EA3, respectively. The color filters CF1, CF2, and CF3 may include a colorant such as a dye or a pigment that absorbs light in a wavelength band other than light in a specific wavelength band, and may be disposed to correspond to the color of the light emitted from the emission areas EA1, EA2, and EA3. In an embodiment, for example, the first color filter CF1 may be a red color filter that is disposed to overlap the first emission area EA1 and transmits only the first light of the red color. The second color filter CF2 may be a green color filter that is disposed to overlap the second emission area EA2 and transmits only the second light of the green color, and the third color filter CF3 may be a blue color filter that is disposed to overlap the third emission area EA3 and transmits only the third light of the blue color.

The plurality of color filters CF1, CF2, and CF3 may be spaced apart from other adjacent color filters CF1, CF2, and CF3 on the light blocking layer BM. The color filters CF1, CF2, and CF3 may have areas larger than those of the opening holes OPT1, OPT2, and OPT3 of the light blocking layer BM, respectively, while covering the holes, and may have areas enough to be spaced apart from other color filters CF1, CF2, and CF3 on the light blocking layer BM. However, the disclosure is not limited thereto. The plurality of color filters CF1, CF2, and CF3 may be disposed to partially overlap other adjacent color filters CF1, CF2, and CF3. Portions of the color filters CF1, CF2, and CF3 that do not overlap the emission areas EA1, EA2, and EA3 may overlap each other on the light blocking layer BM to be described later. In an embodiment of the display device 10, the color filters CF1. CF2, and CF3 are disposed to overlap each other, so that the intensity of the reflected light by external light may be reduced. In such an embodiment, the color of the reflected light by the external light may be controlled by adjusting the disposition, shape, and area of the color filters CF1, CF2, and CF3 in a plan view.

The color filters CF1, CF2, and CF3 of the color filter layer CFL may be disposed on the light blocking layer BM. The different color filters CF1, CF2, and CF3 may be disposed to correspond to the different emission areas EA1, EA2, and EA3 or openings OPE1, OPE2, and OPE3, and the opening holes OPT1, OPT2, and OPT3 of the light blocking layer BM, respectively. In an embodiment, for example, the first color filter CF1 may be disposed to correspond to the first emission area EA1, the second color filter CF2 may be disposed to correspond to the second emission area EA2, and the third color filter CF3 may be disposed to correspond to the third emission area EA3. The first color filter CF1 may be disposed in the first opening hole OPT1 of the light blocking layer BM, the second color filter CF2 may be disposed in the second opening hole OPT2 of the light blocking layer BM, and the third color filter CF3 may be disposed in the third opening hole OPT3 of the light blocking layer BM. Each of the color filters CF1, CF2, and CF3 may be disposed to have a larger area in a plan view than the opening holes OPT1, OPT2, and OPT3 of the light blocking layer BM, and some may be disposed directly on the light blocking layer BM.

An overcoat layer OC may be disposed on the color filters CF1, CF2, and CF3 to planarize the top ends of the color filters CF1, CF2, and CF3. The overcoat layer OC may be a colorless light transmissive layer that does not have a color in a visible light band. In an embodiment, for example, the overcoat layer OC may include a colorless light transmissive organic material such as an acrylic resin.

In the display device 10, the plurality of light emitting elements ED1, ED2, and ED3 disposed in the display area DA may be disposed in the emission areas EA1, EA2, and EA3 formed by the bank structures BNS. As described above, the cathode electrodes CE1, CE2, and CE3 of the light emitting elements ED1, ED2, and ED3 may be electrically connected to each other through the first bank layer BN1 of the bank structure BNS. The cathode electrodes CE1, CE2, and CE3 of the light emitting elements ED1, ED2, and ED3 and the first bank layer BN1 may form a common electrode in the display area DA.

Meanwhile, in the display device 10, the bank structure BNS may be disposed beyond the display area DA to the non-display area NDA. The first bank layer BN1 of the bank structure BNS may form a common electrode with the cathode electrodes CE1, CE2, and CE3 of the light emitting elements ED1, ED2, and ED3, be disposed to extend to the non-display area NDA, and be electrically connected to the first power line VL1 disposed in the non-display area NDA. Accordingly, the light emitting elements ED1, ED2, and ED3 may be electrically connected to the first power line VL1 disposed in the non-display area NDA, and may receive a low potential voltage through the first power line VL1. In addition, the light emitting elements ED1, ED2, and ED3 may be electrically connected to the first thin film transistor TFT1 of the thin film transistor layer TFTL, and may receive a power voltage, for example, a high potential voltage through the second power line VL2 disposed in the display area DA. Hereinafter, the structure of the non-display area NDA of the display device 10 will be described.

Figure 8:
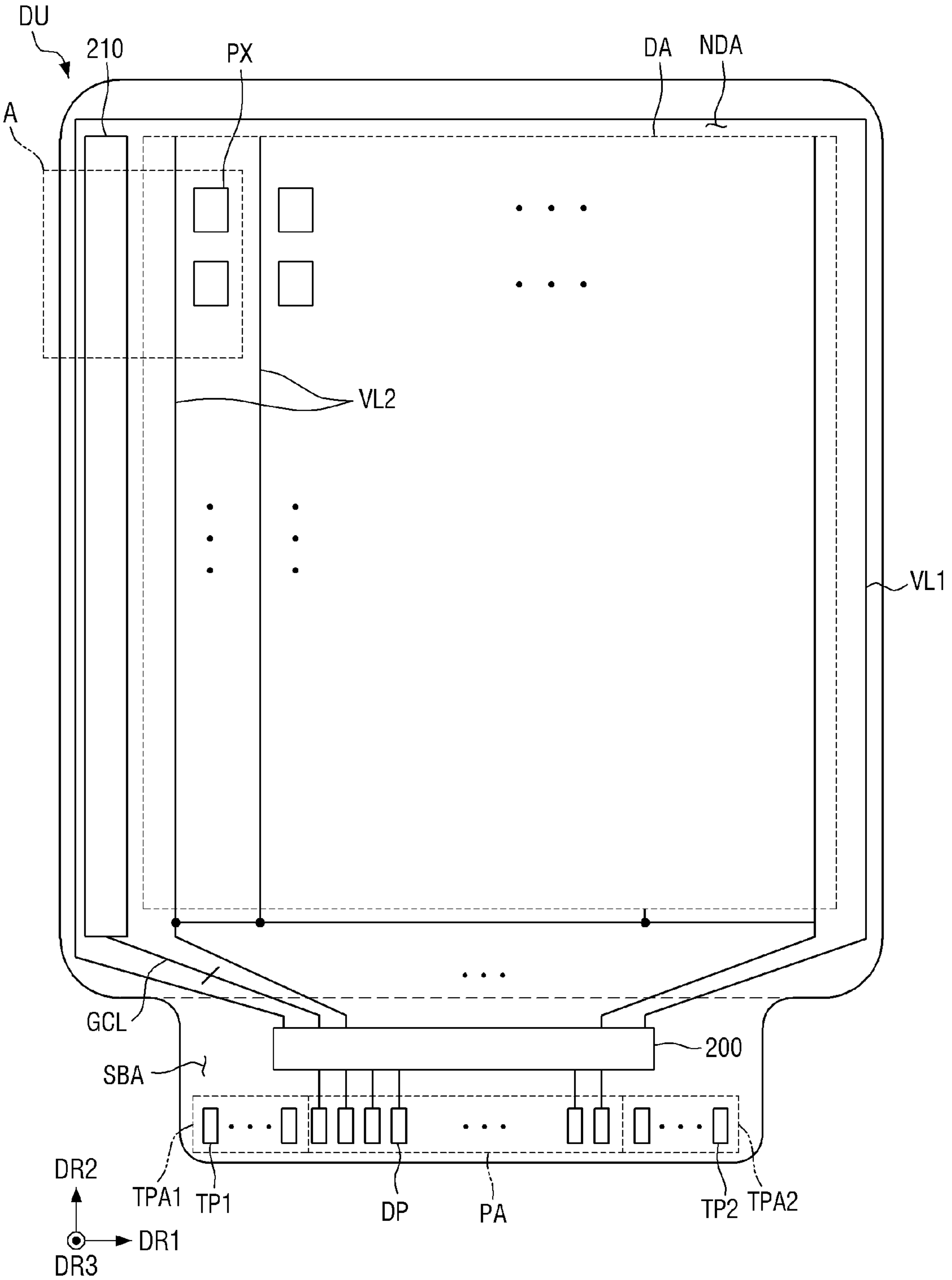
FIG. 8 is a plan view illustrating an arrangement of power lines disposed in a display device according to an embodiment.

FIG. 8 is a plan view illustrating an arrangement of power lines disposed in a display device according to an embodiment.

Referring to FIG. 8, in an embodiment, the display layer DU of the display device 10 may include the display area DA and the non-display area NDA surrounding the display area DA. As described above with reference to FIG. 4, the plurality of pixels PX and a plurality of wires, for example, the second power lines VL2, the gate lines GL, and the data lines DL may be disposed in the display area DA. The display driver 200, the gate driver 210, the plurality of display pad portions DP, and the first power line VL1 may be disposed in the non-display area NDA.

The first power line VL1 may surround the display area DA and may be disposed in the non-display area NDA. The first power line VL1 may be electrically connected to the display driver 200 in the non-display area NDA disposed below the display area DA, and may be disposed to surround the display area DA by including a part extending in the first direction DR1 and the second direction DR2. The first power line VL1 may be electrically connected to the bank structure BNS at the left and right outer portions of the display layer DU. The first power line VL1 may be electrically connected to the plurality of pixels PX of the display area DA through the bank structure BNS.

The second power line VL2 may extend in the second direction DR2 and be disposed in the display area DA. The second power line VL2 may be electrically connected to the display driver 200 in the non-display area NDA disposed below the display area DA. The display device 10 may include the plurality of second power lines VL2, and the plurality of second power lines VL2 may be spaced apart from each other in the first direction DR1 in the display area DA. The second power line VL2 may be electrically connected to the first thin film transistor TFT1 in the display area DA. The second power line VL2 may be electrically connected to the plurality of pixels PX of the display area DA through the first thin film transistor TFT1.

In an embodiment, for example, the second power line VL2 may be electrically connected to the anode electrodes AE1, AE2, and AE3 of the plurality of light emitting elements ED1, ED2, and ED3 disposed in the display area DA through the first thin film transistor TFT1. The light emitting elements ED1, ED2, and ED3 may receive a high potential voltage through the second power line VL2.

The first power line VL1 may be electrically connected to the first bank layer BN1 of the bank structure BNS, and may be electrically connected to the light emitting elements ED1, ED2, and ED3 through the first bank layer BN1. The cathode electrodes CE1, CE2, and CE3 of the light emitting elements ED1, ED2, and ED3 may form or collectively define a common electrode with the first bank layer BN1 of the bank structure BNS, and may receive a low potential voltage through the first power line VL1. Although not illustrated in FIG. 8, the bank structure BNS may include the plurality of openings OPE1, OPE2, and OPE3 disposed in the display area DA, and may form the emission areas EA1, EA2, and EA3 in which the light emitting elements ED1, ED2, and ED3 are disposed. In addition, the bank structure BNS may be disposed to extend beyond the display area DA to the non-display area NDA, overlap the gate driver 210 in the non-display area NDA, and be electrically connected to the first power line VL1.

Figure 9:
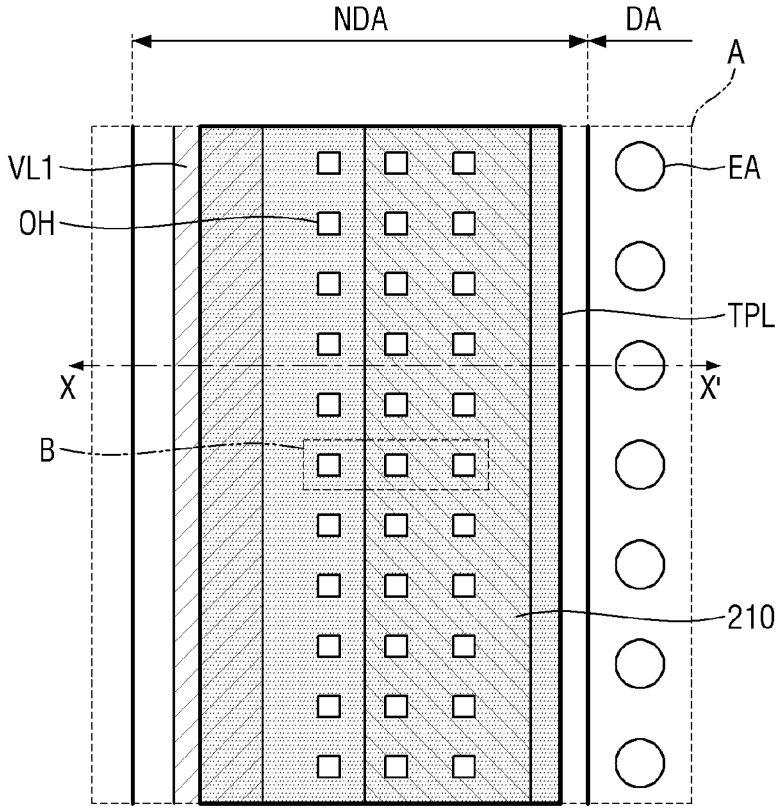
FIG. 9 is an enlarged view schematically showing portion A of FIG. 8.
Figure 10:
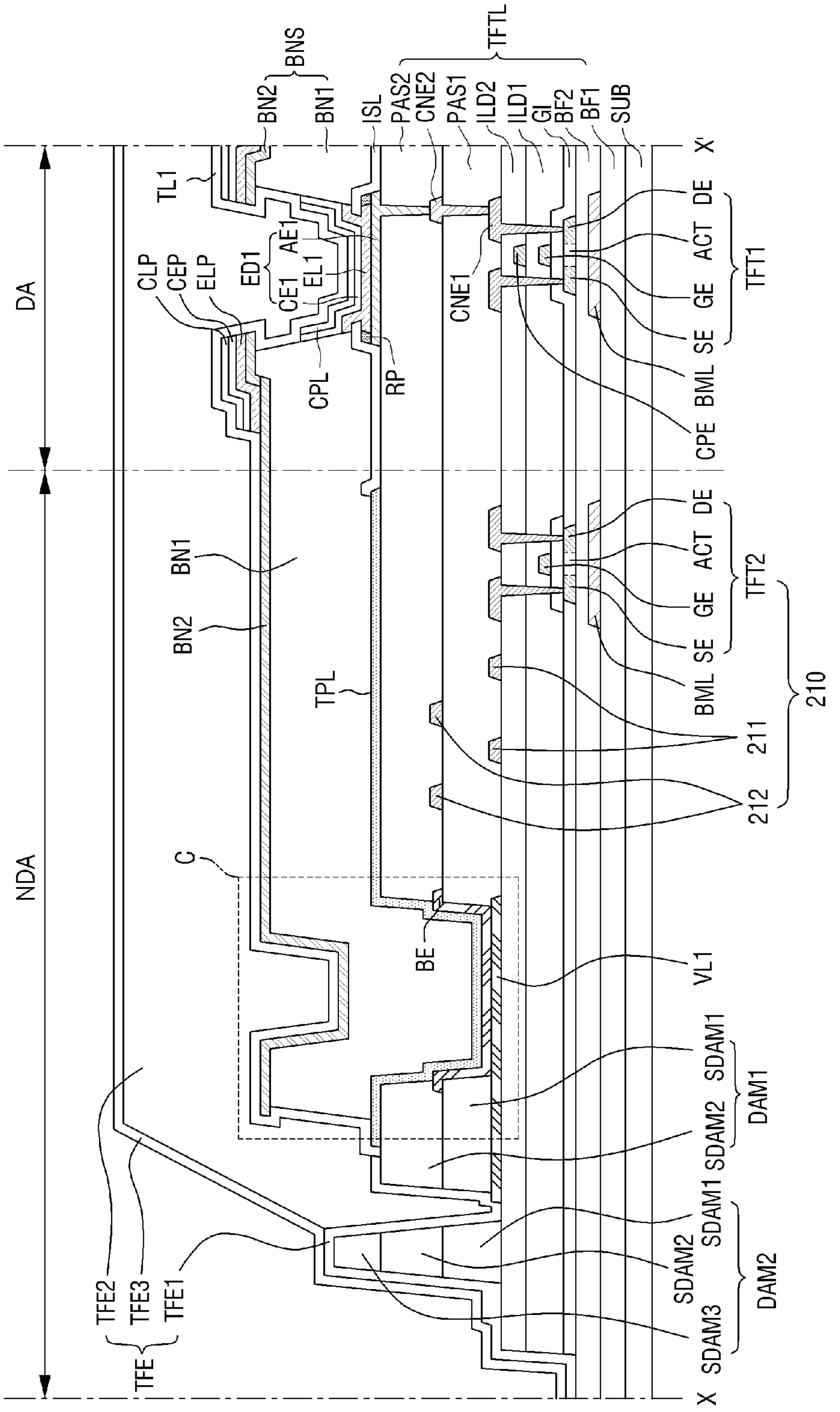
FIG. 10 is a cross-sectional view taken along line X-X' of FIG. 9.
Figure 11:
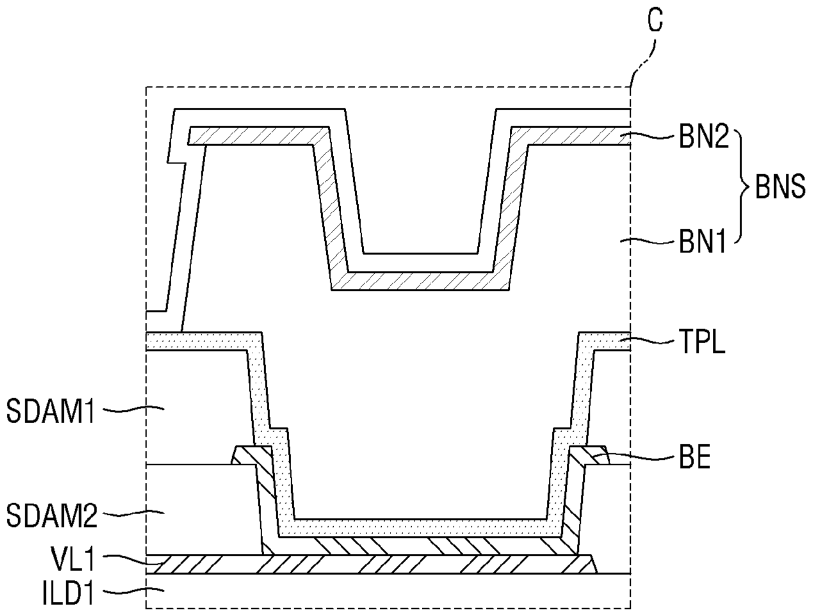
FIG. 11 is an enlarged view showing portion C of FIG. 10.

FIG. 9 is an enlarged view schematically showing portion A of FIG. 8. FIG. 10 is a cross-sectional view taken along line X-X' of FIG. 9. FIG. 11 is an enlarged view showing portion C of FIG. 10. FIG. 9 illustrates an enlarged view of a part of the non-display area NDA disposed on the left side of the display area DA. FIG. 10 illustrates a cross section of the non-display area NDA and a part of the display area DA taken along the first direction DR1. FIG. 11 illustrates an enlarged view of a part in which the first power line VL1 and the first bank layer BN1 are electrically connected in the non-display area NDA.

Referring to FIGS. 9 to 11, an embodiment of the display device 10 may include a plurality of light emitting elements ED disposed in the display area DA, and the gate driver 210, the first power line VL1, a bridge electrode BE, a conductive layer TPL, and dam structures DAM1 and DAM2 disposed in the non-display area NDA. In such an embodiment, the display device 10 may include the bank structure BNS disposed in the display area DA and the non-display area NDA. Features of the light emitting elements ED, the bank structure BNS, and the first thin film transistor TFT1 disposed in the display area DA are substantially the same as those described above, and any repetitive detailed description thereof will be omitted or simplified.

The gate driver 210 may include a second thin film transistor TFT2 and a plurality of gate driving electrodes 211 and 212. The second thin film transistor TFT2 may be disposed on the second buffer layer BF2 and constitute a driving circuit of the gate driver 210. In an embodiment, for example, the second thin film transistor TFT2 may be a switching transistor of a gate driver driving circuit disposed in the non-display area NDA. Similarly to the first thin film transistor TFT1, the second thin film transistor TFT2 may include the semiconductor layer ACT, the source electrode SE, the drain electrode DE, and the gate electrode GE.

The gate driving electrodes 211 and 212 may include a plurality of first gate driving electrodes 211 disposed on the second interlayer insulating layer ILD2, and a plurality of second gate driving electrodes 212 disposed on the first passivation layer PAS1. The first gate driving electrode 211 may be disposed in (or directly on) a same layer as the first connection electrode CNE1 of the display area DA, and the second gate driving electrode 212 may be disposed in (or directly on) a same layer as the second connection electrode CNE2 of the display area DA. Each of the first gate driving electrode 211 and the second gate driving electrode 212 may serve as a connection electrode in a driving circuit of the gate driver 210.

The first power line VL1 may be disposed outside (or not to overlap) the gate driver 210 in the non-display area NDA. The first power line VL1 may be disposed on the second interlayer insulating layer ILD2, and may partially overlap the first dam structure DAM1 described later in the non-display area NDA. A part of the top surface of the first power line VL1 may be exposed through a hole defined through the first passivation layer PAS1 and the second passivation layer PAS2, and the exposed top surface may be in contact with the bridge electrode BE. As described above, the first power line VL1 may be electrically connected to the display driver 200, so that a low potential voltage may be applied to the first power line VL1.

The bridge electrode BE may be disposed on the first power line VL1 in the non-display area NDA. Although not illustrated in the drawing, the bridge electrode BE may be disposed to extend in the non-display area NDA to surround the display area DA, similarly to the first power line VL1 in a plan view. The bridge electrode BE may not overlap the gate driver 210, and may be disposed outside the gate driver 210. However, the disclosure is not limited thereto, and the bridge electrode BE may be disposed to overlap only a part of the first power line VL1 and may be formed in a plurality of patterns spaced apart from each other without extending. The bridge electrode BE may be disposed on the first passivation layer PAS1, but may be in direct contact with the first power line VL1 through a hole defined through the first passivation layer PAS1. The bridge electrode BE may be disposed between the first power line VL1 and the power connection electrode CAE to serve as a bridge electrically connecting the first power line VL1 and the power connection electrode CAE to each other.

The conductive layer TPL may be disposed to overlap the gate driver 210, the bridge electrode BE, and the first power line VL1 in the non-display area NDA. The conductive layer TPL may have a larger width than the bridge electrode BE and overlap the gate driver 210 and the first power line VL1 at the same time. Although not illustrated in the drawing, the conductive layer TPL may be disposed to extend in the non-display area NDA to surround the display area DA in a plan view. The conductive layer TPL may be disposed on the second passivation layer PAS2, and may be in direct contact with the bridge electrode BE through a hole defined through the second passivation layer PAS2. The conductive layer TPL may be disposed between the bridge electrode BE and the first bank layer BN1 to serve as a bridge electrically connecting the bridge electrode BE and the first bank layer BN1 to each other. The conductive layer TPL may be electrically connected to the first power line VL1.

The bank structure BNS may be disposed to extend from the display area DA to the outside of the non-display area NDA. The bank structure BNS may overlap the gate driver 210, the conductive layer TPL, the bridge electrode BE, and the first power line VL1 in the non-display area NDA. The first bank layer BN1 of the bank structure BNS may be directly disposed on the conductive layer TPL in the non-display area NDA. In an embodiment, for example, the bank structure BNS may extend to a part in which the first power line VL1 is disposed, and may also be disposed in a hole defined through the first passivation layer PAS1 and the second passivation layer PAS2. The first bank layer BN1 may be in direct contact with the conductive layer TPL on the gate driver 210 and the hole.

The first bank layer BN1 may include a metal material, and may be electrically connected to the first power line VL1 through the conductive layer TPL and the bridge electrode BE. In such an embodiment, the first bank layer BN1 forms a common electrode with the cathode electrode CE of the light emitting elements ED, such that the first power line VL1 may be electrically connected to the light emitting elements ED through the first bank layer BN1.

In an embodiment, as described above, the first bank layer BN1 may include aluminum (Al), and corrosion may occur depending on the material of the layer disposed thereunder. In an embodiment, for example, where the first bank layer BN1 is in direct contact with a material having a large difference in reduction potential, such as ITO included in the anode electrode AE, galvanic corrosion occurs due to the potential difference, so that electrical connection defects may occur.

According to an embodiment, the display device 10 may include the conductive layer TPL disposed between the first bank layer BN1 and the first power line VL1 to electrically connect the first bank layer BN1 to the first power lines VL1, so that corrosion of the first bank layer BN1 may be effectively prevented. The conductive layer TPL may be directly disposed on the second passivation layer PAS2 in the non-display area NDA and be disposed in (or directly on) a same layer as the anode electrode AE, but may include a material different from that of the anode electrode AE. In an embodiment, for example, the conductive layer TPL may include a same material as a residual pattern IP disposed on the anode electrode AE. The conductive layer TPL may be disposed to partially overlap the first power line VL1 and the bridge electrode BE, and the first bank layer BN1 may be in direct contact with the conductive layer TPL on the first power line VL1. The first bank layer BN1 may be electrically connected to the first power line VL1 through the conductive layer TPL and the bridge electrode BE.

The residual pattern IP may be a pattern remaining after the sacrificial layer SFL formed during the manufacturing process of the display device 10 is partially removed, and the conductive layer TPL may be formed in a same process as the sacrificial layer SFL. As will be described later, the sacrificial layer SFL may include an oxide semiconductor, and the conductive layer TPL may also include an oxide semiconductor to have conductivity. The first bank layer BN1 and the first power line VL1 may be electrically connected to each other through the conductive layer TPL and the bridge electrode BE disposed therebetween.

However, the disclosure is not limited thereto. In an embodiment of the display device 10, where the first bank layer BN1 and the first power line VL1 are electrically connected to each other, the structure of the layers serving as a bridge therebetween may be modified in various ways. In an embodiment, for example, the first bank layer BN1 may be in direct contact with the bridge electrode BE, or an electrode including a same material as the anode electrode AE may be further disposed between the conductive layer TPL and the bridge electrode BE. A description thereof will be given later with reference to other embodiments.

In some embodiments, the first passivation layer PAS1 and the second passivation layer PAS2 of the thin film transistor layer TFTL may include an organic insulating material, and during the manufacturing process of the display device 10, gas may be generated. If the gas generated in the passivation layers PAS1 and PAS2 is not smoothly discharged, the lifting phenomenon of the passivation layers PAS1 and PAS2 may occur due to the gas. Accordingly, conductive layers disposed under the passivation layers PAS1 and PAS2, for example, electrodes of the first thin film transistor TFT1 disposed in the display area DA and electrodes of the gate driver 210 disposed in the non-display area NDA may be damaged.

In an embodiment of the display device 10, since the bank structure BNS extends to the outside of the non-display area NDA to partially overlap the first power line VL1, the gap between the display area DA and the first power line VL1 or an area in which the gate driver 210 is disposed may be covered by the bank structure BNS. In such an embodiment, since the conductive layer TPL is also disposed to cover the gate driver 210, an area between the display area DA and the first power line VL1 may also be covered by the conductive layer TPL. As the bank structures BNS including a metal material are disposed to cover the non-display area NDA, there may be vulnerability to the lifting phenomenon when a discharge path of the gas generated in the passivation layers PAS1 and PAS2 is not formed. The display device 10 according to an embodiment may be provided with a plurality of hole patterns OH defined through the conductive layer TPL and the bank structure BNS disposed in the non-display area NDA. The hole patterns OH may form a discharge path of the gas generated in the passivation layers PAS1 and PAS2 during the manufacturing process of the display device 10.

Figure 12:
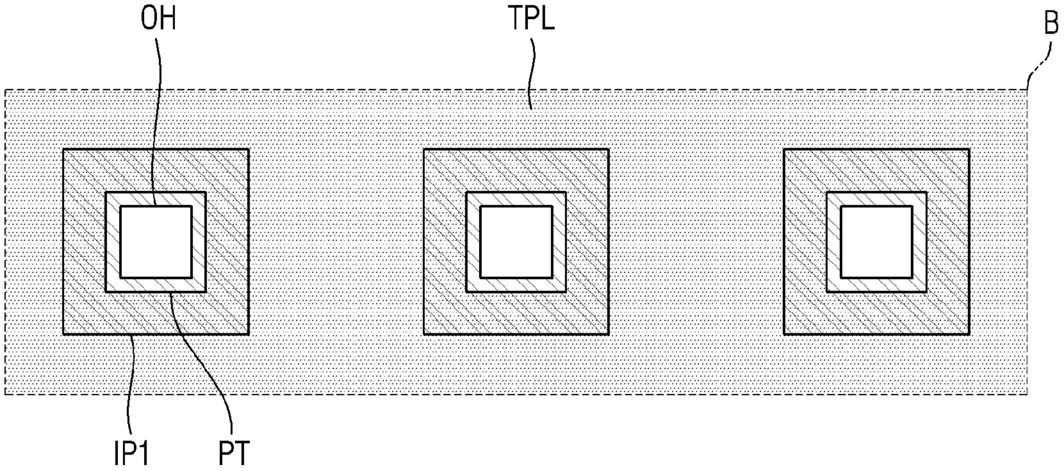
FIG. 12 is an enlarged view schematically showing portion B of FIG. 9.
Figure 13:
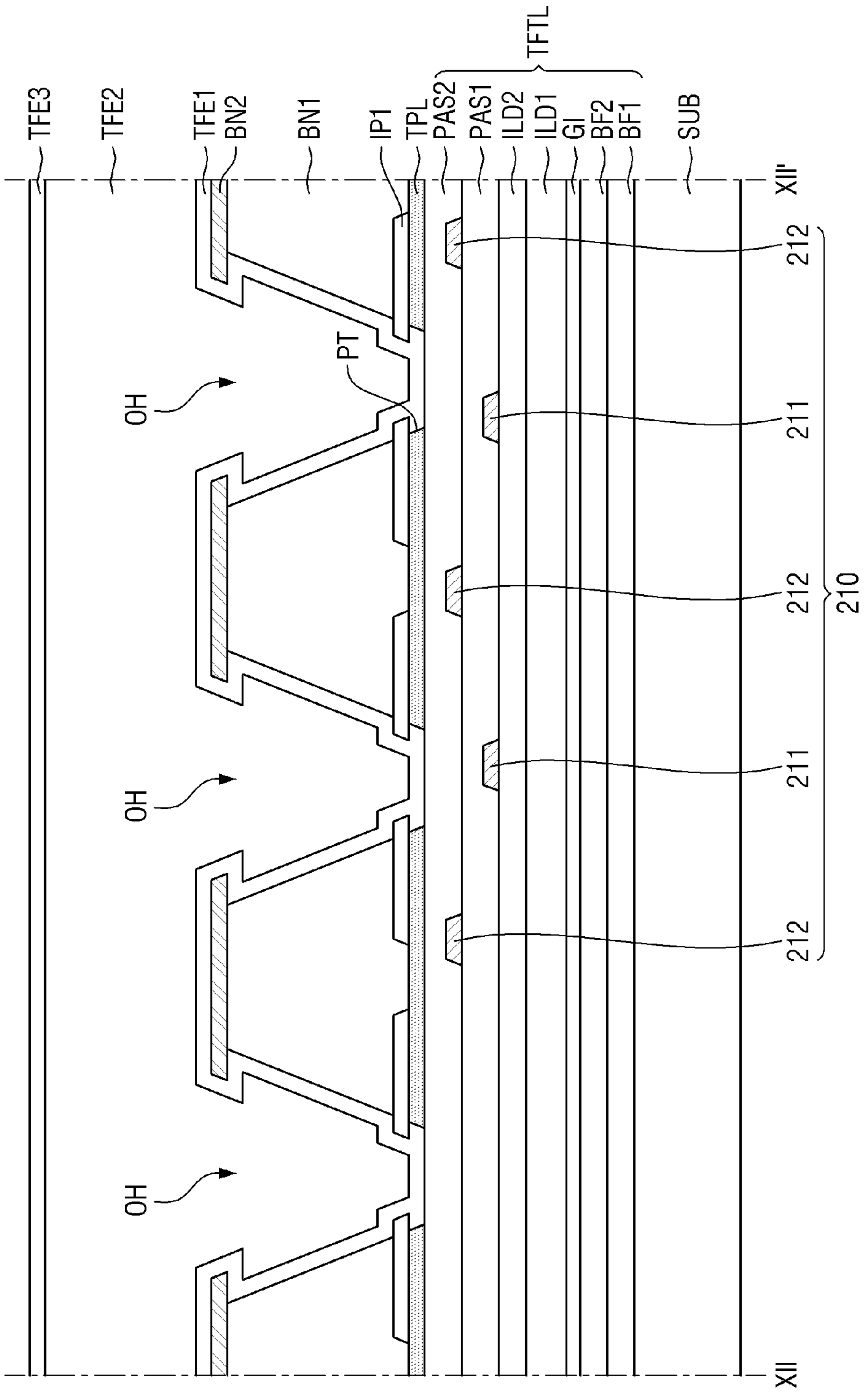
FIG. 13 is a cross-sectional view taken along line XII-XII' of FIG. 12.

FIG. 12 is an enlarged view schematically showing portion B of FIG. 9. FIG. 13 is a cross-sectional view taken along line XII-XII' of FIG. 12. FIG. 12 illustrates an enlarged view of some of the hole patterns OH defined or formed in the conductive layer TPL in FIG. 9, and FIG. 13 illustrates a cross-section taken along a line crossing the plurality of hole patterns OH.

Referring to FIGS. 12 and 13, in an embodiment, the plurality of hole patterns OH may be defined in the non-display area NDA to be spaced apart from each other in the first direction DR1 and the second direction DR2. In an embodiment, for example, the plurality of hole patterns OH spaced apart from each other may be arranged in the first direction DR1 and the second direction DR2, and the arrangement of the hole patterns OH may surround the display area DA in the non-display area NDA. In a plan view, the arrangement of the plurality of hole patterns OH may have substantially the same shape as that of the conductive layer TPL. However, the disclosure is not limited thereto. The plurality of hole patterns OH may be disposed only in the non-display area NDA on the left side and the right side of the display area DA among the non-display areas NDA. In addition, the plurality of hole patterns OH may not necessarily be spaced apart only in the first direction DR1 and the second direction DR2. Alternatively, similarly to the arrangement of the emission areas EA1, EA2, and EA3 illustrated in FIG. 5, the plurality of hole patterns OH may be spaced apart from each other in one of the first direction DR1, the second direction DR2, the fourth direction DR4, or the fifth direction DR5.

The plurality of hole patterns OH may be defined through the conductive layer TPL, and may partially overlap the gate driver 210 in the thickness direction. However, some of the hole patterns OH may be between the gate driver 210 and the first power line VL1 and may not overlap the gate driver 210 and the first power line VL1. The plurality of hole patterns OH may be randomly disposed in the non-display area NDA, but may not overlap at least the first power line VL1. The hole patterns OH may be defined not to overlap the first power line VL1, and the conductive layer TPL may have a large contact area with the bridge electrode BE.

The conductive layer TPL may include a plurality of through portions PT, and the hole pattern OH may overlap the through portion PT. Similarly to the hole patterns OH, the plurality of through portions PT may also be arranged to be spaced apart from each other in the first direction DR1 or the second direction DR2. In a plan view, an area of the through portion PT may be greater than an area of the hole pattern OH. The hole pattern OH may be formed through other layers disposed on the through portion PT.

According to an embodiment, the display device 10 may include a plurality of insulating patterns IP1 disposed around the hole patterns OH in the non-display area NDA. The insulating pattern IP1 may be directly disposed on the conductive layer TPL. The insulating patterns IP1 may be disposed to correspond to the through portions PT of the conductive layer TPL, and the hole patterns OH, respectively.

The insulating pattern IP1 may be directly disposed on the conductive layer TPL to be disposed around the through portion PT. The insulating pattern IP1 may be formed to have a larger area than the through portion PT in a plan view, and a portion of the insulating pattern IP1 may be directly disposed on the conductive layer TPL.

The hole pattern OH may be defined through the insulating pattern IP1. In an embodiment of the manufacturing process of the display device 10, the insulating pattern IP1 may be stacked on the conductive layer TPL while covering the through portion PT, and may be partially removed together with the conductive layer TPL when the hole pattern OH is formed. The reason why the insulating patterns IP1 are formed to surround the hole pattern OH in a plan view may be that the insulating patterns IP1 are partially removed (or provided with a plurality of holes) in an etching process during the manufacturing process.

The bank structure BNS may be disposed on the conductive layer TPL and the insulating patterns IP1 in the non-display area NDA. The hole patterns OH may also be formed through the bank structure BNS, and a tip protruding from the second bank layer BN2 may be formed from an inner sidewall defining the hole pattern OH. As the hole pattern OH also be formed through the bank structure BNS, the gas generated in the passivation layers PAS1 and PAS2 may flow out through the hole pattern OH.

According to an embodiment, the conductive layer TPL and the insulating pattern IP1 may be disposed in (or directly on) a same layer as the residual pattern RP and the inorganic insulating layer ISL disposed in the display area DA, respectively, and may include a same material as each other. The stacking order of the residual pattern RP and the inorganic insulating layer ISL in the display area DA may be the same as the stacking order of the conductive layer TPL and the insulating pattern IP1 in the non-display area NDA. In an embodiment of the manufacturing process of the display device 10, the conductive layer TPL may be formed simultaneously with the residual pattern RP or the sacrificial layer SFL (see FIG. 14), and the insulating pattern IP1 may be formed simultaneously with the inorganic insulating layer ISL.

In an embodiment of the manufacturing process of the display device 10, the etching process of forming the hole pattern OH in the non-display area NDA may be performed simultaneously with the etching process of forming the openings OPE1, OPE2, and OPE3 of the display area DA. As will be described later, after sequentially forming the anode electrode AE, the sacrificial layer SFL (see FIG. 14), the inorganic insulating layer ISL, and the bank structure BNS, the openings OPE1, OPE2, and OPE3 may be formed through an etching process. At the same time, in the non-display area NDA, after the conductive layer TPL, the insulating pattern IP1, and the bank structure BNS are sequentially formed, the hole pattern OH may be formed through an etching process.

In the display area DA, the sacrificial layer SFL may be disposed to overlap the anode electrode AE, whereas in the non-display area NDA, the insulating pattern IP1 may be disposed to correspond to the through portion PT of the conductive layer TPL. Since the anode electrode AE is not etched even in the display area DA, the second passivation layer PAS2 may not be etched although not being disposed in a same layer as the anode electrode AE in the non-display area NDA. Although a same etching process is performed in the display area DA and the non-display area NDA, there is a difference in that the anode electrode AE is disposed in an area overlapping the openings OPE1, OPE2, and OPE3 in the display area DA, and the through portion PT of the conductive layer TPL is positioned to expose the top surface of the second passivation layer PAS2 in the non-display area NDA. However, layers to be etched in the openings OPE1, OPE2, and OPE3 of the display area DA and the hole pattern OH of the non-display area NDA may be identical to each other, and although the second passivation layer PAS2 is exposed in the non-display area NDA, the second passivation layer PAS2 may not be further etched compared to the display area DA. As the same etching process is performed in the display area DA and the non-display area NDA, the stepped portion of the second passivation layer PAS2 does not occur, but the anode electrode AE may remain in the display area DA to form the light emitting element ED, and the hole pattern OH, which is a gas discharge path, may be formed in the through portion PT of the conductive layer TPL in the non-display area NDA.

In an embodiment, as the sacrificial layer SFL is partially removed during the manufacturing process of the display device 10, the bottom surface of the inorganic insulating layer ISL may be spaced apart from the anode electrodes AE1, AE2, and AE3. Similarly, in the etching process of forming the hole pattern OH in the non-display area NDA, the conductive layer TPL may be etched further than the insulating pattern IP1. Accordingly, the insulating pattern IP1 may have a shape protruding toward the inside of the hole pattern OH compared to the conductive layer TPL. A space may be formed between the bottom surface of the insulating pattern IP1 and the second passivation layer PAS2 as the conductive layer TPL is removed, and the bottom surface of the insulating pattern IP1 and the top surface of the second passivation layer PAS2 may be separated from each other. The profiles of the second passivation layer PAS2, the conductive layer TPL, and the insulating pattern IP1 may be substantially the same as the profiles that the anode electrode AE, the residual pattern RP, and the inorganic insulating layer ISL form in the display area DA.

The first encapsulation layer TFE1 disposed on the bank structure BNS may also be disposed inside the hole pattern OH in the non-display area NDA. In an embodiment, for example, the first encapsulation layer TFE1 may be directly disposed on the top surface of the second passivation layer PAS2 exposed by the hole pattern OH in the non-display area NDA, and may also be disposed on the inner sidewall of the conductive layer TPL, the insulating pattern IP1, and the bank structure BNS. The first encapsulation layer TFE1 may be disposed for encapsulation after all gases generated in the passivation layers PAS1 and PAS2 are discharged through the hole pattern OH.

In an embodiment, referring back to FIG. 10, the display device 10 may include a first dam DAM1 and a second dam DAM2 disposed in the non-display area NDA. The first dam DAM1 and the second dam DAM2 may be disposed at the outermost portion of the display area DA, and may be disposed to surround the display area DA. The first dam DAM1 and the second dam DAM2 may prevent the second encapsulation layer TFE2 of the thin film encapsulation layer TFEL from overflowing to the non-display area NDA.

In an embodiment, the first dam DAM1 may include a first sub-dam SDAM1 and a second sub-dam SDAM2, and the second dam DAM2 may include a first sub-dam SDAM1, a second sub-dam SDAM2, and a third sub-dam SDAM3. The first sub-dam SDAM1 and the first passivation layer PAS1 may include a same material as each other, and may be disposed in (or directly on) a same layer as each other. The second sub-dam SDAM2 and the second passivation layer PAS2 may include a same material as each other, and may be disposed in (or directly on) a same layer as each other. The third sub-dam SDAM3 may be disposed on the second sub-dam SDAM2, and may include the same material as that of the second sub-dam SDAM2. The third sub-dam SDAM3 may be located at the same height as the inorganic insulating layer ISL disposed in the display area DA. In an alternative embodiment, the third sub-dam SDAM3 and the inorganic insulating layer ISL may include a same material as each other and may be disposed in (or directly on) a same layer as each other.

In an embodiment, the height of the first dam DAM1 may be lower than the height of the second dam DAM2. However, the disclosure is not limited thereto. Alternatively, the height of the first dam DAM1 may be substantially the same as the height of the second dam DAM2 or may be higher than the height of the second dam DAM2.

The first encapsulation layer TFEL and the third encapsulation layer TFE3 may cover the first dam DAM1 and the second dam DAM2 disposed at the outermost portion of the display area DA. The first encapsulation layer TFEL and the third encapsulation layer TFE3 may extend to the outermost edge of the display panel 100 over the first dam DAM1 and the second dam DAM2.

In an embodiment, the second encapsulation layer TFE2 may be disposed to cover the top surface of the first dam DAM1 without covering the top surface of the second dam DAM2. However, the disclosure is not limited thereto. Alternatively, the second encapsulation layer TFE2 may not cover both the top surface of the first dam DAM1 and the top surface of the second dam DAM2. The second encapsulation layer TFE2 may not overflow to the edge of the display panel 100 due to the first dam DAM1 and the second dam DAM2.

Among the thin film transistor layers TFTL, the gate insulating layer GI, the first interlayer insulating layer ILD1, the second interlayer insulating layer ILD2, the first passivation layer PAS1, and the second passivation layer PAS2 may be removed at the outer portion of the second dam DAM2. Only the buffer layers BF1 and BF2 of the thin film transistor layer TFTL may be disposed at the outer side of the second dam DAM2, and the first encapsulation layer TFEL and the third encapsulation layer TFE3 extending to the outermost edge of the display panel 100 may be directly disposed on the second buffer layer BF2.

In the display device 10 according to an embodiment, the bank structure BNS disposed in the display area DA may extend to the non-display area NDA, form a common electrode with the cathode electrode CE, and be electrically connected to the first power line VL1. Although the bank structures BNS are disposed to cover the non-display area NDA as well, the hole patterns OH defined through the bank structures BNS are disposed in the non-display area NDA, so that the gas generated in the thin film transistor layer TFTL may be discharged through the hole pattern OH. The display device 10 may have a structure including the bank structure BNS, prevent a lifting phenomenon that may occur during the manufacturing process, and secure product reliability.

Hereinafter, a manufacturing process of the display device 10 according to an embodiment will be described in detail.

FIGS. 14 to 21 are cross-sectional views sequentially illustrating a display area during a manufacturing process of a display device according to an embodiment.

FIGS. 14 to 21 schematically illustrate a process of forming the light emitting elements ED and the bank structure BNS as the light emitting element layer EML of the display device 10. Hereinafter, with respect to the manufacturing process of the display device 10, a detailed description of the formation process of each layer will be omitted, and the formation order of each layer will be described.

Figure 14:
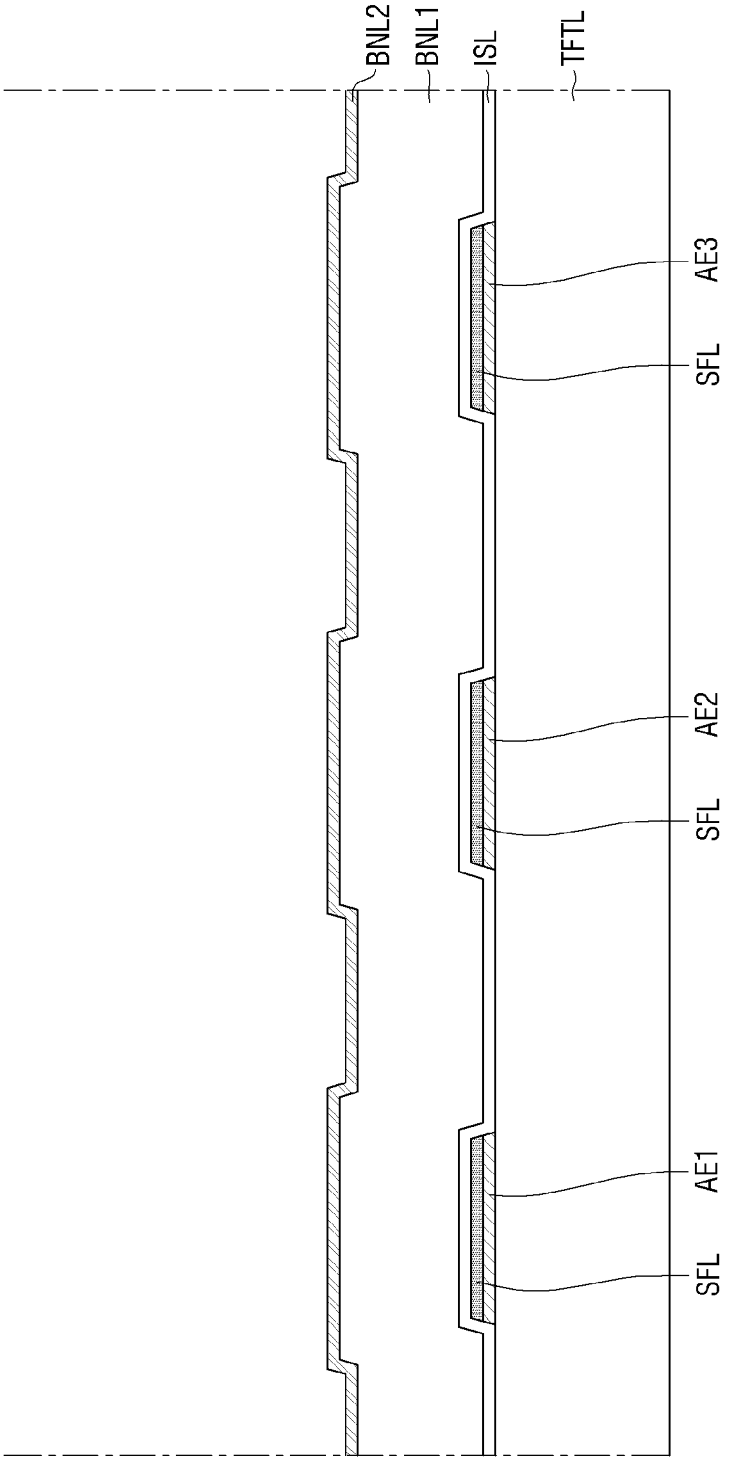
FIGS. 14 to 21 are cross-sectional views sequentially illustrating a display area during a manufacturing process of a display device according to an embodiment.

Referring to FIG. 14, the plurality of anode electrodes AE1, AE2, and AE3, the sacrificial layer SFL, the inorganic insulating layer ISL, and the plurality of bank material layers BNL1 and BNL2 are formed on the thin film transistor layer TFTL.

Although not illustrated in the drawing, the thin film transistor layer TFTL may be disposed on the substrate SUB, and the structure of the thin film transistor TFTL is the same as that described above with reference to FIG. 6. Any repetitive detailed description thereof will be omitted.

The plurality of anode electrodes AE1, AE2, and AE3 may be disposed to be spaced apart from each other on the thin film transistor layer TFTL. The anode electrodes AE1, AE2, and AE3 may include the first anode electrode AE1, the second anode electrode AE2, and the third anode electrode AE3 of the different light emitting elements ED1, ED2, and ED3. The first to third anode electrodes AE1, AE2, and AE3 may be disposed to be spaced apart from each other on the thin film transistor layer TFTL.

The sacrificial layer SFL may be disposed on the anode electrodes AE1, AE2, and AE3. The sacrificial layer SFL may be formed on the anode electrodes AE1, AE2, and AE3, and then may be partially removed in a subsequent process to form a space in which the light emitting layers EL1, EL2, and EL3 are disposed. The sacrificial layer SFL may prevent the contact between the top surfaces of the anode electrodes AE1, AE2, and AE3 and the inorganic insulating layer ISL, and the sacrificial layer SFL may be removed to form a space between the anode electrodes AE1, AE2, and AE3 and the inorganic insulating layer ISL. In an embodiment, the sacrificial layer SFL may include an oxide semiconductor. In an embodiment, for example, the sacrificial layer SFL may include at least one of indium-gallium-zinc oxide (IGZO), zinc-tin oxide (ZTO), or indium-tin oxide (ITO).

The inorganic insulating layer ISL and the bank material layers BNL1 and BNL2 may be disposed on the sacrificial layer SFL. The inorganic insulating layer ISL may be formed to entirely cover the sacrificial layer SFL and the thin film transistor layer TFTL, and the plurality of bank material layers BNL1 and BNL2 may be formed to entirely cover the inorganic insulating layer ISL. The bank material layers BNL1 and BNL2 may include the first bank material layer BNL1 and the second bank material layer BNL2 that are sequentially stacked. The first bank material layer BNL1 may be directly formed on the inorganic insulating layer ISL, and the second bank material layer BNL2 may be formed on the first bank material layer BNL1. The bank material layers BNL1 and BNL2 may be partially etched in a subsequent process to form the bank layers BN1 and BN2 of the bank structure BNS illustrated in FIG. 6, respectively. The first bank material layer BNL1 and the second bank material layer BNL2 may include different metal materials from each other to form the first bank layer BN1 and the second bank layer BN2, respectively.

Figure 15:
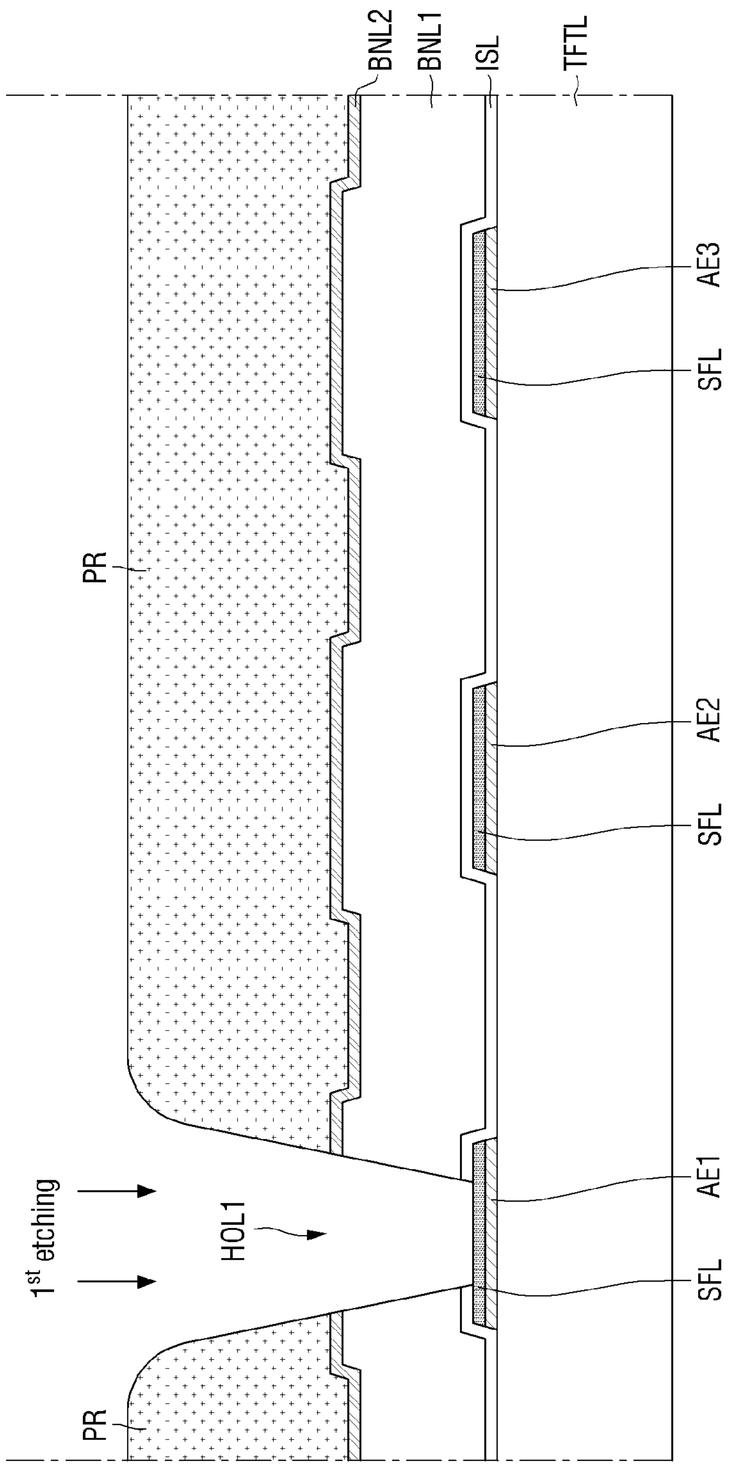

Next, referring to FIG. 15, photoresists PR may be formed on the bank material layers BNL1 and BNL2, and a first etching process ($1^{st}$ etching) for etching some of the bank material layers BNL1 and BNL2 using the photoresist PR as a mask is performed to form a first hole HOL1.

The photoresists PR may be disposed on the bank material layers BNL1 and BNL2 to be spaced apart from each other. The photoresists PR may not overlap the first anode electrode AE1 on the second bank material layer BNL2, and may be disposed to expose portions of the bank material layers BNL1 and BNL2 overlapping the first anode electrode AE1.

In an embodiment, the first etching process ($1^{st}$ etching) may be performed as dry etching. Since the first etching process ($1^{st}$ etching) is performed as a dry etching process, the bank material layers BNL1 and BNL2 including different materials may be anisotropically etched. In this process, the bank material layers BNL1 and BNL2 and a part of the inorganic insulating layer ISL may be etched together to partially expose the sacrificial layer SFL disposed thereunder. The first hole HOL1 may be formed in the regions overlapping the anode electrodes AE1, AE2, and AE3, and the first hole HOL1 may form the openings OPE1, OPE2, and OPE3 of the bank structure BNS.

Figure 16:
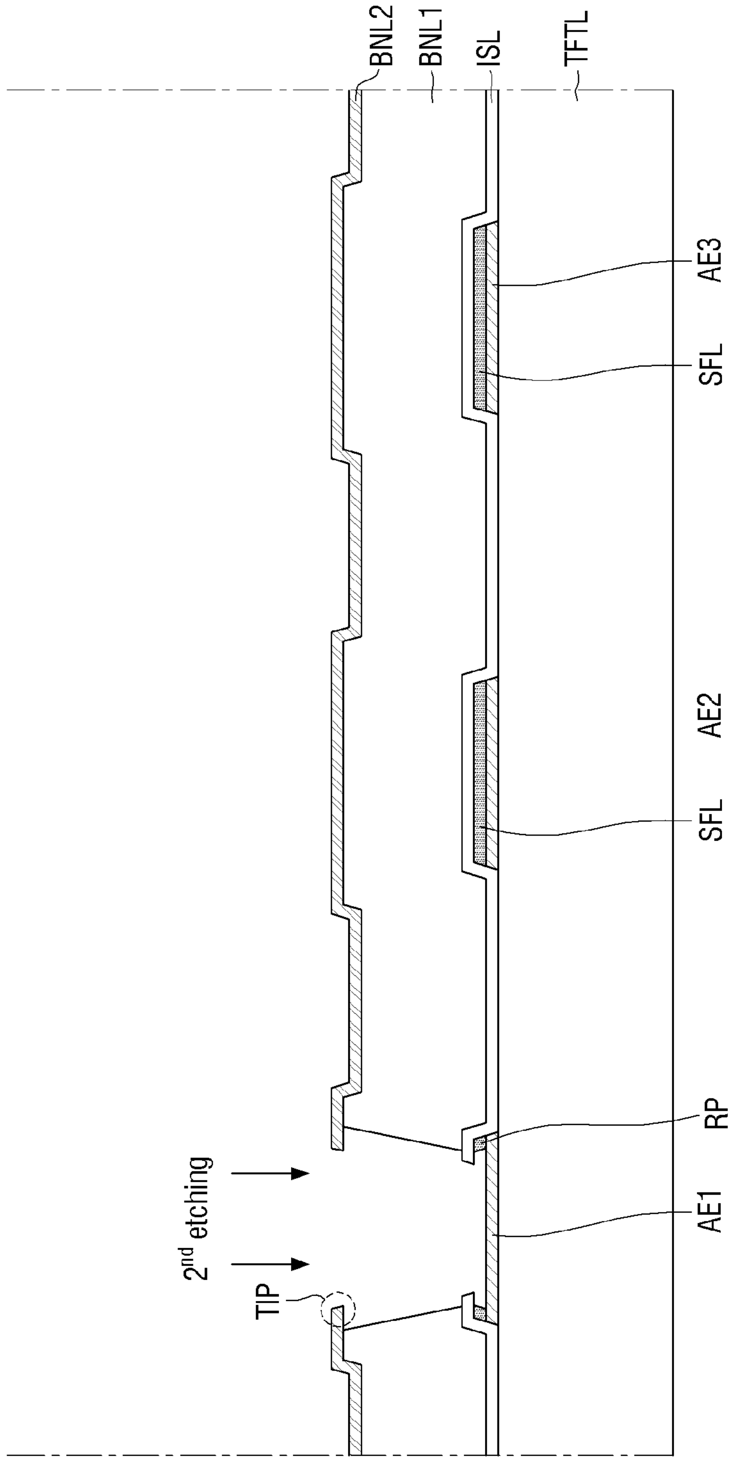

Next, referring to FIG. 16, a second etching process ($2^{nd}$ etching) for removing the sacrificial layer SFL disposed on the first anode electrode AE1 is performed. In an embodiment, the sacrificial layer SFL may include an oxide semiconductor layer, and the second etching process ($2^{nd}$ etching) may be performed as a wet etching process. In this process, the inner sidewall defining the first hole HOL1 may be isotropically etched by the removal of the sacrificial layer SFL. Among the plurality of bank material layers BNL1 and BNL2, the first bank material layer BNL1 may have an etching rate faster than those of other bank material layers, and the second bank material layer BNL2 may have the tip TIP protruding further toward a center of the first hole HOL1 than the lateral side of the first bank material layer BNL1. On the lateral side of the first bank material layer BNL1, the undercut may be formed under the tip TIP of the second bank material layer BNL2. The first hole HOL1 may form the first opening OPEL or the first emission area EA1 by the second etching process ($2^{nd}$ etching).

A part of the sacrificial layer SFL exposed by the first hole HOL1 and a portion between the inorganic insulating layer ISL and the first anode electrode AE1 may be removed. However, the sacrificial layer SFL may not be completely removed, and may remain as the partial residual pattern RP between the inorganic insulating layer ISL and the first anode electrode AE1. As a portion remaining after the sacrificial layer SFL is removed, a space may be formed between the first anode electrode AE1 and the inorganic insulating layer ISL disposed thereon. In a subsequent process, the first light emitting layer EL1 disposed on the first anode electrode AE1 may be formed to fill the space.

Figure 17:
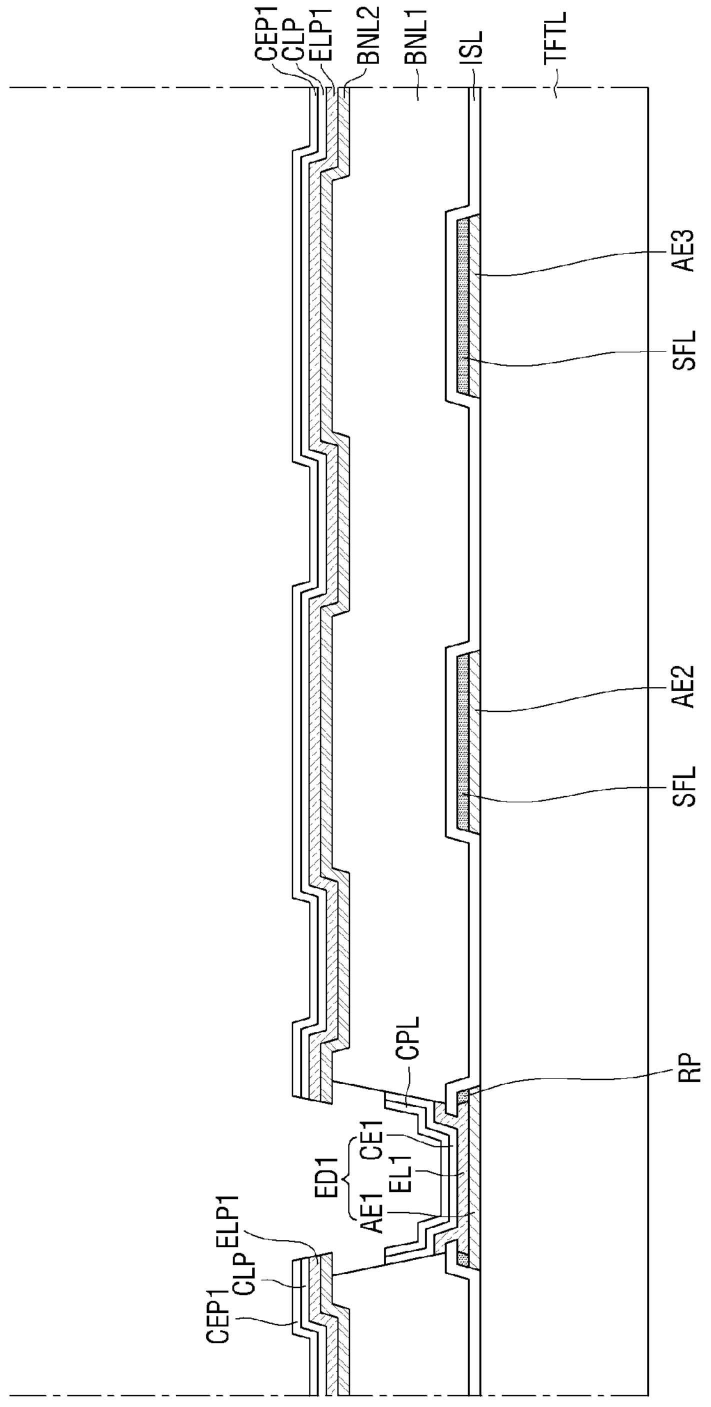

Next, referring to FIG. 17, the first light emitting element ED1 is formed by depositing the first light emitting layer EL1, the first cathode electrode CE1, and the capping layer CPL on the first anode electrode AE1. The first light emitting layer EL1 and the first cathode electrode CE1 may be formed in the first opening OPE1, and in the deposition process, the materials for forming the first light emitting layer EL1 and the first cathode electrode CE1 may also be deposited on the second bank material layers BNL2 to form a plurality of patterns. In an embodiment, for example, some of the materials may be deposited on the second bank material layer BNL2 to form the first organic pattern ELP1 and the first electrode pattern CEP1. A part of the capping layer CPL may be disposed in the first opening OPEL to cover the first light emitting element ED1, and another part thereof may be disposed on the second bank material layer BNL2 to form the first organic pattern ELP1 and the first electrode pattern CEP1. The structure of the first light emitting layer EL1, the first cathode electrode CE1, the first organic pattern ELP1, and the first electrode pattern CEP1 is the same as that described above, and any repetitive detailed description thereof will be omitted.

In an embodiment, the first light emitting layer EL1 and the first cathode electrode CE1 may be formed by a deposition process. The deposition of the material may not be smooth in the first opening OPE1 by the tip TIP of the second bank material layer BNL2. Since, however, the materials of the first light emitting layer EL1 and the first cathode electrode CE1 are deposited in an inclined direction rather than in a direction perpendicular to the top surface of the substrate, they may be deposited even in the region hidden by the tip TIP of the first bank material layer BNL1.

In an embodiment, for example, the deposition process of forming the first light emitting layer EL1 may be performed such that the materials are deposited in a direction not perpendicular to the top surface of the first anode electrode AE1, for example, in a direction inclined at a first angle. In an embodiment, in the process of forming the light emitting layers EL1, EL2, and EL3, the deposition of the material may be performed at an angle in a range of about 45° to about 50° inclined with respect to the top surfaces of the anode electrodes AE1, AE2, and AE3. The first light emitting layer EL1 may be formed to fill a space between the first anode electrode AE1 and the inorganic insulating layer ISL, and may also be formed in the region hidden by the tip TIP of the second bank material layer BNL2. In an embodiment, for example, the first light emitting layer EL1, may be partially disposed on the side surface of the first bank material layer BNL1, which is the region hidden by the tip TIP.

The deposition process of forming the first cathode electrode CE1 may be performed such that the materials are deposited in a direction not perpendicular to the top surface of the first anode electrode AE1, for example, in a direction inclined at a second angle. In an embodiment, in the process of forming the cathode electrodes CE1, CE2, and CE3, the deposition of the material may be performed at an angle of about 30° or less inclined with respect to the top surfaces of the anode electrodes AE1, AE2, and AE3. The first cathode electrode CE1 may be disposed on the first light emitting layer EL1 and may also be formed in the region hidden by the tip TIP of the second bank material layer BNL2. In an embodiment, for example, the first cathode electrode CE1 may be partially disposed on the side surface of the first bank material layer BNL1, which is the region hidden by the tip TIP.

The deposition process of forming the cathode electrodes CE1, CE2, and CE3 may be performed at an angle inclined to be relatively closer to a horizontal direction compared to the deposition process of forming the light emitting layers EL1, EL2, and EL3. Accordingly, the cathode electrodes CE1, CE2, and CE3 may be in contact with the side surface of the first bank layer BN1 or the first bank material layer BNL1 in larger areas compared to the light emitting layers EL1, EL2, and EL3. Alternatively, the cathode electrodes CE1, CE2, and CE3 may be deposited to higher positions on the side surface of the first bank layer BN1 or the first bank material layer BNL1 compared to the light emitting layers EL1, EL2, and EL3. The different cathode electrodes CE1, CE2, and CE3 may be electrically connected to each other while being in contact with the first bank layer BN1 or the first bank material layer BNL1 having high conductivity.

Figure 18:
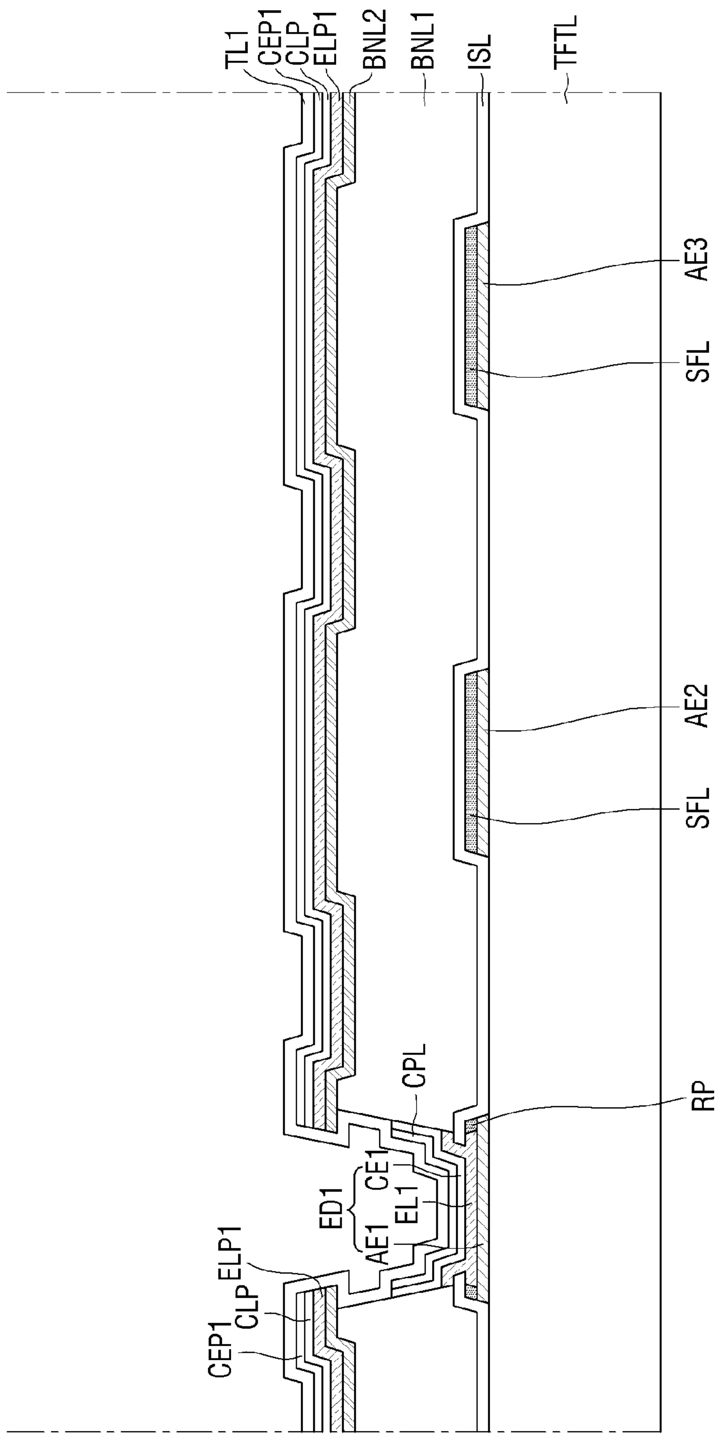

Next, referring to FIG. 18, the first inorganic layer TL1 covering the first light emitting element ED1 and the capping layer CPL is formed. Unlike the light emitting layers EL1, EL2, and EL3 and the cathode electrodes CE1, CE2, and CE3, the first inorganic layer TL1 may be formed by a chemical vapor deposition (CVD) process, and the first inorganic layer TL1 may form a uniform film regardless of the stepped portion of the deposited portion. The first inorganic layer TL1 may be formed to completely cover the outer surfaces of the first light emitting element ED1, the bank material layers BNL1 and BNL2, and the capping layer CPL. In particular, the first inorganic layer TL1 may also be deposited under the tip TIP of the second bank material layer BNL2.

Figure 19:
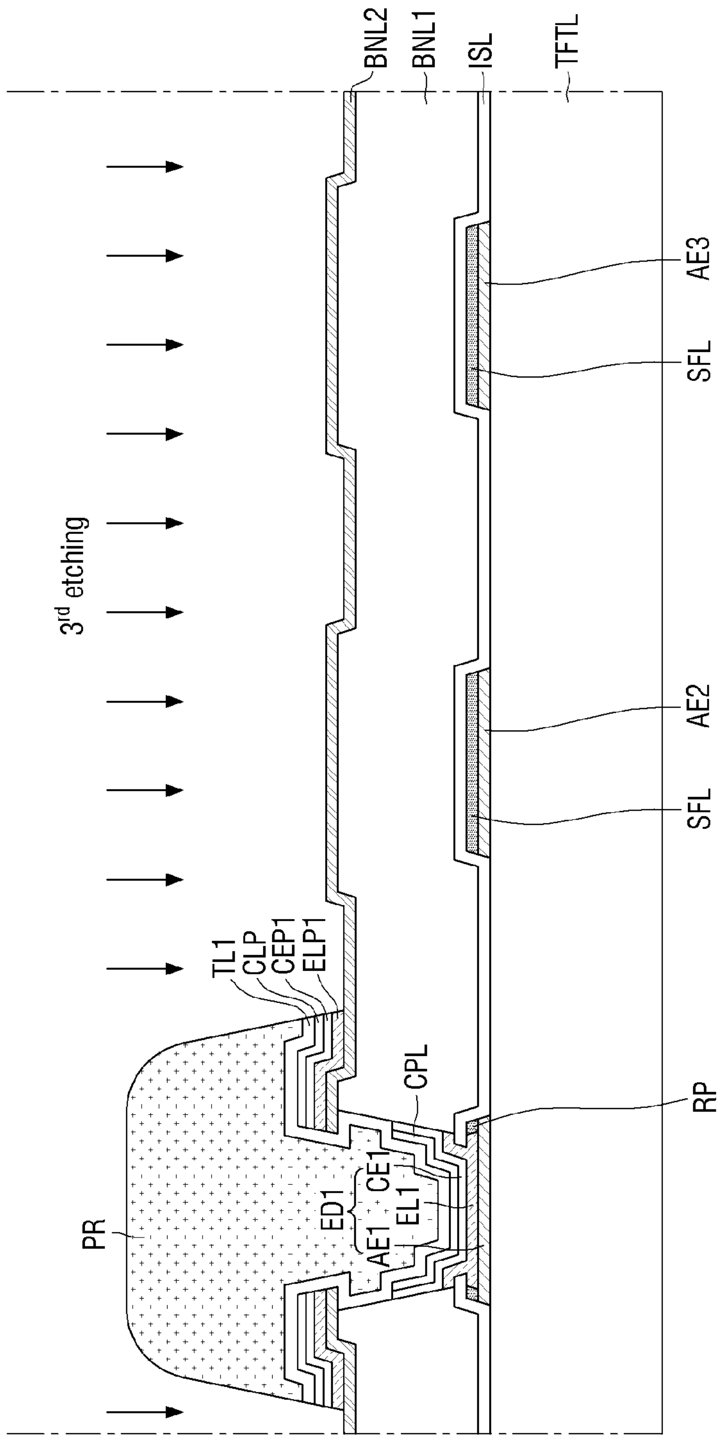

Next, referring to FIG. 19, the photoresist PR is formed on the first inorganic layer TL1, and a third etching process ($3^{rd}$ etching) of partially removing the first organic pattern ELP1, the first electrode pattern CEP1, the capping layer CPL, and the first inorganic layer TL1 disposed on the bank material layers BNL1 and BNL2 is performed.

In this process, the photoresist PR may be disposed to overlap the first opening OPEL or the first light emitting element ED1. The first organic pattern ELP1, the first electrode pattern CEP1, the capping pattern CLP, and the first inorganic layer TL1 disposed on the bank material layers BNL1 and BNL2 may be completely removed except the periphery of the first light emitting element ED1 or the first opening OPE1. In the process, the region of the second bank material layer BNL2 except the periphery of the first light emitting element ED1 or the first opening OPE1 may be exposed. In an embodiment, the third etching process ($3^{rd}$ etching) for removing the first inorganic layer TL1 disposed on the bank material layers BNL1 and BNL2 may be performed as a dry etching process using a fluorine (F)-based etchant.

Figure 20:
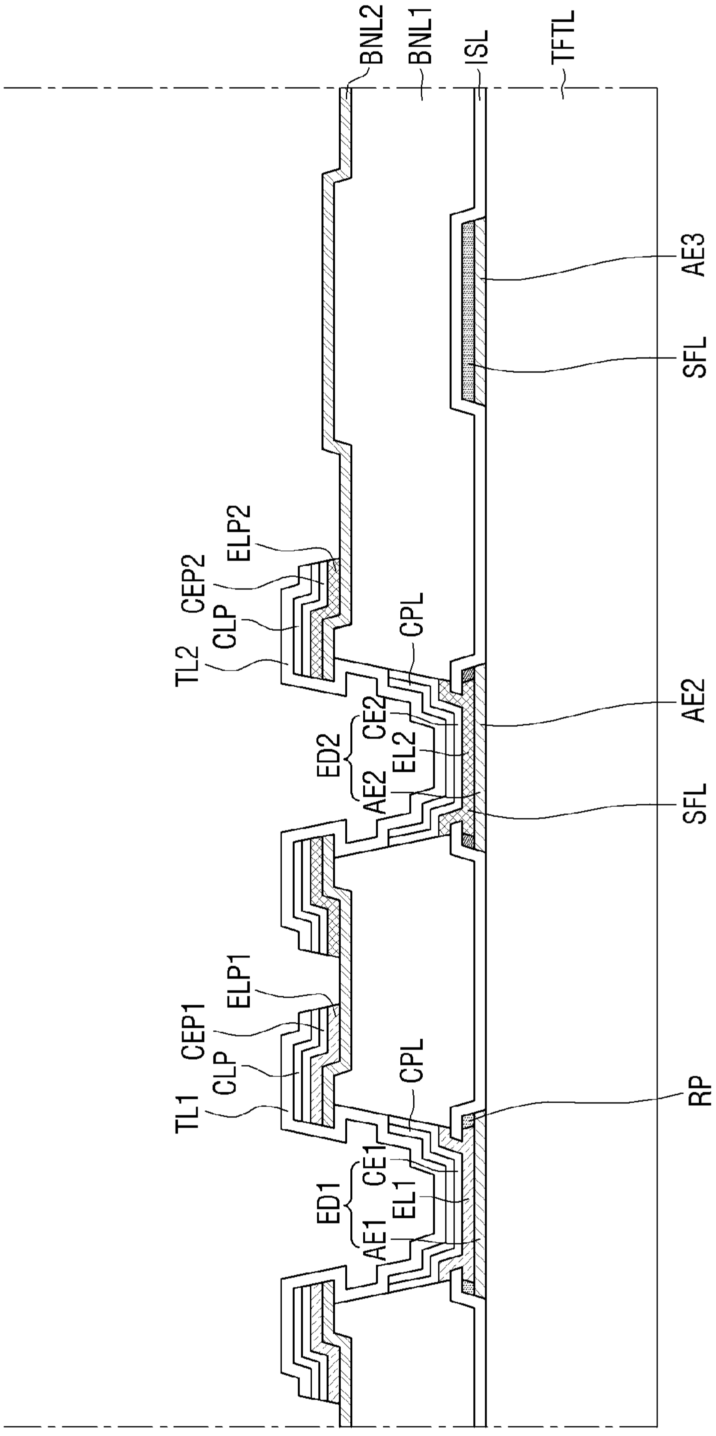
Figure 21:
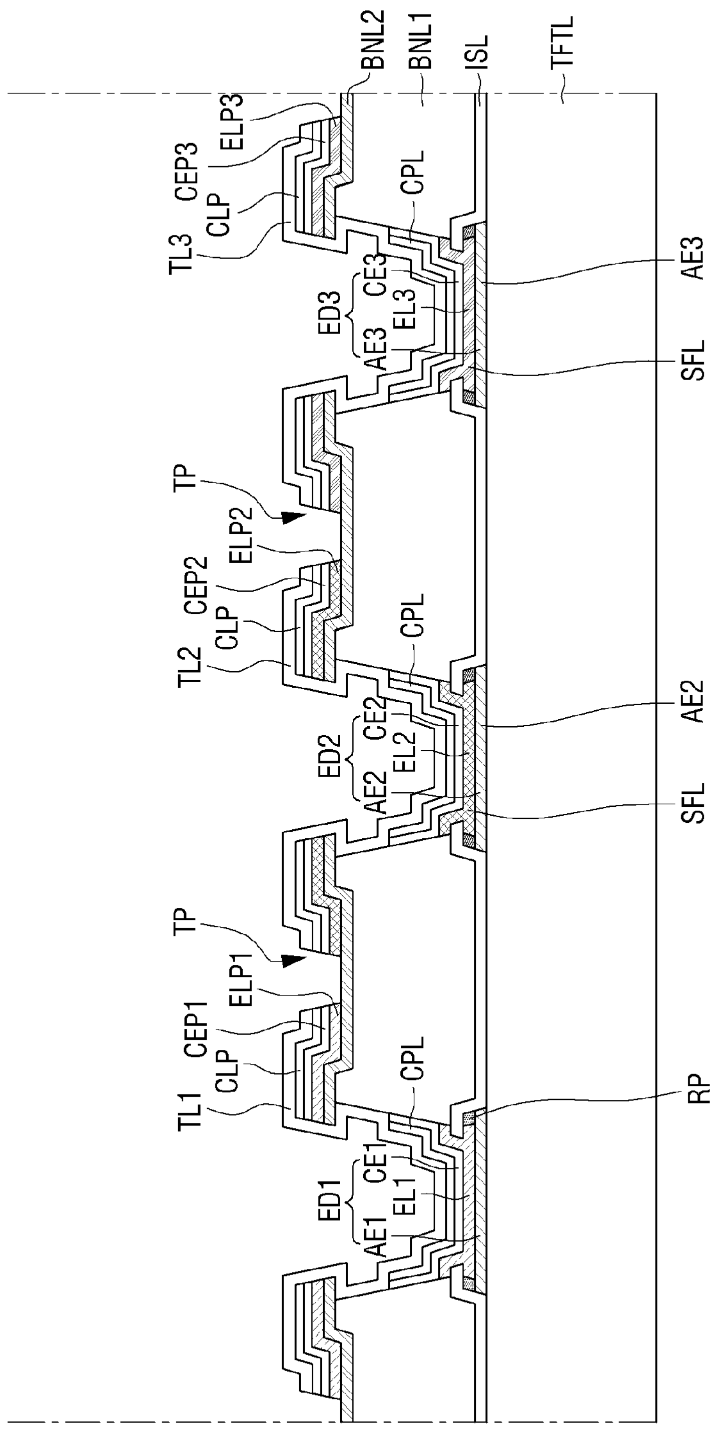

By the above processes, the first light emitting element ED1, and the first inorganic layer TL1 covering the first light emitting element ED1, the first organic pattern ELP1, the first electrode pattern CEP1, and the capping layer PL may be formed. Referring to FIGS. 20 and 21, the second light emitting element ED2, the third light emitting element ED3, the second and third organic patterns ELP2 and ELP3, the second and third electrode patterns CEP2 and CEP3, the second inorganic layer TL2, and the third inorganic layer TL3 may be formed by repeating processes similar to the above-described processes.

Next, although not shown in the drawing, the thin film encapsulation layer TFEL may be formed by forming the second encapsulation layer TFE2 and the third encapsulation layer TFE3 on the first encapsulation layers TFE1 and the bank structure BNS, and the touch sensing layer TSU, the light blocking layer BM, the color filter layer CFL, and the overcoat layer OC may be formed, thereby manufacturing the display device 10.

In an embodiment, as described above, the process of forming the hole pattern OH in the non-display area NDA may be formed simultaneously with the process of forming the openings OPE1, OPE2, and OPE3 in the display area DA. Hereinafter, a process of forming the hole pattern OH in the non-display area NDA will be described.

FIGS. 22 to 26 are views illustrating a part of a non-display area during a manufacturing process of a display device according to an embodiment.

Figure 22:
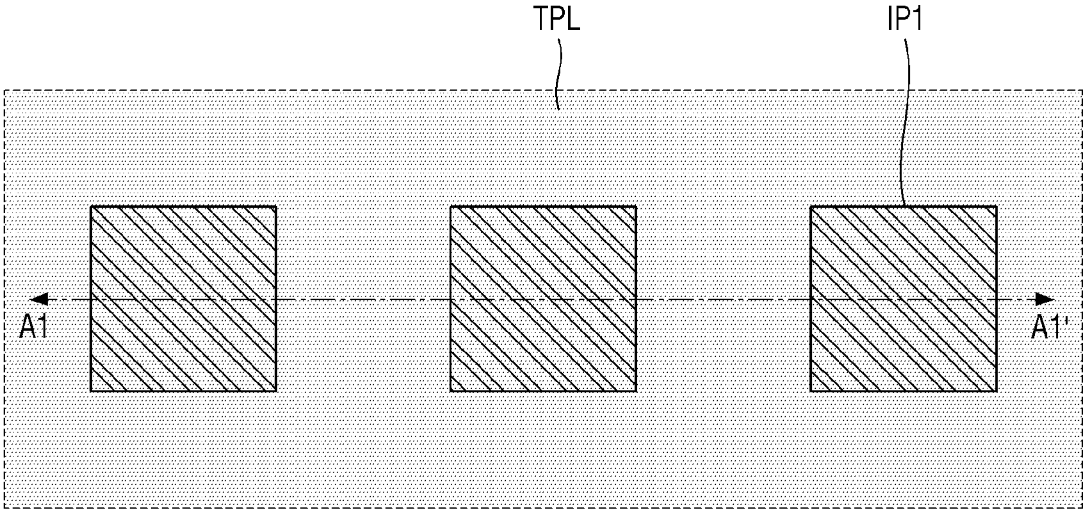
FIGS. 22 to 26 are views illustrating a part of a non-display area during a manufacturing process of a display device according to an embodiment.
Figure 23:
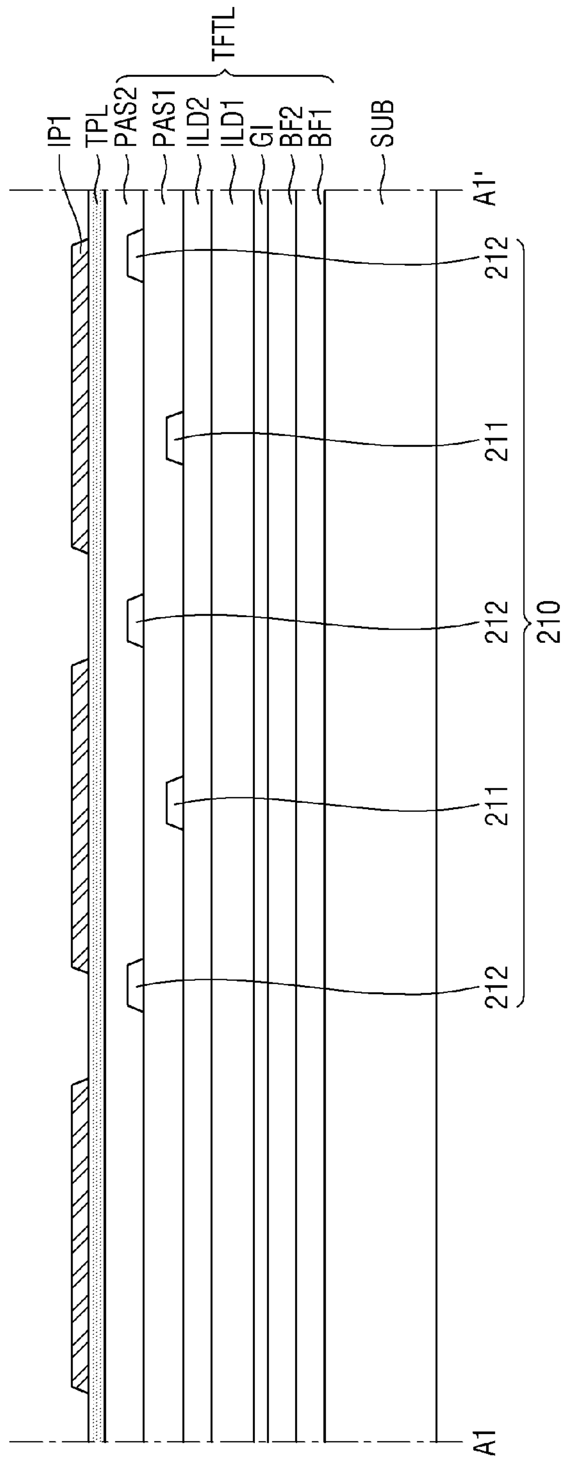

Referring to FIGS. 22 and 23, the insulating patterns IP1 spaced apart from the conductive layer TPL are formed on the thin film transistor layer TFTL.

The thin film transistor layer TFTL may include a plurality of gate driving electrodes 211 and 212 disposed in the non-display area NDA, and although not illustrated in the drawings, may include the second thin film transistor TFT2 of the gate driver 210 as well. Features of the thin film transistor layer TFTL are the same as those described above with reference to FIG. 10.

The conductive layer TPL is disposed to surround the display area DA in the non-display area NDA. In the process, the plurality of through portions PT are not formed in the conductive layer TPL, but the through portions PT may be formed after the conductive layer TPL is partially etched in a subsequent process. The conductive layer TPL may be formed in (or directly on) a same layer in a same process as the sacrificial layer SFL in the display area DA.

The insulating patterns IP1 may be disposed to be spaced apart from each other on the conductive layer TPL. An etching process may be performed in an area in which the insulating pattern IP1 is disposed, so that the conductive layer TPL and the insulating pattern IP1 may be etched. The insulating pattern IP1 may be formed in (or directly on) a same layer in a same process as the inorganic insulating layer ISL in the display area DA.

Figure 24:
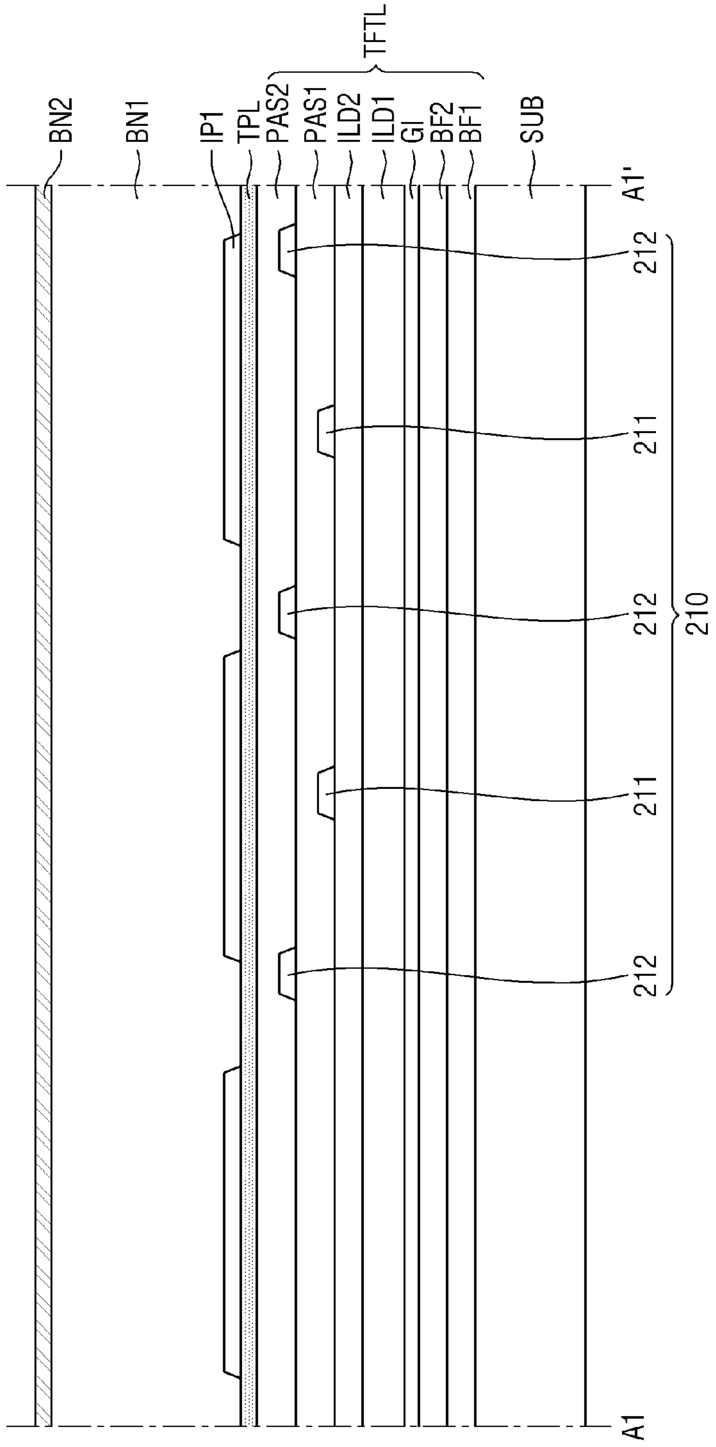

Next, referring to FIG. 24, the bank structure BNS is formed on the conductive layer TPL and the insulating pattern IP1.

The bank structure BNS may include the first bank layer BN1 and the second bank layer BN2 sequentially stacked. The bank structure BNS in which the hole pattern OH is not formed may be the same as the bank material layers BNL1 and BNL2 of FIG. 19.

Figure 25:
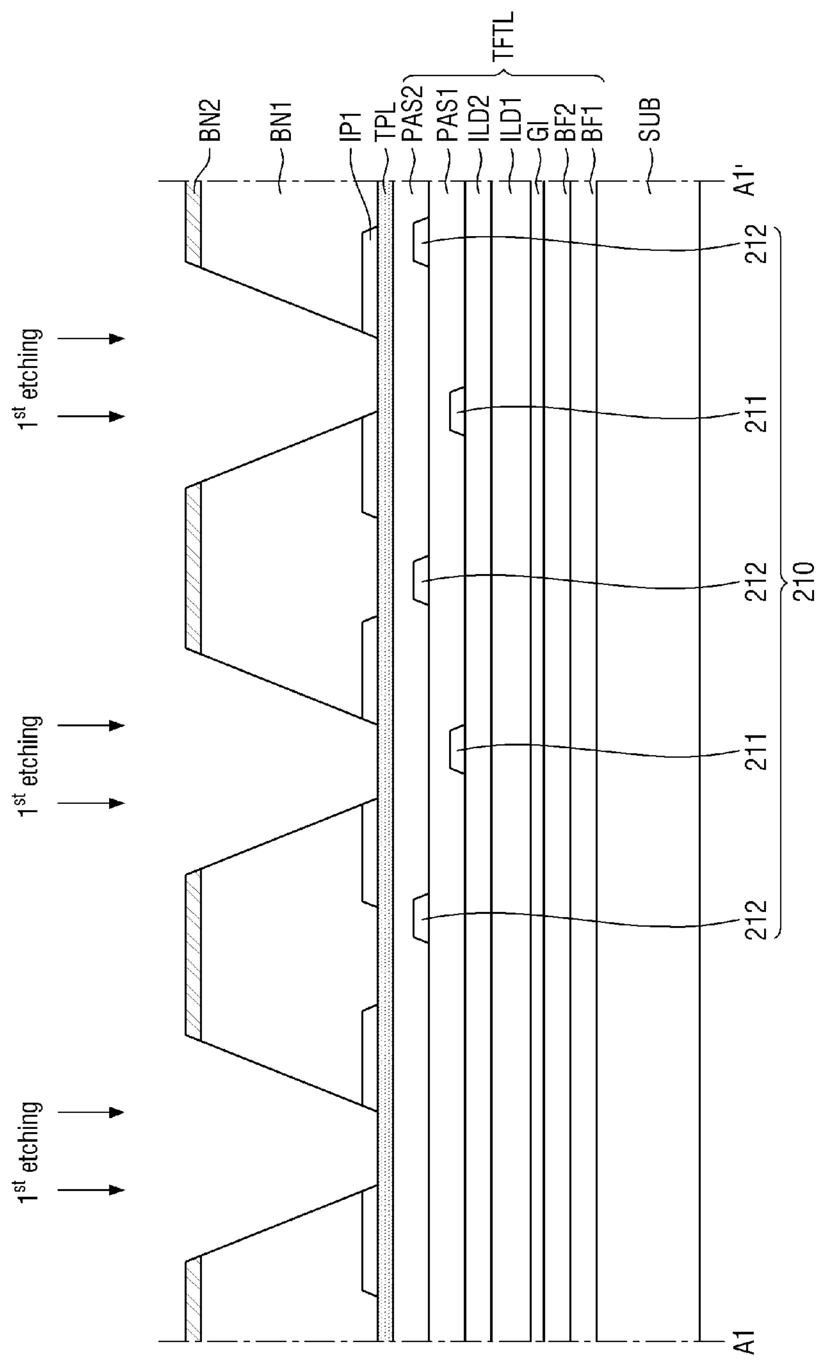

Next, referring to FIG. 25, a first etching process ($1^{st}$ etching) for removing portions of the bank structure BNS and the insulating pattern IP1 is performed. The first bank layer BN1, the second bank layer BN2, and the insulating pattern IP1 may be provided with holes through the first etching process ($1^{st}$ etching), and the top surface of the conductive layer TPL may be exposed. Although not illustrated in the drawings, as illustrated in FIG. 15, the first etching process ($1^{st}$ etching) may be performed by the process of forming a photoresist layer and etching using the photoresist layer as a mask. In the display area DA, the first hole HOL1 may be formed in the first etching process ($1^{st}$ etching).

Figure 26:
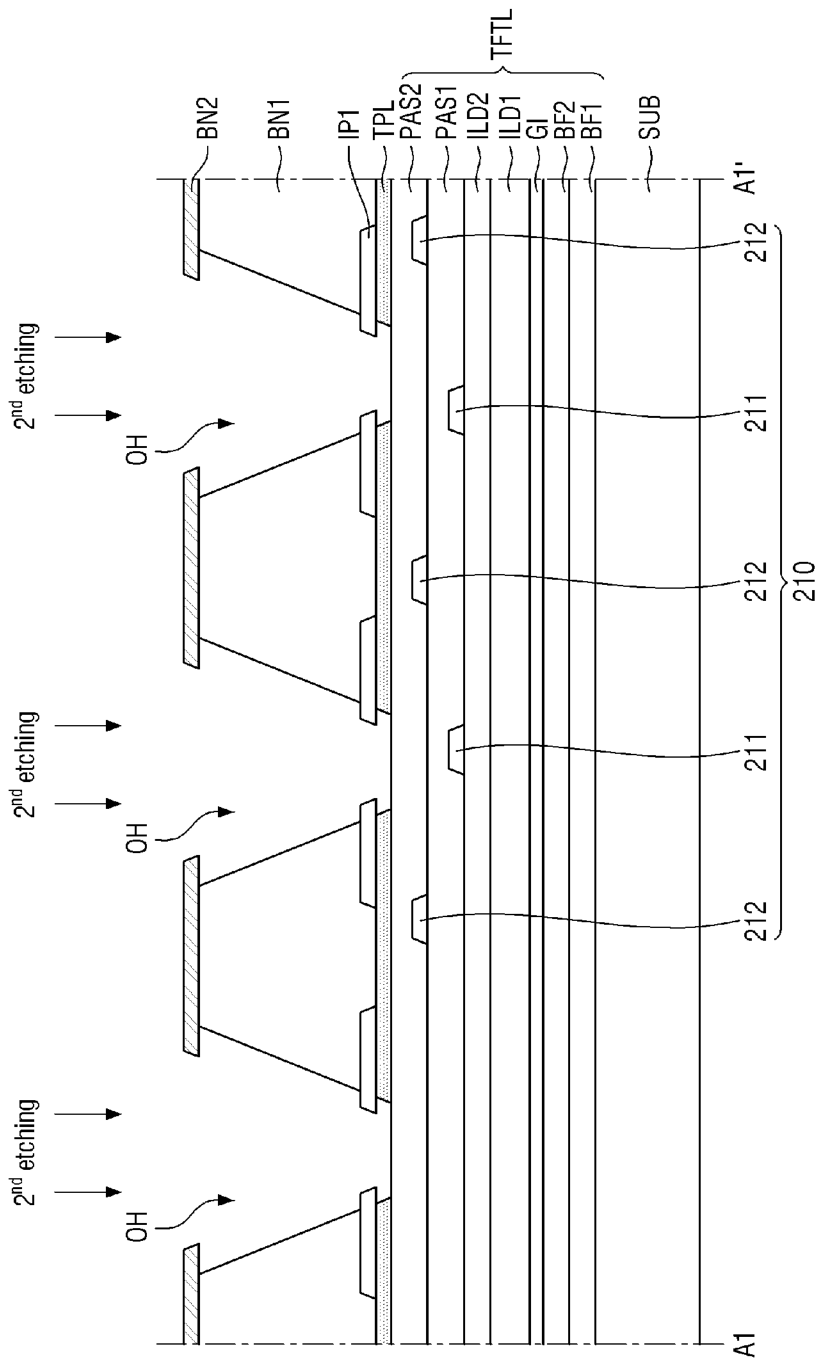

Next, referring to FIG. 26, a second etching process ($2^{nd}$ etching) for removing a part of the conductive layer TPL exposed by the first hole HOL1 is performed. In an embodiment, similarly to the sacrificial layer SFL, the conductive layer TPL may include an oxide semiconductor layer, and the second etching process ($2^{nd}$ etching) may be performed as a wet etching process. In the process, as a part of the conductive layer TPL is removed, the top surface of the second passivation layer PAS2 is exposed, and the inner sidewall of the first bank layer BN1 may be isotropically etched. The conductive layer TPL may be etched further inwardly than the insulating pattern IP1, and the insulating pattern IP1 may include a part protruding toward the inside (or a center) of the hole pattern OH further than the conductive layer TPL.

As described above, the first bank layer BN1 may have an etching rate faster than that of the second bank layer BN2, and even in the non-display area NDA, the tip TIP protruding further toward the inside of the hole pattern OH than the lateral side of the first bank layer BN1 may be formed in the second bank layer BN2.

The hole pattern OH, which is a gas discharge path, may be formed in the non-display area NDA while the top surface of the second passivation layer PAS2 is exposed. While a plurality of processes are performed on the second passivation layer PAS2 in the manufacturing process of the display device 10, gases generated in the passivation layers PAS1 and PAS2 may be discharged through the hole pattern OH. In the display device 10, although the bank structure BNS includes metal materials, a gas discharge path may be secured to prevent the lifting phenomenon of the thin film transistor layer TFTL, and product reliability may be secured.

Hereinafter, various embodiments of the display device 10 will be described with reference to other drawings.

Figure 27:
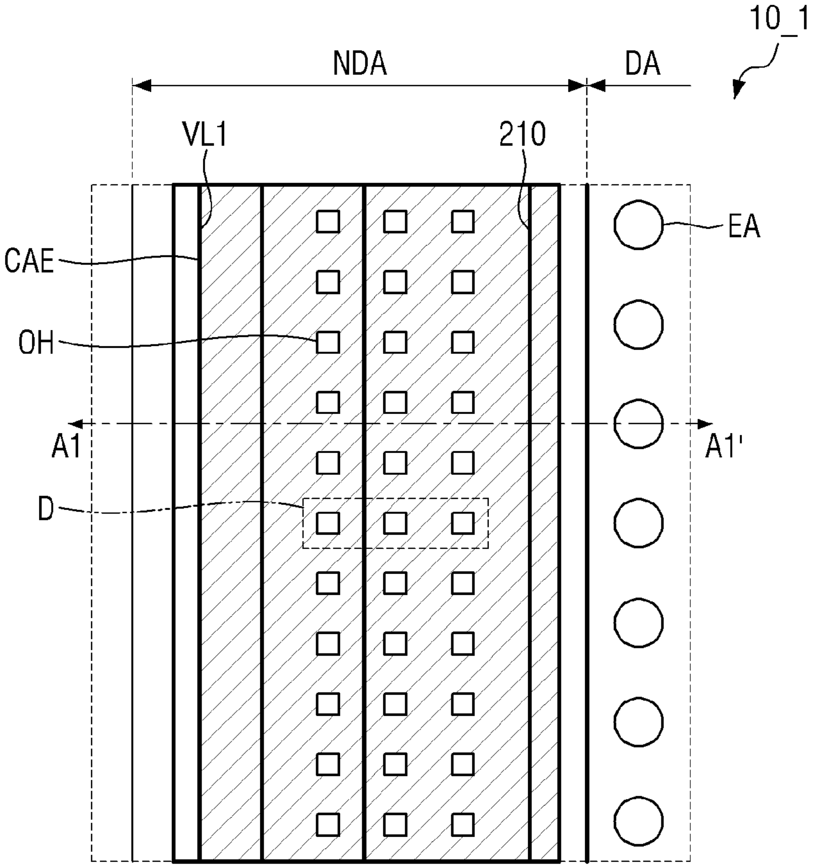
FIG. 27 is a plan view illustrating a part of a non-display area of a display device according to an alternative embodiment.
Figure 28:
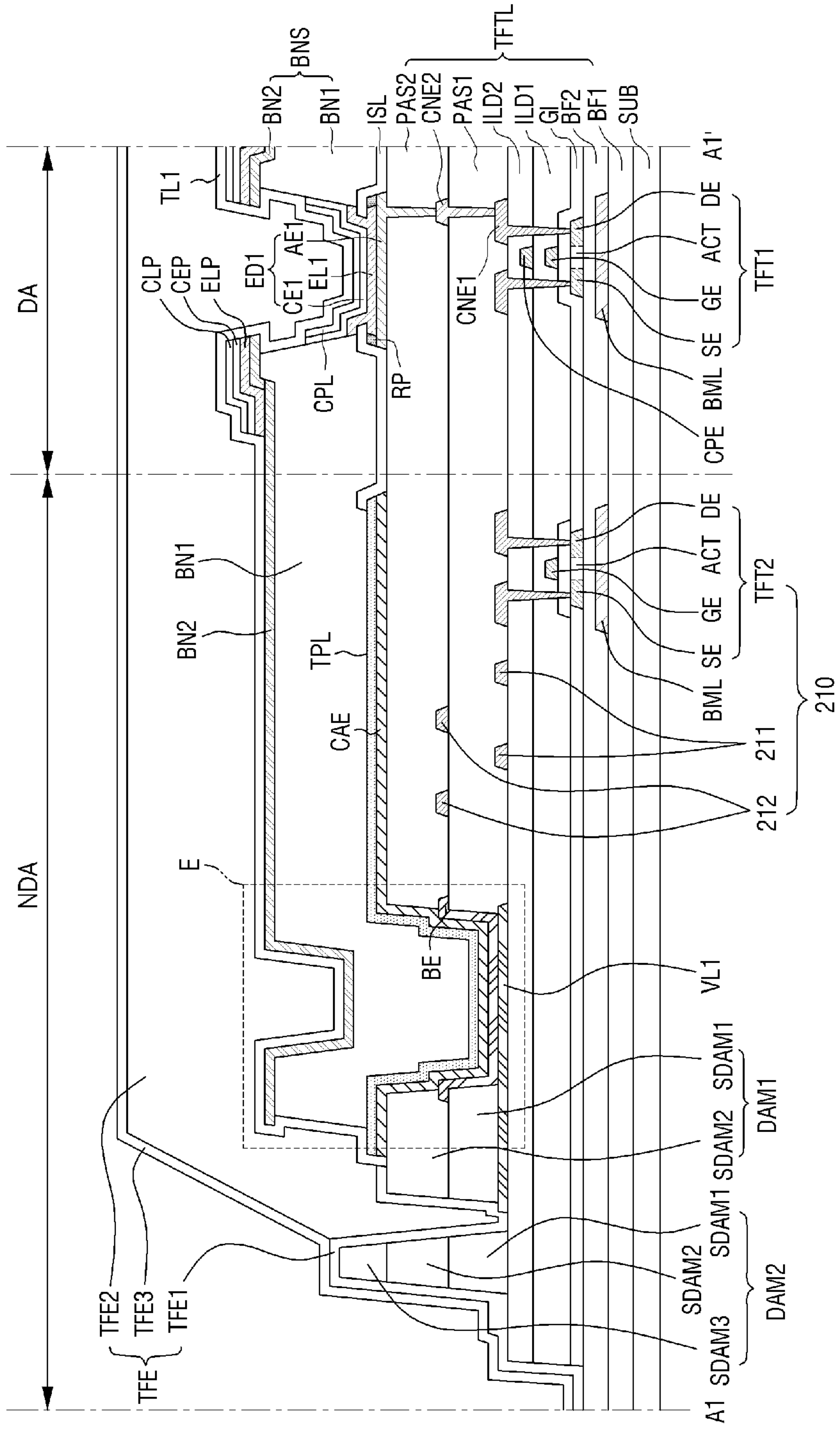
FIG. 28 is a cross-sectional view taken along line A1-A1' of FIG. 27.
Figure 29:
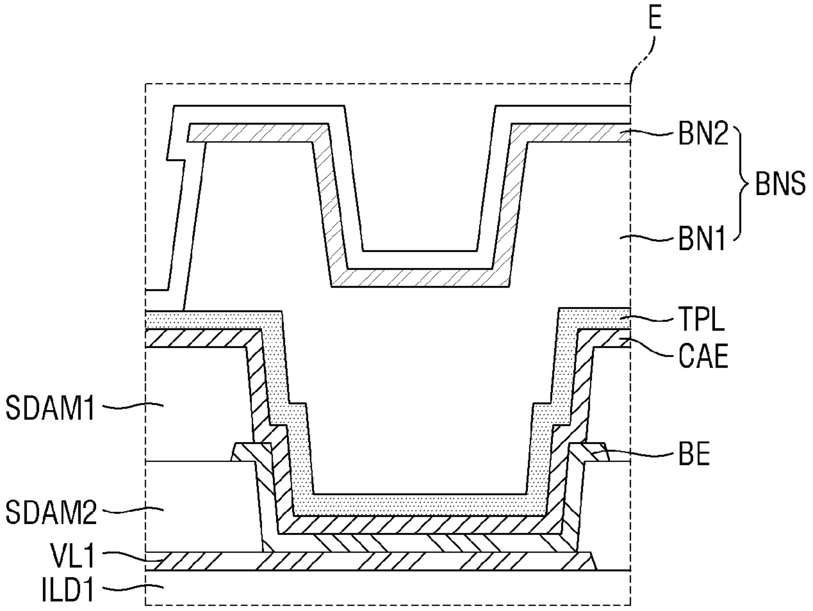
FIG. 29 is an enlarged view illustrating portion E of FIG. 28.
Figure 30:
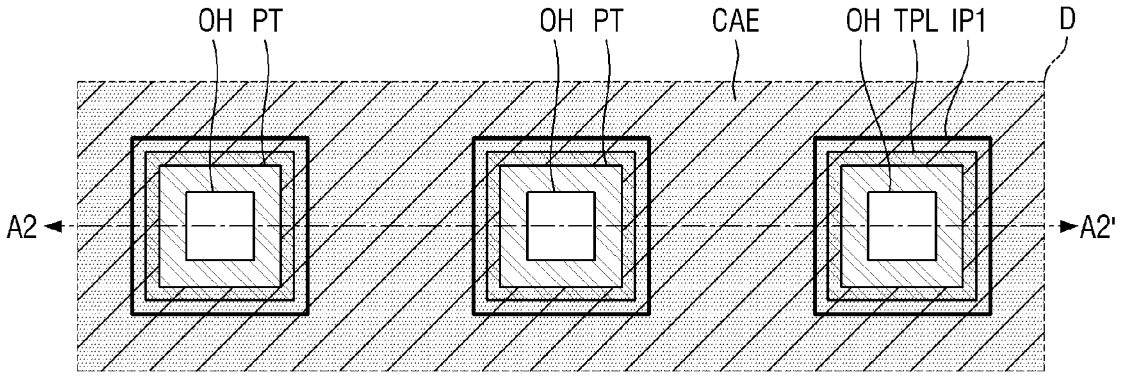
FIG. 30 is a schematic diagram schematically showing portion D of FIG. 27.
Figure 31:
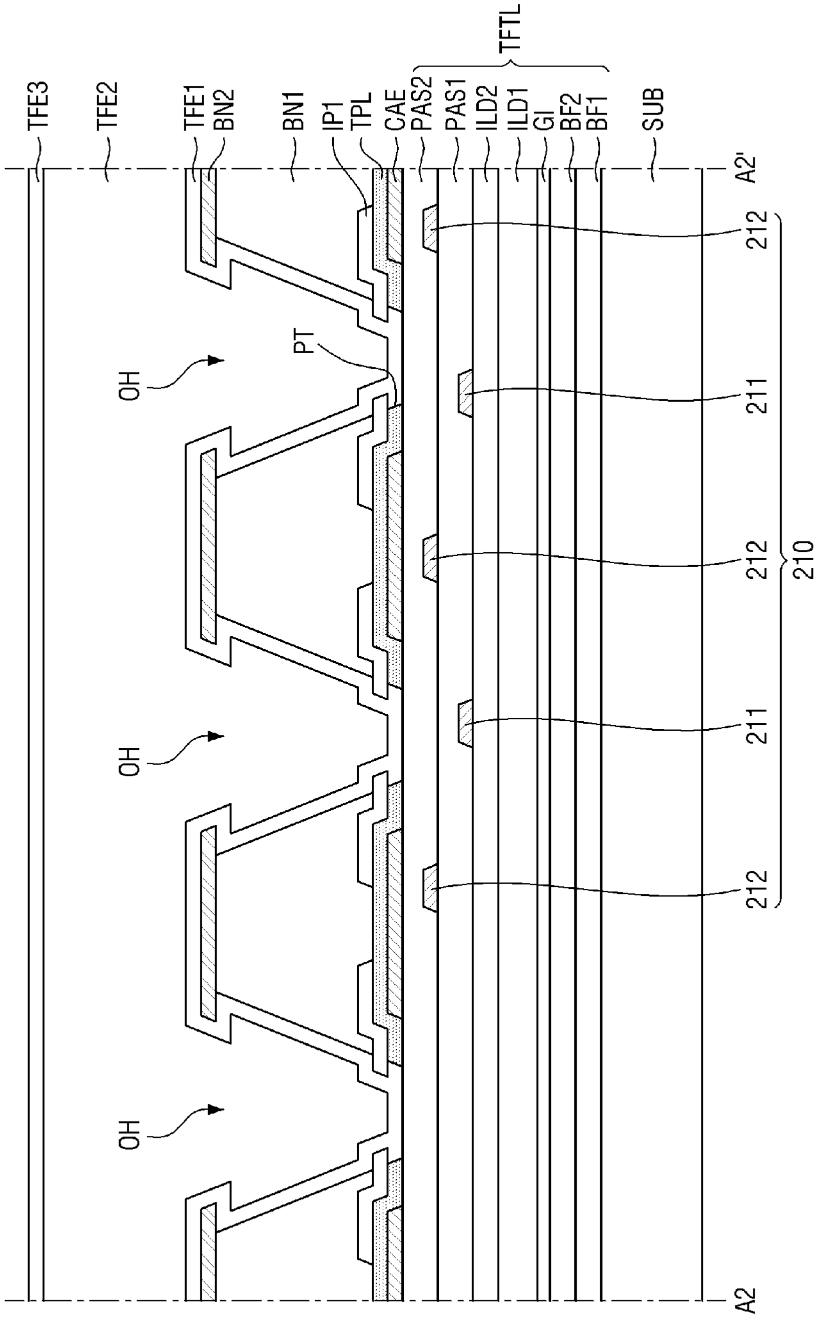
FIG. 31 is a cross-sectional view taken along line A2-A2' of FIG. 30.

FIG. 27 is a plan view illustrating a part of a non-display area of a display device according to an alternative embodiment. FIG. 28 is a cross-sectional view taken along line A1-A1' of FIG. 27. FIG. 29 is an enlarged view illustrating portion E of FIG. 28. FIG. 30 is a schematic diagram schematically showing portion D of FIG. 27. FIG. 31 is a cross-sectional view taken along line A2-A2' of FIG. 30.

Referring to FIGS. 27 to 31, a display device 10_1 according to an embodiment may further include the power connection electrode CAE disposed in the non-display area NDA. The power connection electrode CAE may include a same material as the anode electrode AE of the display area DA and be disposed in (or directly on) a same layer as each other.

In an embodiment, for example, the power connection electrode CAE may be disposed to overlap the gate driver 210, the bridge electrode BE, the first power line VL1, and the conductive layer TPL in the non-display area NDA. The power connection electrode CAE may be disposed between the bridge electrode BE and the conductive layer TPL and be in contact with each of the bridge electrode BE and the conductive layer TPL. The power connection electrode CAE may have a larger width than the bridge electrode BE and overlap the gate driver 210 and the first power line VL1 at the same time. Although not illustrated in the drawing, the power connection electrode CAE may be disposed to extend to surround the display area DA in the non-display area NDA in a plan view. The power connection electrode CAE may have substantially the same shape as the conductive layer TPL.

The power connection electrode CAE may be disposed on the second passivation layer PAS2 to be disposed in (or directly on) a same layer as the anode electrode AE of the display area DA. The power connection electrode CAE may be in direct contact with the bridge electrode BE through a hole defined through the second passivation layer PAS2. The power connection electrode CAE may be disposed between the bridge electrode BE and the conductive layer TPL to serve as a bridge electrically connecting the bridge electrode BE and the conductive layer TPL to each other. The power connection electrode CAE may be electrically connected to the first power line VL1.

In an embodiment, the display device 10_1 may further include the power connection electrode CAE, so that the display area DA and the non-display area NDA may have a same stacked structure as each other. In the embodiment shown in FIG. 9, the conductive layer TPL disposed in the non-display area NDA may be directly disposed on the second passivation layer PAS2, and thus may not disposed in (or directly on) a same layer as the anode electrode AE in the display area DA. In an alternative embodiment, the display device 10_1 may further include the power connection electrode CAE to match the stacked structure between the display area DA and the non-display area NDA, so that uniformity of the stacked structure may be improved.

In such an embodiment, the power connection electrode CAE may include a same material as the anode electrode AE, but the first bank layer BN1 may be electrically connected to the power connection electrode CAE through the conductive layer TPL without being in direct contact with the power connection electrode CAE. Accordingly, corrosion due to a difference in materials between the first bank layer BN1 and the power connection electrode CAE may be effectively prevented.

As the power connection electrode CAE is further disposed in the non-display area NDA, the plurality of hole patterns OH disposed in the non-display area NDA may also be formed further through the power connection electrode CAE. In an embodiment, for example, the plurality of hole patterns OH may be defined through the power connection electrode CAE, and some thereof may overlap the gate driver 210 in a thickness direction. The plurality of hole patterns OH may be randomly disposed in the non-display area NDA, but may not overlap at least the first power line VL1. The hole patterns OH may be disposed not to overlap the first power line VL1, and the power connection electrode CAE may have a large contact area with the bridge electrode BE.

The power connection electrode CAE may include the plurality of through portions PT, and the hole pattern OH may overlap the through portion PT. Similarly to the hole pattern OH, the plurality of through portions PT may also be arranged to be spaced apart from each other in the first direction DR1 or the second direction DR2. In a plan view, an area of the through portion PT may be greater than an area of the hole pattern OH. The hole pattern OH may be formed further through other layers disposed on the through portion PT.

In the periphery of the hole patterns OH, the conductive layer TPL disposed on the power connection electrode CAE may cover the sidewall of the through portion PT of the power connection electrode CAE. The conductive layer TPL may prevent the lateral side of the power connection electrode CAE from being exposed as the through portion PT is formed. As described above, the power connection electrode CAE may include a same material or structure and may be disposed in (or directly on) a same layer as the anode electrode AE of the light emitting element ED. In some embodiments, the anode electrode AE and the power connection electrode CAE may have a stacked structure of ITO/Ag/ITO, and the conductive layer TPL may effectively prevent a side surface of the Ag layer of the power connection electrode CAE from being exposed.

The insulating pattern IP1 may be disposed on the conductive layer TPL. The insulating pattern IP1 may be formed to have a larger area than the through portion PT in a plan view.

The hole pattern OH may penetrate the conductive layer TPL and the insulating pattern IP1 in the through portion PT of the power connection electrode CAE. In the manufacturing process of the display device 10, the conductive layer TPL and the insulating pattern IP1 may cover the through portion PT, be sequentially stacked on the power connection electrode CAE, and then be partially removed together when the hole pattern OH is formed. The reason why the insulating patterns IP1 are disposed to surround the hole pattern OH in a plan view may be that the insulating patterns IP1 are partially removed in an etching process during the manufacturing process. As the hole pattern OH is formed further through the bank structure BNS, the gases generated in the passivation layers PAS1 and PAS2 may flow out through the hole pattern OH.

Figure 32:
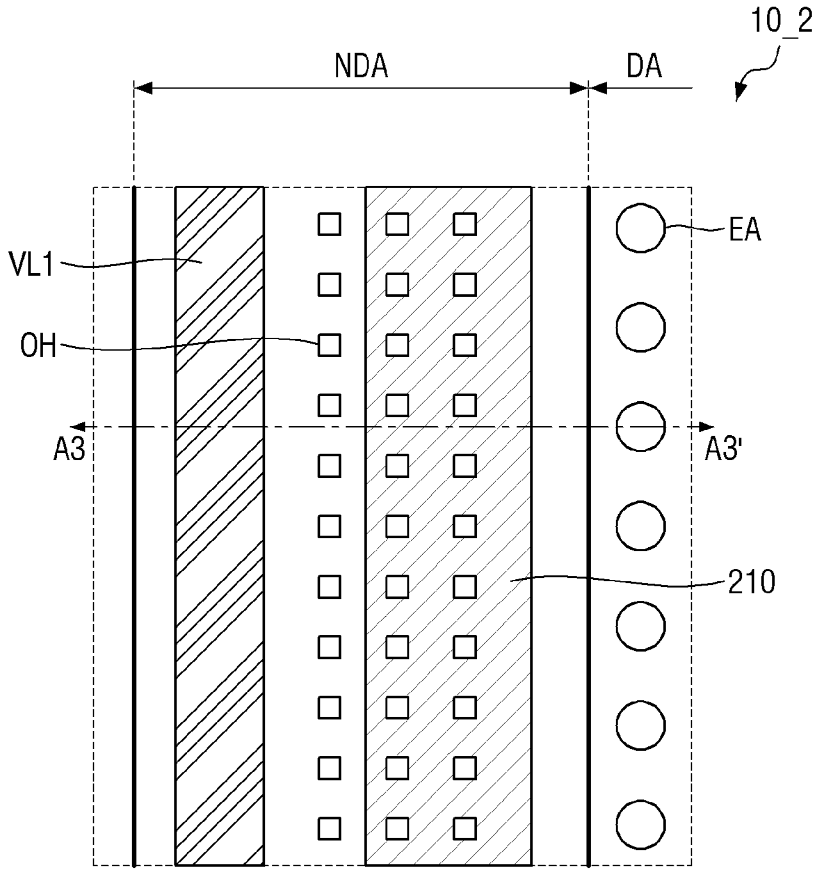
FIG. 32 is a plan view illustrating a part of a non-display area of a display device according to another alternative embodiment.
Figure 33:
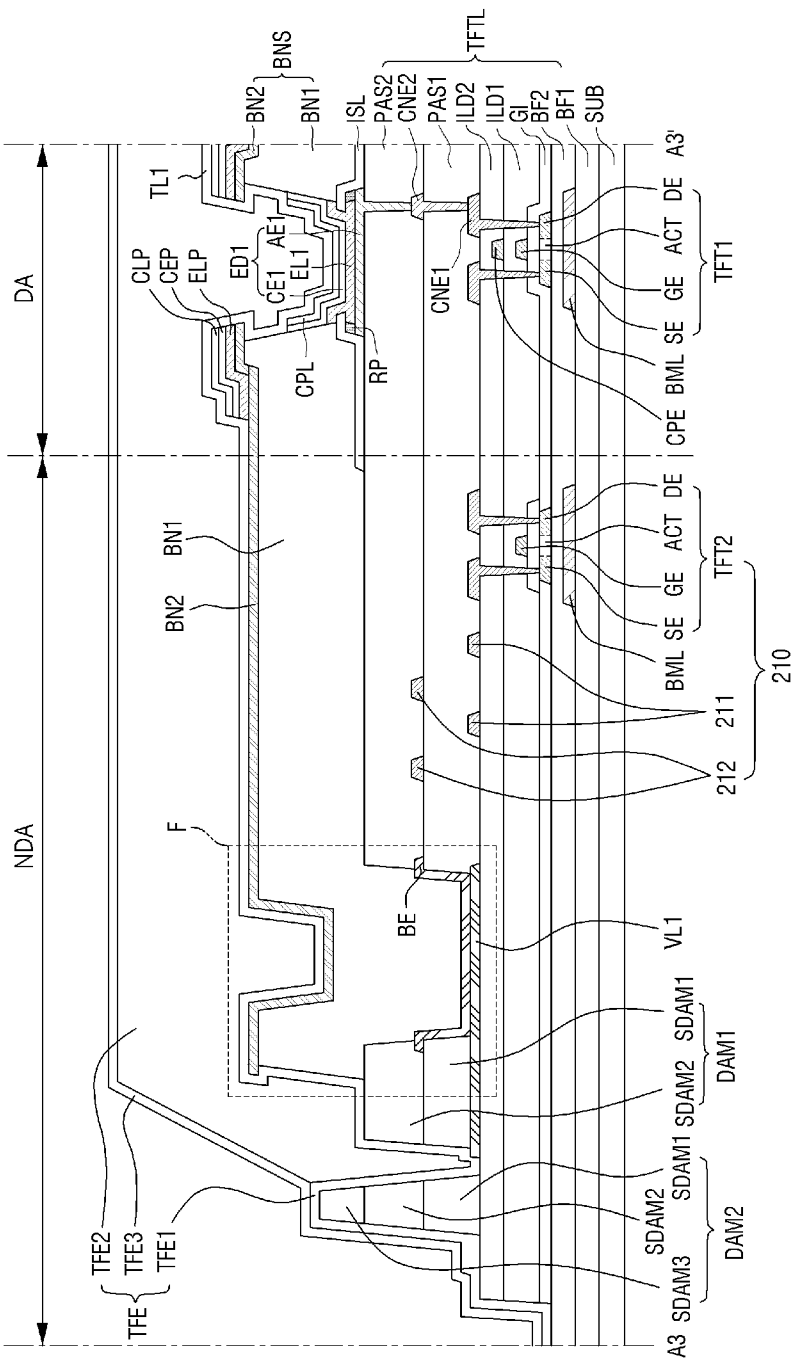
FIG. 33 is a cross-sectional view taken along line A3-A3' of FIG. 32.
Figure 34:
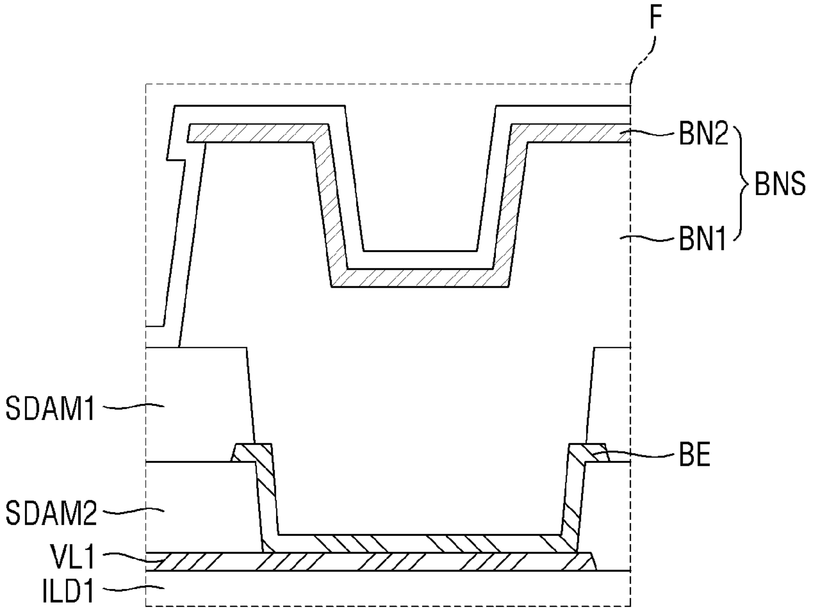
FIG. 34 is an enlarged view illustrating portion F of FIG. 33.
Figure 35:
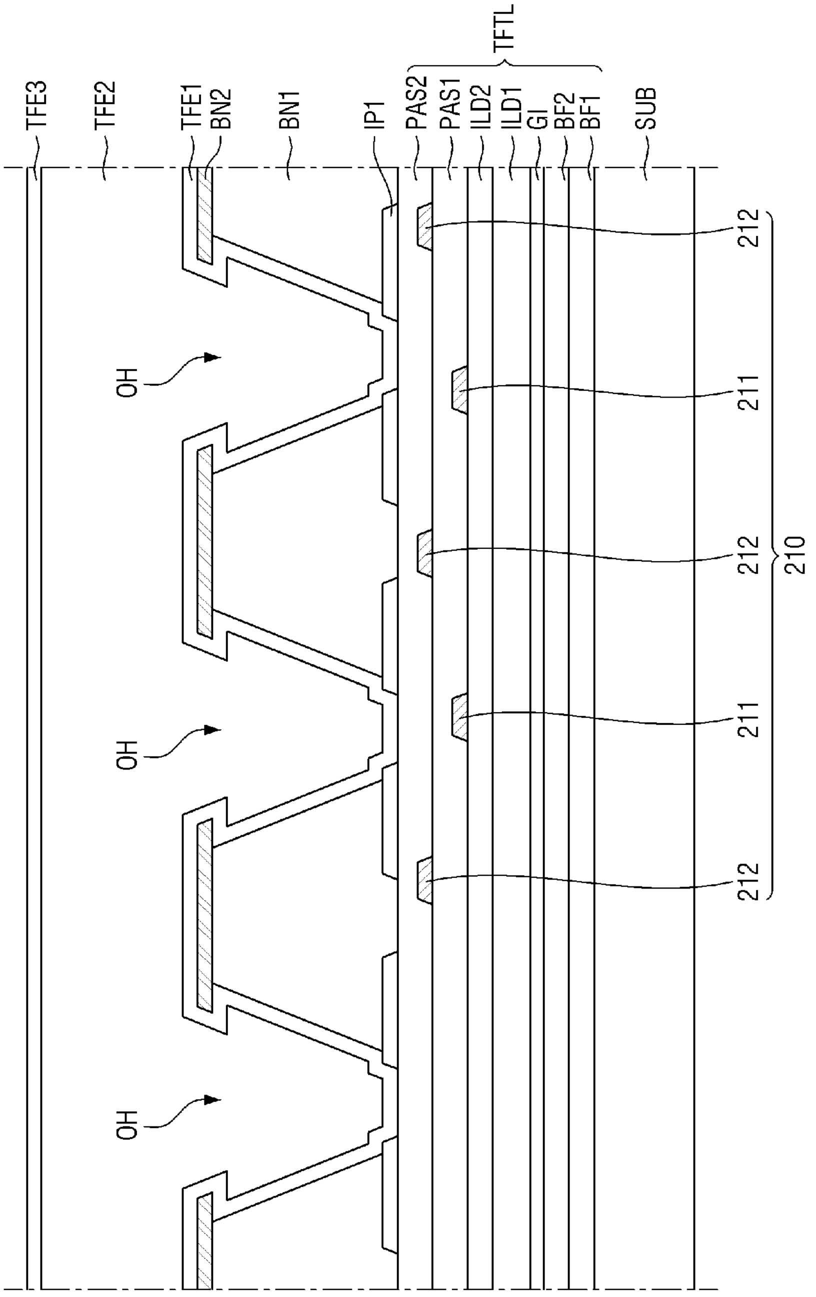
FIG. 35 is a cross-sectional view illustrating hole patterns of the display device of FIG. 32.

FIG. 32 is a plan view illustrating a part of a non-display area of a display device according to another alternative embodiment. FIG. 33 is a cross-sectional view taken along line A3-A3' of FIG. 32. FIG. 34 is an enlarged view illustrating portion F of FIG. 33. FIG. 35 is a cross-sectional view illustrating hole patterns of the display device of FIG. 32.

Referring to FIGS. 32 to 35, in a display device 10_2 according to an embodiment, the conductive layer TPL may be omitted, and the first bank layer BN1 of the bank structure BNS may be in direct contact with the bridge electrode BE in the non-display area NDA. The first bank layer BN1 may include aluminum (Al) and have a possibility of being corroded when being in direct contact with the lower layer, but may be in direct contact with the bridge electrode BE in a case where corrosion does not occur while being in direct contact with the bridge electrode BE. Accordingly, the first bank layer BN1 may be electrically connected to the first power line VL1 through the bridge electrode BE. Since the conductive layer TPL is not disposed in the non-display area NDA, a part of the first bank layer BN1 may be directly disposed on the second passivation layer PAS2.

The display device 10_2 may include the insulating patterns IP1 disposed around the hole patterns OH of the non-display area NDA. The insulating patterns IP1 may be directly disposed on the second passivation layer PAS2, and may be disposed to be spaced apart from each other to correspond to positions of the hole patterns OH. In a plan view, the insulating patterns IP1 may be disposed to surround the hole patterns OH, respectively. In the display device 10_2, as the conductive layer TPL disposed in the non-display area NDA is omitted and the first bank layer BN1 is in direct contact with the bridge electrode BE, an etching process for penetrating the conductive layer TPL in the non-display area NDA may be omitted.

Figure 36:
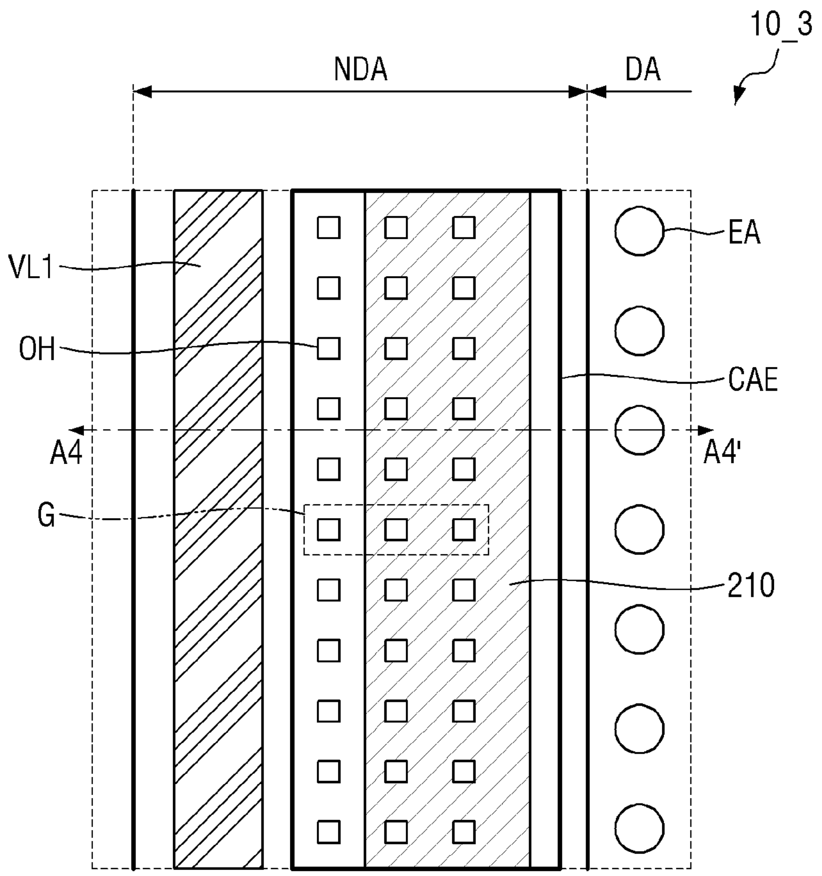
FIG. 36 is a plan view illustrating a part of a non-display area of a display device according to still another alternative embodiment.
Figure 37:
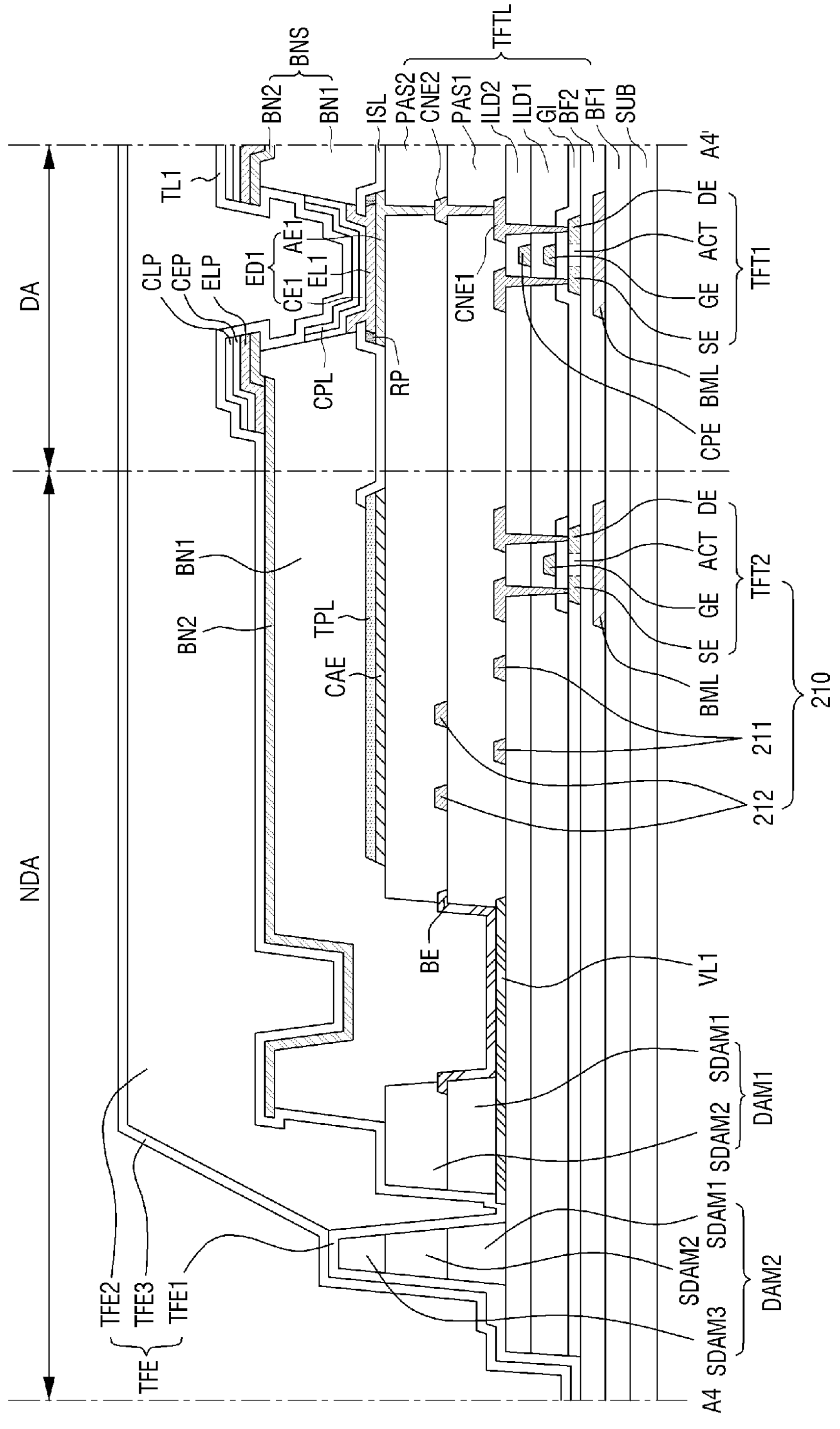
FIG. 37 is a cross-sectional view taken along line A4-A4' of FIG. 36.

FIG. 36 is a plan view illustrating a part of a non-display area of a display device according to still another alternative embodiment. FIG. 37 is a cross-sectional view taken along line A4-A4' of FIG. 36.

Referring to FIGS. 36 and 37, a display device 10_3 according to an embodiment may include the conductive layer TPL and the power connection electrode CAE disposed in the non-display area NDA, each of which may not overlap the first power line VL1 and the bridge electrode BE. The first bank layer BN1 of the bank structure BNS may be in direct contact with the bridge electrode BE via a hole defined or formed through the second passivation layer PAS2 in the non-display area NDA. The first bank layer BN1 may include aluminum (Al) and have a possibility of being corroded when being in direct contact with the lower layer, but may be in direct contact with the bridge electrode BE when corrosion does not occur while being in direct contact with the bridge electrode BE. Although not illustrated in the drawings, the conductive layer TPL and the power connection electrode CAE may be disposed in an area in which the hole patterns OH are disposed in the non-display area NDA and have a same stacked structure as the display area DA, but the conductive layer TPL and the power connection electrode CAE may not be electrically connected to the first power line VL1. The bank structure BNS may be electrically connected to the first power line VL1 through the bridge electrode BE.

Figure 38:
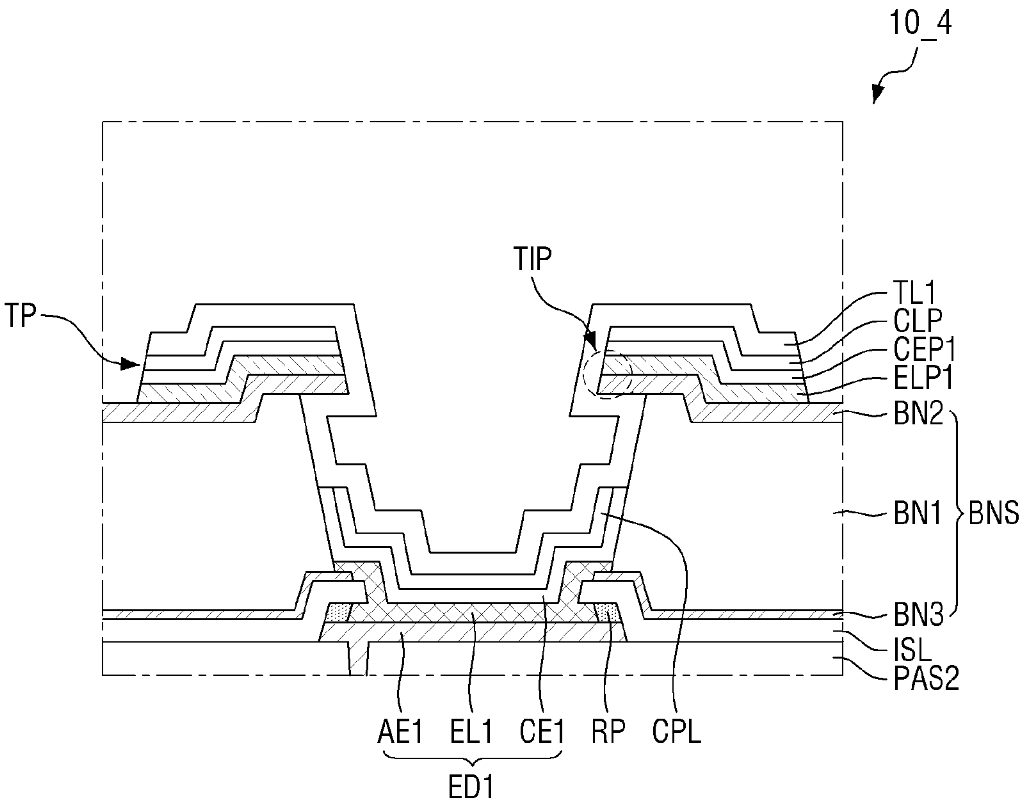
FIG. 38 is a cross-sectional view illustrating a part of a display area of a display device according to still another alternative embodiment.
Figure 39:
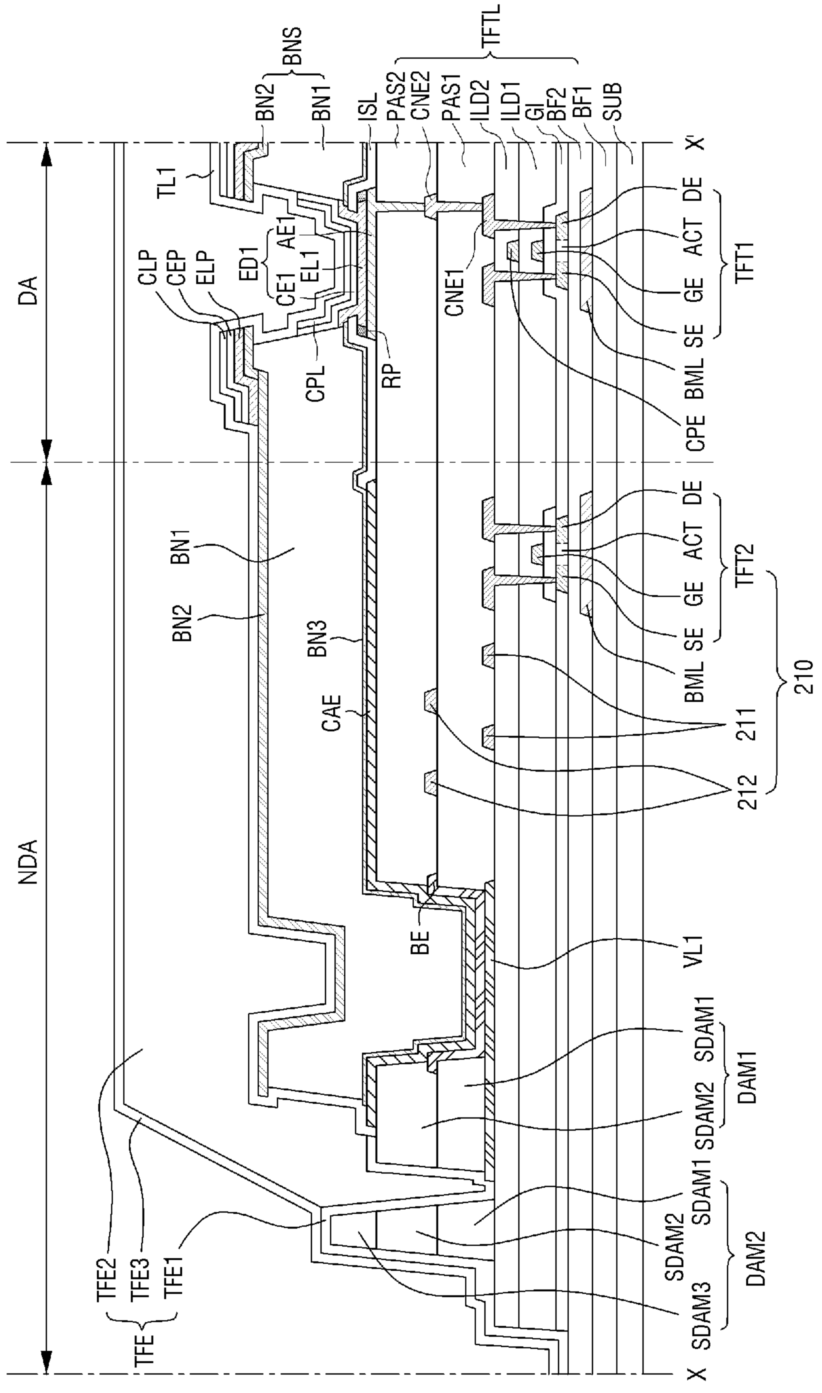
FIG. 39 is a cross-sectional view illustrating a part of a non-display area of a display device of FIG. 38.
Figure 40:
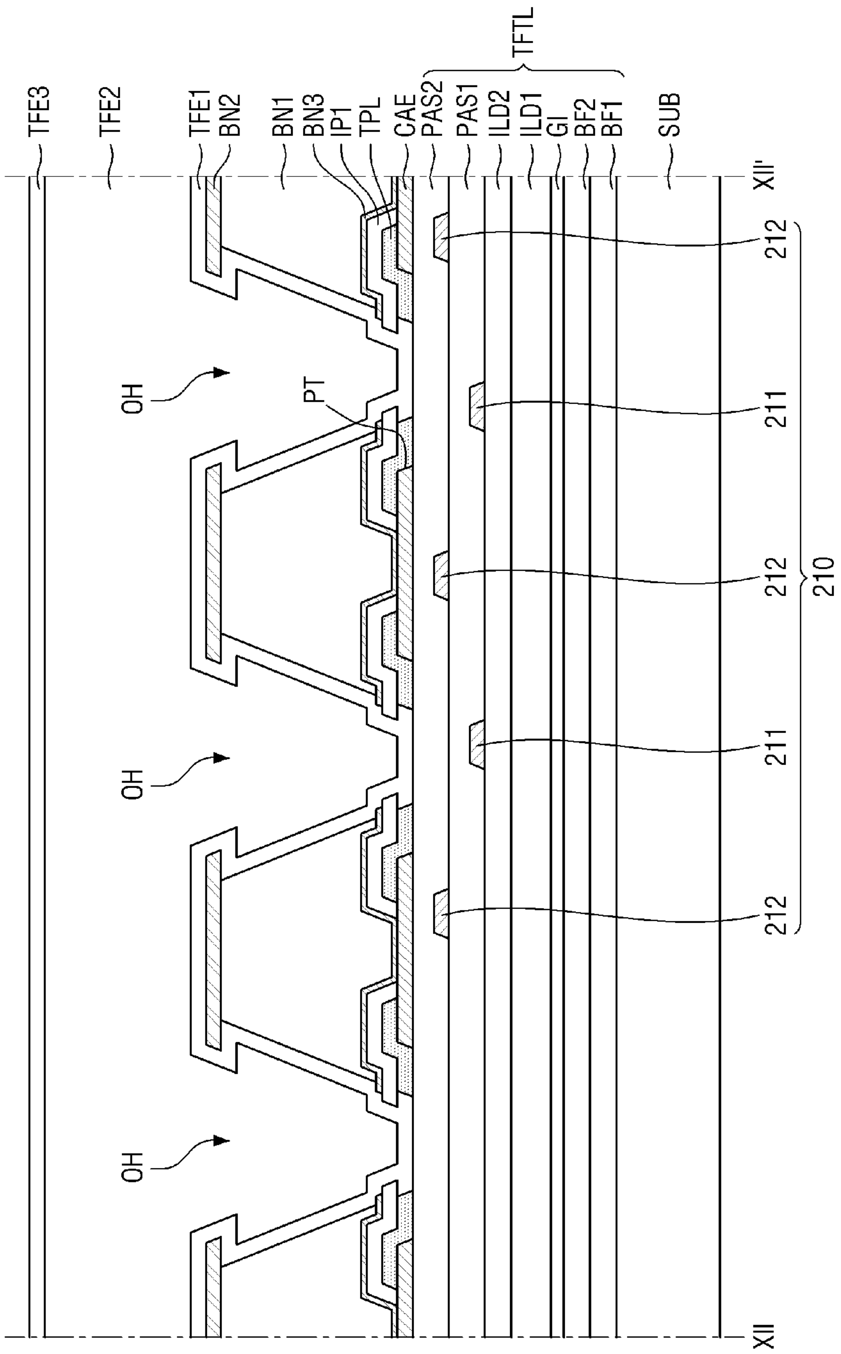
FIG. 40 is a cross-sectional view illustrating hole patterns of the display device of FIG. 38.

FIG. 38 is a cross-sectional view illustrating a part of a display area of a display device according to still another alternative embodiment. FIG. 39 is a cross-sectional view illustrating a part of a non-display area of a display device of FIG. 38. FIG. 40 is a cross-sectional view illustrating hole patterns of the display device of FIG. 38.

Referring to FIGS. 38 to 40, in a display device 10_4 according to an embodiment, the bank structure BNS may further include a third bank layer BN3 disposed below the first bank layer BN1 in addition to the first bank layer BN1 and the second bank layer BN2. Unlike the first bank layer BN1, the third bank layer BN3 may include a material that has conductivity and does not cause corrosion although being in direct contact with the power connection electrode CAE disposed thereunder. The first bank layer BN1 of the bank structure BNS may be electrically connected to the first power line VL1 through the third bank layer BN3, the power connection electrode CAE, and the bridge electrode BE. As the bank structure BNS further includes the third bank layer BN3, profiles of inner sidewall defining the openings OPE1, OPE2, and OPE3 and the hole pattern OH may vary in the display area DA and the non-display area NDA.

In an embodiment, for example, the bank structure BNS may include the first bank layer BN1, and the second bank layer BN2 and the third bank layer BN3 including a metal material different from the first bank layer BN1. The second bank layer BN2 and the third bank layer BN3 may include a same metal material as each other. In the process of forming the openings OPE1, OPE2, and OPE3 of the bank structure BNS, the tip of each of the second bank layer BN2 and the third bank layer BN3 may be formed to protrude beyond the sidewall of the first bank layer BN1. In an embodiment, the first bank layer BN1 may include a metal material having high electrical conductivity, and the second bank layer BN2 and the third bank layer BN3 may include a metal material having low reflectivity.

The first bank layer BN1 may be an intermediate layer of the bank structure BNS and include a metal material having high electrical conductivity. The first bank layer BN1 may be electrically connected to the first power line VL1 and be in contact with the cathode electrode CE of each of the light emitting elements ED to form a common electrode. The second bank layer BN2 may be an uppermost layer of the bank structure BNS, and may include a material having a high light absorption rate to reduce reflection by external light. The third bank layer BN3 may be the lowermost layer of the bank structure BNS, and may be directly disposed on the inorganic insulating layer ISL to serve as a base layer on which the first bank layer BN1 is disposed.

In the non-display area NDA, the power connection electrode CAE, which is disposed in (or directly on) a same layer as the anode electrode AE and includes the same material, may be disposed, and the bank structure BNS may be directly disposed thereon. The power connection electrode CAE may be disposed to at least partially overlap the first power line VL1, and may be directly disposed on the bridge electrode BE on the hole of the second passivation layer PAS2. The third bank layer BN3 may be directly disposed on the power connection electrode CAE in the non-display area NDA, and the first bank layer BN1 may be electrically connected to the first power line VL1 through the third bank layer BN3, the power connection electrode CAE, and the bridge electrode BE. The third bank layer BN3 may include a metal material having a low potential difference from the power connection electrode CAE, and corrosion may not occur although the third bank layer BN3 is in direct contact with the power connection electrode CAE.

In the area in which the hole patterns OH are defined in the non-display area NDA, the conductive layers TPL disposed to be spaced apart from each other on the power connection electrode CAE and the insulating patterns IP1 may be disposed. As described above, the hole patterns OH may be formed together in the process of forming the openings OPE1, OPE2, and OPE3 of the display area DA, and thus may have a same stacked structure as the display area DA. In an embodiment, for example, similarly to having a structure in the display area DA in which the anode electrode AE, the residual pattern RP, and the inorganic insulating layer ISL are stacked, there may be a structure in the non-display area NDA in which the power connection electrode CAE, the conductive layer TPL, and the insulating pattern IP1 are stacked. Similarly to the embodiment of FIG. 30, the insulating patterns IP1 may be disposed to respectively correspond to the through portions PT of the power connection electrode CAE. The conductive layer TPL may also form a pair with the insulating pattern IP1 and may be disposed to correspond to each of the through portions PT of the power connection electrode CAE. In the display device 10_4 according to the embodiment, the conductive layers TPL disposed in the non-display area NDA may form patterns spaced apart from each other in the same manner as the hole pattern OH.

The conductive layer TPL may be disposed on the power connection electrode CAE and cover an inner sidewall of the power connection electrode CAE exposed at the through portion PT. Similarly to the residual pattern RP, the conductive layer TPL may be more etched and recessed inward than the insulating pattern IP1 in the hole pattern OH formation process, and the insulating pattern IP1 may protrude relatively further inwardly. The third bank layer BN3 of the bank structure BNS may be directly disposed on the insulating pattern IP1.

The display device 10_4 according to an embodiment may further include the third bank layer BN3 that prevents corrosion that may occur when the first bank layer BN1 having high conductivity and the power connection electrode CAE disposed therebelow are in contact with each other. Accordingly, in the bank structure BNS, the second bank layer BN2 and the third bank layer BN3 may have a structure in which the tips thereof are formed to further protrude inwardly than the inner sidewall of the first bank layer BN1 in each of the display area DA and the non-display area NDA.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device in which a display area and a non-display area surrounding the display area are defined, the display device comprising:

anode electrodes disposed in the display area and spaced apart from each other;

an inorganic insulating layer disposed in the display area and having a portion disposed on the anode electrode;

a bank structure disposed on the inorganic insulating layer, wherein a plurality of openings is defined through the bank structure to respectively overlap the anode electrodes;

a plurality of light emitting layers disposed on the anode electrodes and disposed in the openings of the bank structure;

a plurality of cathode electrodes disposed on the light emitting layers and disposed in the openings of the bank structure;

a first power line disposed in the non-display area and surrounding the display area; and a conductive layer including an oxide semiconductor, wherein at least a portion of the conductive layer in the non-display area is disposed between the first power line and the display area, wherein the bank structure is disposed on the conductive layer in the non-display area, wherein a plurality of hole patterns is defined through the bank structure and the conductive layer, the bank structure comprises a first bank layer and a second bank layer disposed on the first bank layer and including a metal material different from a material of the first bank layer, a portion of the first bank layer is disposed directly on the conductive layer in the non-display area, and the second bank layer comprises a tip protruding further inwardly than a sidewall of the first bank layer.

2. The display device of claim 1, wherein the inorganic insulating layer further comprises a residual pattern disposed between the anode electrode and the inorganic insulating layer without being in contact with a top surface of the anode electrode, and the residual pattern contains the same material as the conductive layer.

3. The display device of claim 2, further comprising:

a plurality of insulating patterns disposed on the conductive layer, wherein a plurality of holes are defined by the insulating patterns to overlap the hole patterns, and the insulating patterns include a same material as the inorganic insulating layer.

4. The display device of claim 1, wherein the conductive layer is disposed to partially overlap the first power line, and the first bank layer is disposed directly on the conductive layer on the first power line and electrically connected to the first power line.

5. The display device of claim 4, further comprising:

a bridge electrode disposed in the non-display area and disposed between the first power line and the conductive layer.

6. The display device of claim 1, further comprising:

a power connection electrode disposed to overlap the conductive layer in the non-display area and including a same material as the anode electrode.

7. The display device of claim 6, wherein the power connection electrode and the conductive layer are disposed to partially overlap the first power line, and the first bank layer is disposed directly on the conductive layer on the first power line and electrically connected to the first power line.

8. The display device of claim 6, wherein the power connection electrode and the conductive layer are disposed not to overlap the first power line, and the first bank layer is disposed on the first power line and electrically connected to the first power line.

9. The display device of claim 6, wherein a plurality of through portions is defined through the power connection electrode to overlap the hole patterns, and the conductive layer is disposed to cover an inner sidewall of the power connection electrode defining the through portion.

10. The display device of claim 1, wherein the first bank layer includes aluminum (Al), and the second bank layer includes titanium (Ti).

11. The display device of claim 1, wherein each of the cathode electrodes is in direct contact with a side surface of the first bank layer.

12. The display device of claim 1, wherein the hole patterns do not overlap the first power line.

13. The display device of claim 1, further comprising:

a plurality of organic patterns disposed on the second bank layer to surround the openings and including a same material as the light emitting layer; and a plurality of electrode patterns disposed on the organic patterns and including a same material as the cathode electrode.

14. The display device of claim 1, further comprising:

a thin film encapsulation layer comprising a first encapsulation layer disposed on the bank structure, a second encapsulation layer disposed on the first encapsulation layer, and a third encapsulation layer disposed on the second encapsulation layer; and a touch layer disposed on the thin film encapsulation layer and comprising a plurality of touch insulating layers and a touch electrode disposed between the touch insulating layers.

15. The display device of claim 14, further comprising:

a light blocking layer disposed on the touch layer to overlap the touch electrode, wherein a plurality of opening holes is defined through the light blocking layer to respectively overlap the openings of the bank structure; and a plurality of color filters respectively disposed in the opening holes on the light blocking layer.

* * * * *